US012566905B2

(12) United States Patent
Nassar et al.

(10) Patent No.: US 12,566,905 B2
(45) Date of Patent: Mar. 3, 2026

(54) VIRTUAL ENVIRONMENT SCENARIOS AND OBSERVERS FOR AUTONOMOUS MACHINE APPLICATIONS

(71) Applicant: NVIDIA Corporation, Santa Clara, CA (US)

(72) Inventors: Ahmed Nassar, San Jose, CA (US); Justyna Zander, Cupertino, CA (US); David Auld, Saratoga, CA (US)

(73) Assignee: NVIDIA Corporation, Santa Clara, CA (US)

( * ) Notice: Subject to any disclaimer, the term of this patent is extended or adjusted under 35 U.S.C. 154(b) by 78 days.

(21) Appl. No.: 18/505,672

(22) Filed: Nov. 9, 2023

(65) Prior Publication Data

US 2024/0078363 A1      Mar. 7, 2024

Related U.S. Application Data

(63) Continuation of application No. 16/824,202, filed on Mar. 19, 2020, now abandoned.

(51) Int. Cl.
　*G06F 30/00*　　　　(2020.01)
　*B60W 50/00*　　　　(2006.01)
　　　　　　(Continued)

(52) U.S. Cl.
　CPC ............. *G06F 30/27* (2020.01); *B60W 50/00* (2013.01); *G05D 1/0088* (2013.01);
　　　　　　(Continued)

(58) Field of Classification Search
　CPC ..... G06F 30/27; B60W 50/00; B60W 60/001; B60W 2050/0083; G05D 1/0088; G06N 3/04
　　　　　　(Continued)

(56) References Cited

U.S. PATENT DOCUMENTS 10,157,331 B1　12/2018　Tang et al.
2004/0252864 A1　12/2004　Chang et al.
(Continued)

FOREIGN PATENT DOCUMENTS

EP　　1930863 A2　6/2008
EP　　2384009 A2　11/2011
WO　2018002910 A1　1/2018

OTHER PUBLICATIONS

Wei Chen, Leila Kloul. An Ontology-based Approach to Generate the Advanced Driver Assistance Use Cases of Highway Traffic. 10th International Joint Conference on Knowledge Discovery, Knowledge Engineering and Knowledge Management., Sep. 2018, Seville, Spain. ffhal-01835139, whole document (Year: 2018).
(Continued)

*Primary Examiner* — Tiffany P Young
(74) *Attorney, Agent, or Firm* — IRON SUMMIT IP LLP

(57) ABSTRACT

In various examples, scenarios may be defined using a declarative description—e.g., defining a behavior of interest—that the present system may convert into a procedural description for generating one or more instances and/or variations of a scenario for testing an autonomous or semi-autonomous machine in a virtual environment. The system may execute observers or evaluators for testing the performance and accuracy of the machine and may compute coverage of various elements based on the generated virtual scenarios, and may feed the results back to the system to generate additional instances and/or variations where the coverage or accuracy is below a desired level. As a result, the system may include an end-to-end framework for generating scenarios in virtual environments, testing and validating the scenarios themselves, and/or testing and validating the underlying autonomous or semi-autonomous (Continued)

systems of the machine—all based on a declarative description.

20 Claims, 22 Drawing Sheets

(51) Int. Cl.
| | |
|---|---|
| *G05D 1/00* | (2006.01) |
| *G06F 30/27* | (2020.01) |
| *B60W 60/00* | (2020.01) |
| *G06N 3/04* | (2023.01) |

(52) U.S. Cl.
CPC ... *B60W 2050/0083* (2013.01); *B60W 60/001* (2020.02); *G06N 3/04* (2013.01)

(58) Field of Classification Search
USPC .......................................................... 703/8
See application file for complete search history.

(56) References Cited

U.S. PATENT DOCUMENTS

| | | | |
|---|---|---|---|
| 2007/0182528 A1 | 8/2007 | Breed et al. | |
| 2016/0247290 A1 | 8/2016 | Liu et al. | |
| 2017/0010108 A1 | 1/2017 | Shashua | |
| 2017/0344808 A1 | 11/2017 | El-Khamy et al. | |
| 2017/0364083 A1 | 12/2017 | Yang et al. | |
| 2017/0371340 A1 | 12/2017 | Cohen et al. | |
| 2019/0129831 A1 | 5/2019 | Goldberg | |
| 2019/0155291 A1* | 5/2019 | Heit ...................... G05D 1/0221 | |
| 2019/0258878 A1 | 8/2019 | Koivisto et al. | |
| 2019/0303759 A1* | 10/2019 | Farabet .................. G06N 3/045 | |
| 2020/0134494 A1* | 4/2020 | Venkatadri ............. G06N 3/045 | |
| 2020/0409369 A1 | 12/2020 | Zaytsev et al. | |
| 2020/0410063 A1 | 12/2020 | O'Malley | |
| 2021/0116915 A1 | 4/2021 | Jiang et al. | |

OTHER PUBLICATIONS

Nassar, Ahmed; Non-Final Office Action for U.S. Appl. No. 16/824,202, filed Mar. 19, 2020, mailed Aug. 26, 2022, 38 pgs.
Nassar, Ahmed; International Preliminary Report on Patentability for PCT Application No. PCT/US2021/023343, filed Mar. 19, 2021, mailed Sep. 29, 2022, 12 pgs.
Garnett, N., et al., (2017). "Real-time category-based and general obstacle detection for autonomous driving". In Proceedings of the IEEE International Conference on Computer Vision Workshops (pp. 198-205).
Zhong, Yiran et al; "Self-Supervised Learning for Stereo Matching with Self-Improving Ability", Arxiv.org, Cornell University Library, 201 Olin Library Cornell University Ithaca, NY 14853, Sep. 4, 2017. 13 pgs.
Pang, Jiahao et al; "Cascade Residual Learning: A Two-Stage Convolutional Neural Network for Stereo Matching", 2017 IEEE International Conference on Computer Vision Workshops (ICCVW), IEEE, Oct. 22, 2017, pp. 878-886. 9 pgs.
Godard, Clement et al: "Unsupervised Monocular Depth Estimation with Left-Right Consistency", IEEE Computer Society Conference on Computer Vision and Pattern Recognition. Proceedings, IEEE Computer Society, US, Jul. 21, 2017. pp. 6602-6611. 10 pgs.
International Search Report and Written Opinion mailed Nov. 7, 2019 in International Patent Application No. PCT/US2019/022753, 22 pgs.
Kendall, Alex et al., "End-to-End Learning of Geometry and Context for Deep Stereo Regression" ARXIV.org, Cornell University Library, 201 Olin Library Cornell University Ithaca, NY 14853, Mar. 13, 2017, 10 pgs.
International Search Report and Written Opinion mailed Oct. 17, 2019 in International Patent Application No. PCT/US2019/012535, 24 pgs.

International Search Report and Written Opinion mailed Jul. 25, 2019 in International Patent Application No. PCT/US2019/018348, 22 pgs.
Arvind Jayarahan et al: "Creating 3D Virtual Driving Environments for Simulation-Aided Development of Autonomous Driving and Active Safety", SAE Technical Paper Series, vol. 1, Mar. 28, 2017 (Mar. 28, 2017), XP055518353, US, ISSN: 0148-7191, DOI: 10.4271/2017-01-0107, p. 1-p. 4.
International Search Report and Written Opinion mailed Jun. 26, 2019 in International Patent Application No. PCT/US2019/024400, 15 pgs.
International Search Report and Written Opinion mailed Aug. 26, 2019 in International Patent Application No. PCT/US2019/022592, 18 pgs.
Bach, M., et al., "Multi-camera traffic light recognition using a classifying Labeled Multi-Bernoulli filter", IEEE Intelligent Vehicles Symposium (IV), pp. 1045-1051 (Jun. 2017).
Bojarski, M., et al., "End to End Learning for Self-Driving Cars", arXiv: 1604.07316v1 [cs.CV], XP055570062, Retrieved from the Internet URL:https://nvidia.com/content/tegra/automotive/images/2016/solutions/pdf/end-to-end-dl-using-px.pdf, pp. 1-9 (Apr. 25, 2016).
Liu, H., et al., "Neural Person Search Machines", IEEE International Conference on Computer Vision (ICCV), pp. 493-501 (2017).
Rothe, R., et al., "Non-maximum Suppression for Object Detection by Passing Messages Between Windows", ETH Library, pp. 1-17 (2015).
Tao, A., "Detectnet: Deep neural network for object detection in digits", NVIDIA Developer Blog, Retrieved from Internet URL: https://devblogs.nvidia.com/detectnet-deep-neural-network-object-detection-digits/, accessed on Jul. 22, 2019, pp. 9 (2016).
Weber, M., et al., "DeepTLR: A single deep convolutional network for detection and classification of traffic lights", IEEE Intelligent Vehicles Symposium (IV), pp. 8 (Jun. 2016).
"System and Method for Training, Testing, Verifying, and Validating Autonomous and Semi-Autonomous Vehicles", U.S. Appl. No. 62/648,399, filed Mar. 27, 2018.
Nassar, Ahmed; Final Office Action for U.S. Appl. No. 16/824,202, filed Mar. 19, 2020, mailed Jan. 24, 2023, 36 pgs.
Nassar, Ahmed; Non-Final Office Action for U.S. Appl. No. 16/824,202, filed Mar. 19, 2020, mailed Apr. 5, 2023, 33 pgs.
Nassar, et al.; Final Office Action for U.S. Appl. No. 16/824,202, filed Mar. 19, 2020, mailed Aug. 9, 2023, 28 pgs.
Bagschik, et al.; "Ontology based Scene Creation for the Development of Automated Vehicles," 2018 IEEE Intelligent Vehicles Symposium (IV), Jun. 2018, 8 pgs.
Amersback, et al.; "Defining Required and Feasible Test Coverage for Scenario-Based Validation of Highly Automated Vehicles," IEEE Intelligent Transportation Systems Conference (ITSC), 2019, 5 pgs.
Majzik, et al.; "Towards System-Level Testing with Coverage Guarantees for Autonomous Vehicles," ACM/IEEE 22nd International Conference on Model Driven Engineering Languages and Systems (MODELS), 2019, 6 pgs.
Menzell, et al.; "From Functional to Logical Scenarios: Detailing a Keyword-Based Scenario Description for Execution in a Simulation Environment," IEEE Intelligent Vehicles Symposium (IV), 2019, 8 pgs.
Menzell, et al.; "Scenarios for Development, Test and Validation of Automated Vehicles," IEEE Intelligent Vehicles Symposium (IV), 2018, 7 pgs.
Nassar, Ahmed; International Search Report and Written Opinion for PCT Application No. PCT/US2021/023343, filed Mar. 19, 2021, mailed Jul. 26, 2021, 13 pgs.
Fox, et al.; "PDDL2. 1: An Extension to PDDL for Expressing Temporal Planning Domains," Journal of Artificial Intelligence Research, 2003, 64 pgs.
Gerevini, et al.; "Deterministic planning in the fifth international planning competition: PDDL3 and experimental evaluation of the planners" 2009, 50 pgs.
Accellera Systems Initiative, IEEE Standard for Standard SystemC Language Reference Manual. Chapter 4 and 5. IEEE Std (Revision of IEEE Std 1666-2005) 2012, 638 pgs.

(56) References Cited

OTHER PUBLICATIONS

Annex E., of IEEE Standard for SystemVerilog Unified Hardware Design, Specification; and Verification Language. IEEE Std 1800TM-2005, 2005, 1315 pgs.

Shoham, et al.; "Multiagent systems: Algorithmic, Game-Theoretic, and Logical Foundations," Cambridge University Press, (2008) 532 pgs.

LaValle, et al.; "Planning Algorithms. Cambridge University Press, 2006," Section 7.6, Chapters 5,8, and 10, (2006) 1023 pgs.

Sutton, et al.; "Reinforcement learning: An introduction." MIT Press, 2018, 10 pgs.

Nassar, Ahmed; First Office Action for Chinese Patent Application No. 202180008425.5, filed Jul. 6, 2022, mailed Dec. 23, 2024, 54 pgs.

Nassar, Ahmed; Second Office Action for Chinese Patent Application No. 202180008425.5, filed Jul. 6, 2022, mailed Jul. 3, 2025, 24 pgs.

Nassar, Ahmed; Decision on Rejection for Chinese Patent Application No. 202180008425.5, filed Jul. 6, 2022, mailed Sep. 23, 2025, 27 pgs.

* cited by examiner

200A
DECLARATIVE DESCRIPTION
202
AUTONOMOUS VEHICLE SPECIFIC
204
PROPERTY SPECIFIC
206
FIGURE 2A

300

RECEIVE AN INTERPRETABLE DESCRIPTION THAT
DESCRIBES A DEFINED OBSERVABLE
<u>B302</u>

DETERMINE ROAD STRUCTURE INFORMATION AND DYNAMIC
ACTOR INFORMATION
<u>B304</u>

GENERATE DATA REPRESENTATIVE OF A PLURALITY OF
SCENARIOS RELATED TO THE INTERPRETABLE DESCRIPTION
<u>B306</u>

GENERATE THE PLURALITY OF SCENARIOS BASED AT LEAST
IN PART ON THE DATA
<u>B308</u>

400

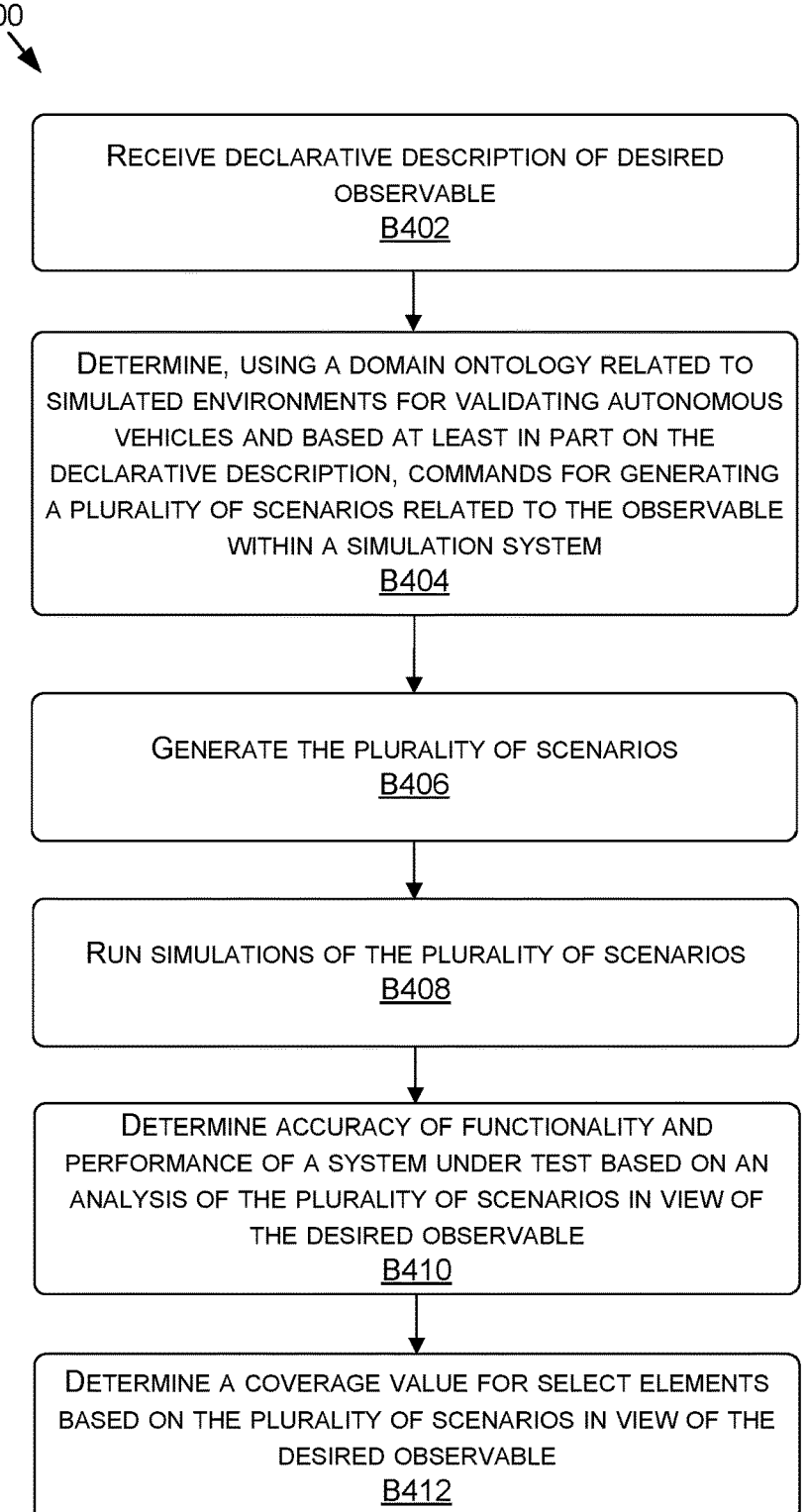

RECEIVE DECLARATIVE DESCRIPTION OF DESIRED
OBSERVABLE
B402

DETERMINE, USING A DOMAIN ONTOLOGY RELATED TO
SIMULATED ENVIRONMENTS FOR VALIDATING AUTONOMOUS
VEHICLES AND BASED AT LEAST IN PART ON THE
DECLARATIVE DESCRIPTION, COMMANDS FOR GENERATING
A PLURALITY OF SCENARIOS RELATED TO THE OBSERVABLE
WITHIN A SIMULATION SYSTEM
B404

GENERATE THE PLURALITY OF SCENARIOS
B406

RUN SIMULATIONS OF THE PLURALITY OF SCENARIOS
B408

DETERMINE ACCURACY OF FUNCTIONALITY AND
PERFORMANCE OF A SYSTEM UNDER TEST BASED ON AN
ANALYSIS OF THE PLURALITY OF SCENARIOS IN VIEW OF
THE DESIRED OBSERVABLE
B410

DETERMINE A COVERAGE VALUE FOR SELECT ELEMENTS
BASED ON THE PLURALITY OF SCENARIOS IN VIEW OF THE
DESIRED OBSERVABLE
B412

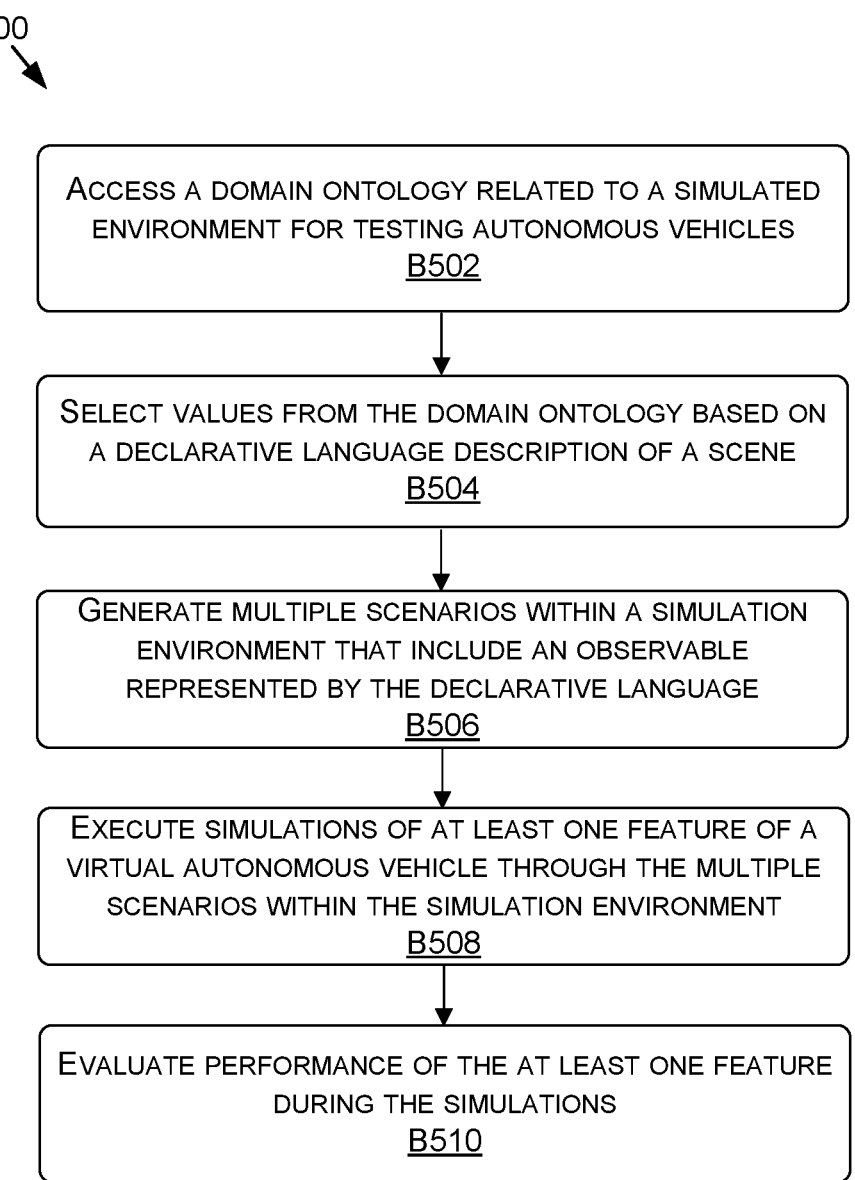

ACCESS A DOMAIN ONTOLOGY RELATED TO A SIMULATED
ENVIRONMENT FOR TESTING AUTONOMOUS VEHICLES
B502

SELECT VALUES FROM THE DOMAIN ONTOLOGY BASED ON
A DECLARATIVE LANGUAGE DESCRIPTION OF A SCENE
B504

GENERATE MULTIPLE SCENARIOS WITHIN A SIMULATION
ENVIRONMENT THAT INCLUDE AN OBSERVABLE
REPRESENTED BY THE DECLARATIVE LANGUAGE
B506

EXECUTE SIMULATIONS OF AT LEAST ONE FEATURE OF A
VIRTUAL AUTONOMOUS VEHICLE THROUGH THE MULTIPLE
SCENARIOS WITHIN THE SIMULATION ENVIRONMENT
B508

EVALUATE PERFORMANCE OF THE AT LEAST ONE FEATURE
DURING THE SIMULATIONS
B510

SENSOR SWITCH(ES) 608

VEHICLE HARDWARE 104

GPU(s) 604

VEHICLE SIMULATOR COMPONENT(S) 606

SIMULATOR COMPONENT(S) 602

610

612B

618

612A

614

616

600C

SIMULATION COMPONENT(S) 602
CPU(s) 632     GPU(s) 634

VEHICLE SIMULATOR COMPONENT(S) 622
SoC(s) 626     CPU(s) 628

DSM 624

VEHICLE SIMULATOR COMPONENT(S) 320
SW INSTANCE(S) 630

VEHICLE SIMULATOR COMPONENT(S) 606
SoC(s) 804

STEREO CAMERA 868

MID-RANGE CAMERA, WING MIRROR MOUNT 898

SURROUND CAMERA 874

MID-RANGE CAMERA, WING MIRROR MOUNT 898

SURROUND CAMERA(S) 874

SURROUND CAMERA(S) 874

INFRARED CAMERA 872

WIDE VIEW CAMERA 870

LONG-RANGE CAMERA 898

LONG-RANGE CAMERA 898

STEREO CAMERA 868

102

VIRTUAL ENVIRONMENT SCENARIOS AND OBSERVERS FOR AUTONOMOUS MACHINE APPLICATIONS

CROSS-REFERENCE TO RELATED APPLICATIONS

This application is a continuation of U.S. patent application Ser. No. 16/824,202, filed Mar. 19, 2020 which is hereby incorporated by reference in its entirety.

BACKGROUND

During development of an autonomous or semi-autonomous vehicle—and due to the safety-critical nature of such systems—being able to accurately and reliably test the functionality and performance of the vehicle in a large number of situations and environments is critical to ensuring the vehicle performs safely. In particular, testing may be used to verify that the vehicle can safely operate within a real-world environment. One way to test autonomous vehicles—including hardware and/or underlying software of the vehicle—is to use simulated environments. For instance, one or more abstract representations and/or computational models (e.g., machine learning models, deep neural networks (DNNs), computer vision algorithms, etc.) corresponding to autonomous or semi-autonomous software stack—such as for object detection, lane and road boundary detection, safety analysis, drivable free-space analysis, control generation during vehicle maneuvers, etc.—may be tested against data gathered from within a virtual representation or varying environments (e.g., visual or virtual environment, abstract computational environment, etc.).

For example, in a conventional system, in an attempt to test an autonomous vehicle, a scenario of interest may be hard-coded—or created manually—within the virtual and/or computational environment. For example, a tester can attempt to program a scenario (e.g., using a programming language such as Python, MATLAB, Simulink specification, etc.) within the virtual and/or computational environment by manually defining the particular scene, traffic, agents, and/or the actors therein. However, due to the complexity of scenarios for verifying and validating autonomous vehicles, creating scenarios in this manner often results in mistakes and/or does not comprehend the entire domain, search space, and/or meaningful coverage of all possible test objectives and/or safety-critical system requirements (e.g., in the code, the scenario, etc.). In addition, because each scenario must be manually defined, and any variations of the scenario must also be manually defined, the ability to test a full range of scenarios at a scale that is suitable for verifying and validating an autonomous system to achieve a desired level of safety is a challenging task. As such, these conventional systems do not provide an intuitive method for easily defining millions of corner scenarios of interest—and variations thereof. In addition, because these conventional systems have generally relied on module-level and/or standard application testing, conventional systems have failed to provide an effective end-to-end evaluation of scenarios related to safety-critical system behavior.

SUMMARY

Embodiments of the present disclosure relate to training, testing, and verifying autonomous machines using simulated environments. Systems and methods are disclosed that allow for generating virtual environment scenarios based on defined observers and validating functionality and performance of autonomous machines related to the generated environment scenarios.

In contrast to conventional systems, such as those described above, the systems and methods of the present disclosure allow for scenarios to be defined using a declarative description—e.g., declarative paradigm, first order logic—to enable an automated and algorithmically enhanced way of creating meaningful representatives within the simulation validation search space. In particular, a behavior of interest may be defined in a descriptive and/or declarative manner, and the framework of the present system may then convert—automatically, in embodiments—the declarative description into a procedural description that may be used to generate one or more instances and/or variations of the defined scenario in a technically meaningful way (e.g., covering all equivalence classes of a signal, covering all relevant combinations of multiple signals in a certain composition, etc.). Such variations can be generated without a user having to manually define (e.g., manually code) anything beyond the initial declarative description of the scenario and evaluator and/or observer.

In addition, any level of detail within the declarative description may be used, and where details are left out, the system and/or system computational engine may determine concrete values and/or parameters corresponding to undefined criteria in order to generate the one or more scenarios and/or observers (including very many of them scaling to millions). For example, if the behavior of interest relates to a car swerving, the declarative description may be, "car swerving right." The system of the present disclosure can take this declarative description and determine representatives to fill various metrics that are not explicitly defined in the scenario (e.g., traffic, speed of the swerve, aggressive driving, number of vehicles, types of vehicles, locations of buildings, trees, wait conditions, etc.). Using these various metrics, the system can build out the different variations of the defined scenario, test a virtual instance of the autonomous vehicle against these defined scenarios, determine and evaluate functionality and/or performance of the autonomous system and feed the results back to the system for generating updated scenarios that more accurately comply with the scenario desired, and/or update features or modules of the autonomous system (e.g., for self-monitoring or self-healing purposes for the system under test to advance its own functionality). As a result, the system of the present disclosure provides an end-to-end solution for defining abstract and/or concrete scenarios, evaluators/observers, and/or coverage models using first-order logic declarative language which may be enriched with predicates, a computational world model, or a combination thereof.

BRIEF DESCRIPTION OF THE DRAWINGS

The present systems and methods for training, testing, and verifying autonomous machines using simulated environments is described in detail below with reference to the attached drawing figures, wherein:

FIGS. 2A-2E include representations of domain ontologies for use in generating virtual environment scenarios, in accordance with some embodiments of the present disclosure;

FIG. 4 is a flow diagram showing a method for generating and analyzing a plurality of scenarios related to a declarative description that describes a defined observable, in accordance with some embodiments of the present disclosure;

FIG. 5 is a flow diagram showing a method for generating and evaluating multiple scenarios that include an observable represented by declarative language, in accordance with some embodiments of the present disclosure;

DETAILED DESCRIPTION

Systems and methods disclosed are related to validating functionality and performance of autonomous machines or objects in simulated environments. Although the present disclosure may be described with respect to an example autonomous vehicle 102 (alternatively referred to herein as "vehicle 102" or "ego-vehicle 102", an example of which is described with respect to FIGS. 8A-8D), this is not intended to be limiting. For example, the systems and methods described herein may be used by, without limitation, non-autonomous vehicles, semi-autonomous vehicles (e.g., in one or more advanced driver assistance systems (ADAS)), robots, warehouse vehicles, off-road vehicles, flying vessels, boats, shuttles, emergency response vehicles, motorcycles, electric or motorized bicycles, aircraft, construction vehicles, underwater craft, drones, and/or other vehicle types. In addition, although the present disclosure may be described with respect to autonomous driving or ADAS systems, this is not intended to be limiting. For example, the systems and methods described herein may be used in robotics (e.g., for testing, validating, and/or verifying robotic systems in simulation environments), aerial systems (e.g., for testing aircraft in simulation environments), boating systems, and/or other technology areas where testing in virtual or simulated environments may be employed.

Designing Observers and Evaluators

Figure 1A:
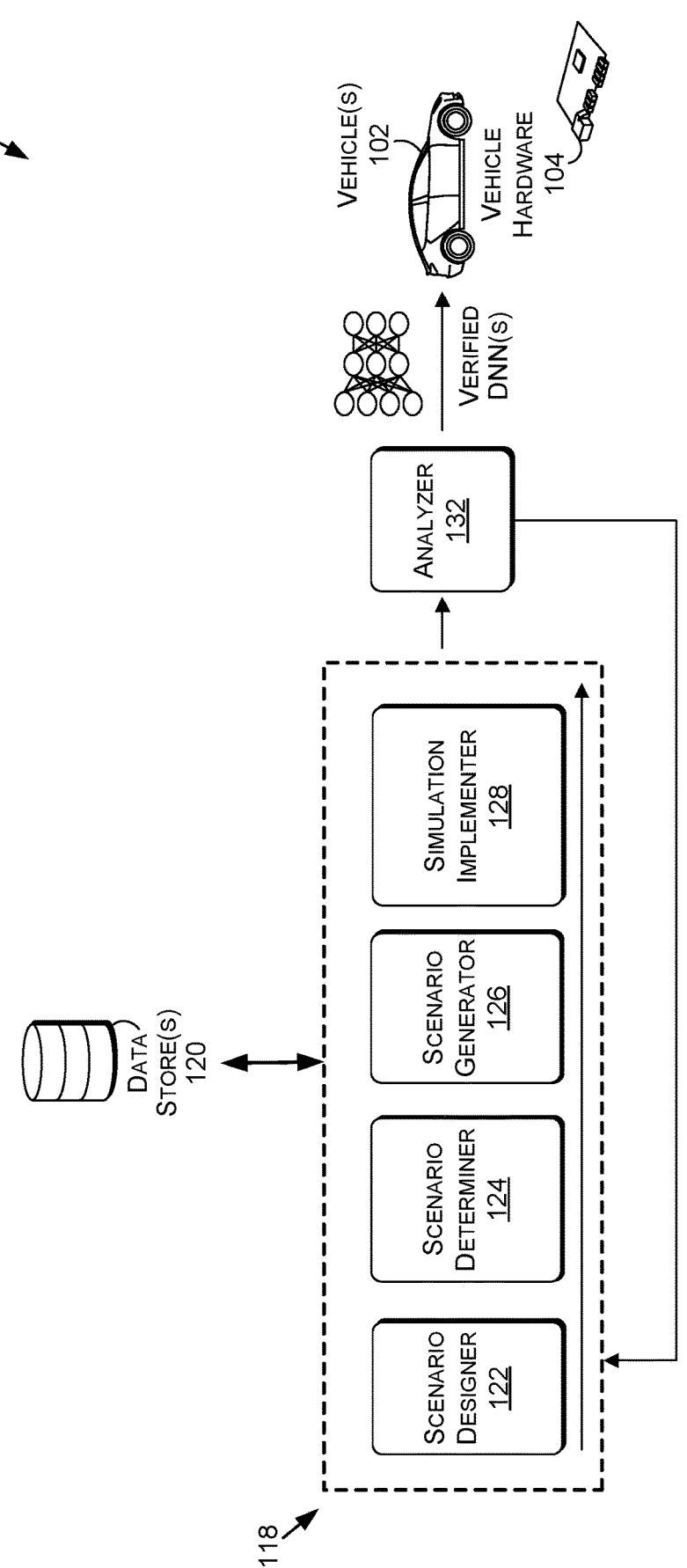
FIG. 1A is an example system for generating virtual environment scenarios based on defined observers and validating functionality and performance of autonomous machines related to the generated virtual environment scenarios, in accordance with some embodiments of the present disclosure.

Now referring to FIG. 1A, FIG. 1A is an example system 100A for generating virtual environment scenarios based on defined observers and validating functionality and performance of autonomous machines in the generated virtual environments, performance of game environments, scenarios, and virtual actors therein, civil engineering and/or street planning architectures, mining and/or other industrial related applications within the generated virtual environment scenarios, and/or for other technology or application spaces, in accordance with some embodiments of the present disclosure. As such, although this disclosure is primarily described with respect to autonomous or semi-autonomous machines in virtual environments, this is not intended to be limiting, and the methods and systems described herein may be implemented in any technology space.

With respect to observers, in particular, the observers can be defined using an interpretable description. For example, the system 100A may be used to define a behavior of interest in a descriptive and/or declarative manner. In addition, the framework of example system 100A may then convert the interpretable description into a procedural description that may be used to generate one or more instances and/or variations of the defined scenario in a technically meaningful way (e.g., covering all equivalence classes of a signal, covering all relevant combinations of multiple signals in a certain composition, etc.). In embodiments, this conversion can be performed automatically. In some examples, the system 100A may include some or all of the component, features, and/or functionality of other systems described herein, such as the systems of FIGS. 6A-6E, 7A-7B, and 8A-8D, and/or may include additional and/or alternative components, features, and functionality of these systems. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory.

FIG. 1A further includes a data flow diagram for a process 118 of defining, determining, generating, and implementing virtual environment scenarios, in accordance with some embodiments of the present disclosure. The process 118 may include a scenario designer 122, a scenario determiner 124, a scenario generator 126, a simulation implementer 128, and/or an analyzer 132. The process 118 may include a loop, whereby data from the analyzer 132 may be used to test virtual instances of the autonomous vehicle against these defined scenarios, and determine and evaluate functionality and/or performance of the autonomous system. For example, the system can be used to determine coverage (e.g., efficacy at capturing the proposed behavior and/or scenario) of the defined scenario, to evaluate the variations of the defined scenario, and/or to analyze checkers for behavior(s) in the variations of the defined scenario. Based on the outcome of this analysis, in instances, the system can generate updated scenarios that more accurately comply with the scenario desired such that features, functionality, and/or components of the autonomous system are fully tested and validated across the desired scenarios (e.g., for self-monitoring or self-healing purposes for the system under test to advance its own functionality).

The data store(s) 120 may store a domain ontology to provide specifications related to actor behaviors and relationships within an operational design domain based on a defined declarative description. In particular, such a domain ontology can provide the terminology and taxonomy of basic concepts underlying the operational design domain of the simulated environment. The ontology may provide a means of knowledge representation that can be used to represent complex knowledge related to the simulated environment. For instance, the ontology can provide information related to computational simulation objects, groupings of simulation objects, relationships and rules governing the interactions between various simulation objects, and/or the like. The domain ontology representation can generally enable semantic interoperability between models of the testing system, and can define axioms—and facts logically deduced from the axioms—that can be used.

The scenario designer 122 may receive a declarative description that defines a scenario within the autonomous driving validation search space. Such a declarative description may include a declarative paradigm, first order logic, or other interpretable description that enables an automated and algorithmically enhanced way of creating meaningful representatives. In particular, the scenario designer 122 may receive a behavior of interest defined in a descriptive and/or declarative manner. In addition, any level of detail within the declarative description may be used. For example, if the behavior of interest relates to a car swerving, the declarative description may be, "car swerving right."

The scenario determiner 124 may include generating one or more instances and/or variations of the defined scenario in a technically meaningful way (e.g., covering all equivalence classes of a signal, covering all relevant combinations of multiple signals in a certain composition, etc.). For instance, the scenario determiner 124 may convert the declarative description into a procedural description. This procedural description may then be used to generate one or more instances and/or variations of the defined scenario. Such variations can be generated without a user having to manually define (e.g., manually code) anything beyond the initial declarative description of the scenario and evaluator and/or observer. For instance, where details or parameters are left out of the declarative description, the scenario determiner 124 may determine concrete values and/or parameters corresponding to undefined criteria in order to generate the one or more scenarios and/or observers (including very many of them scaling to millions). In particular, the scenario determiner 124 can take the declarative description (e.g., received by the scenario designer 122) and determine representatives to fill various metrics that are not explicitly defined in the scenario (e.g., traffic, speed of the swerve, aggressive driving, number of vehicles, types of vehicles, locations of buildings, trees, wait conditions, etc.). Using these various metrics, the scenario determiner 124 can build out the different variations of the defined scenario.

The scenario generator 126 may be used to generate variations of a defined scenario. Using the data determined by the scenario determiner 124, the scenario generator 126 can generate one or more instances and/or variations of the defined scenario in a technically meaningful way. This may include generating variations of the scenario in different physical environments, with different actors, differing path structures, different speeds, velocities, differing movements of actors in the environment, different stationary objects, different wait conditions, traffic, and/or the like, and/or with other differences that may attempt to capture the defined observable in enough variation to aid in training the underlying system of the autonomous vehicle for safe and effective operation in any real-world scenario.

The simulation implementer 128 may be used to implement the generated scenarios. For example, after generating different variations of a defined scenario (e.g., using the scenario generator 126), the simulation implementer 128 may run the variations of the defined scenario. The simulation implementer 128 may be used to test a virtual instance of an autonomous vehicle 102, a semi-autonomous vehicle, and/or a component or feature thereof against the defined scenarios generated using the scenario generator 126.

The analyzer 132 may be used to determine and evaluate functionality and/or performance of the autonomous system. For instance, the analyzer 132 may evaluate the accuracy of the generated scenarios, accuracy of the system under test, and/or coverage of requirements and/or test objectives. In particular, in some embodiments, the analyzer 132 may determine coverage of the defined scenario (e.g., how well did the scenario actually represent the definition and/or test objective(s) used to generate the scenario). In further embodiments, the analyzer 132 may evaluate the variations of the defined scenario (e.g., were the scenarios diverse enough to provide adequate testing over a variety of possibilities). In other embodiments, the analyzer 132 may analyze checkers for behavior(s) in the variations of the defined scenario.

In further detail, the analyzer 132 may be used to determine coverage of the defined scenario. In particular, the analyzer 132 may use a coverage checker to evaluate the variations of the defined scenario to determine the completeness of the testing related to the defined scenario. Coverage checkers can be used to analyze the simulations based on the variations of the defined scenario and, in this way, coverage collectors can be used to determine whether the control values that relate to a scenario actually resulted in the desired observable in the simulation. The analyzer 132 can use coverage checkers to analyze the variations of the defined scenario to confirm that the simulations based on the variations actually run as planned (e.g., include the desired observable described in the declarative description and/or in interpretable description understandable to the engine). Coverage may be represented using a percentage of how many variations of the defined scenario meet the user specified declarative description (e.g., 90%) and/or in any other key performance indicator (KPI) metric. Coverage can also indicate the criticality of non-covered scenarios. For example, if there is 90% coverage but non-covered scenarios are highly critical, the coverage checker can make this determination and provide an indication of the same. When the coverage checker indicates that coverage is not met (e.g., based on the percentage or when non-covered scenarios are highly critical), additional variations of the defined scenario can be run—e.g., based on feedback from the analyzer 132 into the system that may be automatically generated based on the issues identified.

In addition, the analyzer 132 may be used to evaluate the variations of the defined scenario. In particular, the analyzer

132 may use context-specific evaluators to compare functionality and performance to expected behavior, expected parameters, and/or any kind of ground truth. In addition, scenario-quality metric can be used to determine how good a variation of the defined scenario is (e.g., whether the variation achieves the observable, whether the variation is reusable across multiple tests on various platforms, etc.). Such evaluators can be run in real-time, during the execution of the system under test, off-line, and/or in any combination of the above circumstances. In some instances, the evaluators can run in the background of the system which can enable active searching for issues or shortfalls in any given scenario—e.g., during runtime. For instance, the evaluator can be used to determine the root of what went wrong. In particular, an evaluator can be used to fetch a state of an autonomous vehicle 102 (or the virtual representation thereof) when a simulation is running and can then search for the objective of a user specified declarative description based on expected behavior. In some embodiments, multiple evaluators can run at the same time and, based on the analysis of each of these evaluators, the search space can be optimized (e.g., to help with debugging because other problems that are not the root cause can be discounted).

Further, the analyzer 132 may be used to analyze checkers for behavior(s) in the variations of the defined scenario. A checker may be similar to the evaluators discussed previously except that checkers may include enumeration-based and/or binary evaluation means. For instance, a checker may determine whether something happens or not. In particular, the checker may add an "assert" that will generate a pass flag if something happens. A checker may evaluate a variation to determine whether a condition holds throughout the execution of a scenario (e.g., an ego-vehicle always keeps a safe distance from the car in front of it throughout the execution of the scenario).

In addition, the analyzer 132 may evaluate individual or combinations of features, functionality, or components (e.g., hardware or software) of the autonomous system, and use feedback from the evaluation to update the scenarios and/or generate new scenarios within the virtual computational environment to further or fully test the features, functionality, and/or components, and/or to update the autonomous system itself (e.g., to update DNNs or other machine learning algorithms for retesting to increase accuracy, to update sensor models or calibration information, etc.). In particular, the analyzer 132 may further feed the results of an analysis back to the system 100A for generating updated scenarios that more accurately comply with the scenario desired, and/or updating features or modules of the autonomous system (e.g., for self-monitoring or self-healing purposes for the system under test to advance its own functionality).

Figure 1B:
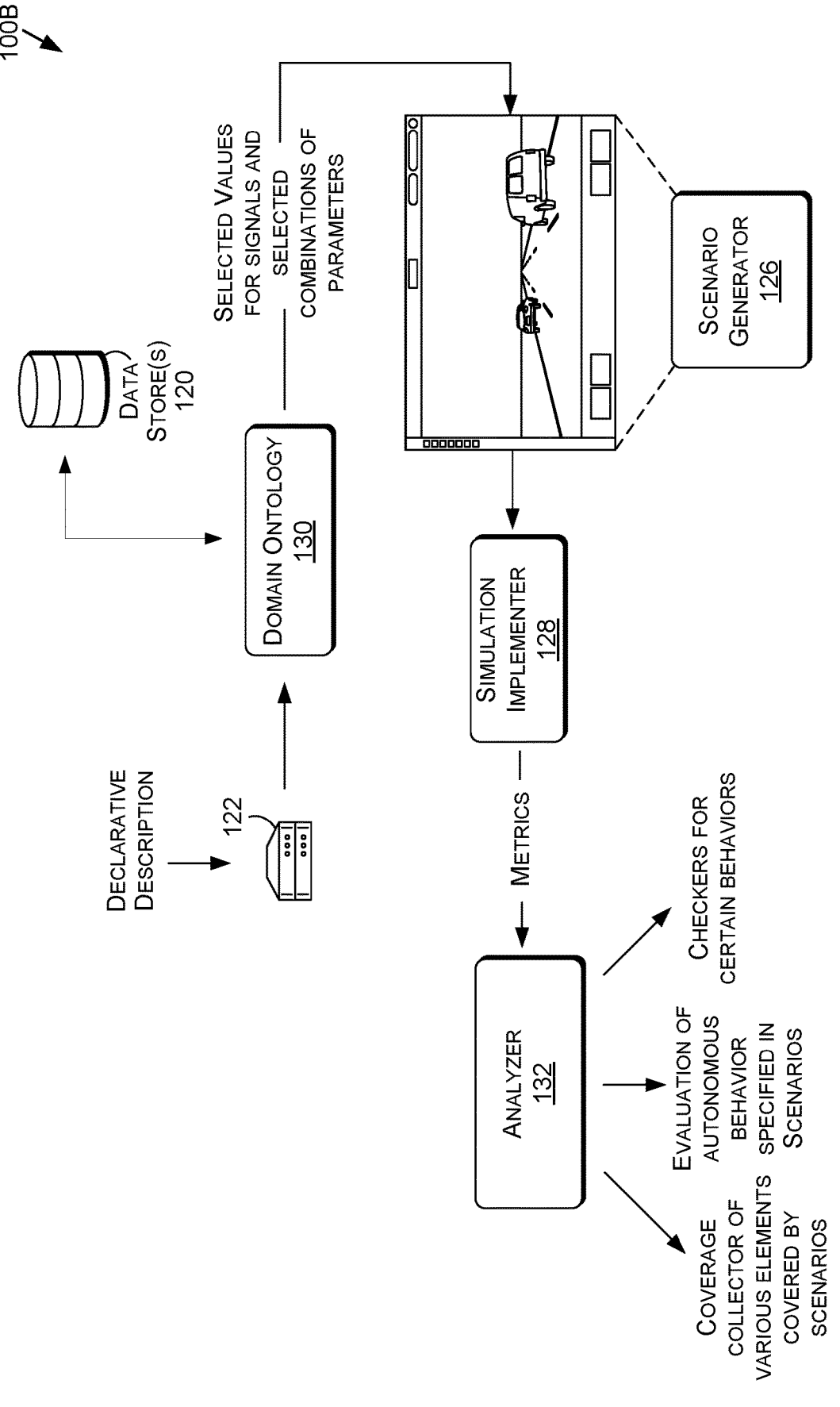
FIG. 1B includes a data flow diagram for generating virtual environment scenarios based on defined observers and validating functionality and performance of autonomous machines related to the generated virtual environment scenarios, in accordance with some embodiments of the present disclosure.

Now referring to FIG. 1B, FIG. 1B includes a data flow diagram for a process 100B of generating virtual environment scenarios based on defined observers and validating functionality and performance of autonomous machines related to the generated virtual environment scenarios. The process 100B may include a scenario designer 122 which may use a declarative description in addition to a domain ontology 130 to define information for the scenario generator 126. The domain ontology may be stored using dataset store(s) 120 (e.g., a service that handles immutable datasets for further processing). The domain ontology 130 may be used to determine concrete values and/or parameters corresponding to defined and undefined criteria related to the declarative description in order to generate one or more scenarios and/or observers. For instance, the scenario determiner 124 can take the declarative description (e.g., received by the scenario designer 122) and access the domain ontology 130 to determine representatives to fill various metrics that are not explicitly defined in the scenario (e.g., traffic, speed of the swerve, aggressive driving, number of vehicles, types of vehicles, locations of buildings, trees, wait conditions, etc.). Using selected values (e.g., various metrics), different variations of the defined scenario can be built out by the scenario generator 126. For instance, the scenario generator 126 can generate one or more instances and/or variations of the defined scenario using the selected values from the domain ontology 130. Once the variations (which may each include at least some different selected values) of the defined scenario are generated, the simulation implementer 128 may be used to run simulations using the variations of the defined scenario.

In some embodiments, the performance of the system may be evaluated, and outputs of the evaluation may be used to generate notifications or information for users. For example, where coverage is below a desired level, this information may be populated with a graphical user interface (GUI) (e.g., "coverage of this simulation was 87%). As another example, when the coverage is high (e.g., above a threshold) but critical aspects are missed by the scenarios, this information may be populated with in a GUI (e.g., "coverage was 90%, but safety-critical testing variations were not captured"). Similarly, where performance of a feature of an autonomous or semi-autonomous vehicle is not adequate, or is adequate, this information may also be populated within the GUI (e.g., "the DNN for object detection performed with 78% accuracy, which is below the desired accuracy level"). In any example, where this information is populated, a root cause of performance issues, coverage misses, and/or the like may also be determined by the system—e.g., automatically—and populated within the GUI (e.g., "the coverage was below the threshold coverage, but simulations 9, 17, and 30 did not match the defined observable"). In such examples, the system may also generate new commands or declarative descriptions to account for these issues in follow up or updated scenarios. Thus, the process may include an end-to-end solution that may include auto-correcting as well as information generation for a user throughout the process.

Domain Ontologies

The domain ontology 200—e.g., represented by at least ontologies 200A, 200B, 200C, 200D, and 200E, described in more detail herein—may relate to a notion of a well-defined operational design domain ("ODD"). It can be difficult to precisely and completely define the operational requirements within the ODD. For instance, conventional verification and validation systems do not provide a complete specification of actor behaviors and relationships within the ODD. Further, defining interactions between actors and an ego-vehicle undergoing testing can be difficult. The systems of the present disclosure allow such interactions to be defined using an observable desired system outcome (e.g., safely complete a particular mission, task, or goal). In particular, the observable desired system outcome can be defined using a declarative description and/or first order logic, as described herein.

In particular, the systems of the present disclosure can use a domain ontology to provide specifications related to actor behaviors and relationships within the ODD based on a defined declarative description. In particular, such a domain ontology can provide the terminology and taxonomy of basic concepts underlying an ODD of the simulated environment. The ontology may provide a means of knowledge representation that can be used to represent complex knowledge related to the simulated environment. For instance, the ontology can provide information related to computational simulation objects, groupings of simulation objects, relationships and rules governing the interactions between various simulation objects, etc. The domain ontology representation can generally enable semantic interoperability between models of the testing system, and can define axioms—and facts logically deduced from the axioms—that can be used.

The domain ontology may include an upper ontology that represents the most general (e.g., abstract) concepts that underlie other more specialized lower-level ontologies related to the autonomous vehicle domain (e.g., maps, actors, control, etc.). Generally, an entity can be anything that exists within the computational simulated environment. For non-limiting example, entities can be divided into instances (your car, my SUV) and universals or types (car, SUV). Further, a continuant can be an entity that persists, endures, or continues to exist through time while maintaining its identity. Continuants may also include spatial regions, in embodiments. Material entities (e.g., continuants) can preserve their identity even while gaining and losing material parts. As such, continuants can be contrasted with occurrents, which may unfold themselves in successive temporal parts or phases. Continuants may include no temporal parts in this sense. The entities can be linked by relations at the level of both instances and types.

In this way, the domain ontology representation in the computational engine can be comprised of various ontologies related to different aspects of the simulated environment. Each ontology may include hierarchical classes and/or sets of objects. In relation to these hierarchical classes or sets of objects, the ontology can define related attributes and features (e.g., attributes of the hierarchical classes or sets of objects). The ontology can further define relationships and roles among objects as well as axioms that constrain concepts or roles related to the hierarchical classes or sets of objects. For instance, each ontology can include primitive concepts (e.g., object, activity, activity occurrence, time point, etc.), constraints, functions (e.g., beginning, end), and relations (occurrence of, participates in, between, before, exists at, occurring at). Ontologies that comprise the domain ontology may include an actor ontology, a map ontology, an environment ontology, a control ontology, and/or other ontologies, such as but not limited to those described herein.

As an example, and referring to FIG. 2A, FIG. 2A depicts how a domain ontology may be leveraged by the systems of the present disclosure with regard to a declarative description of a desired scenario and/or observer. A declarative description 202 can be used to describe a desired scenario, observer, and/or evaluator. In some embodiments, the declarative description 202 can be described using first order logic, and may generally describe observables that occur in parallel and/or sequence in a particular time and space. In this way, the declarative description 202 may define at least a first layer in a domain ontology 200A. This first layer can describe a particular moment in time or in a particular space, and may be non-domain specific (e.g., autonomous devices, autonomous robots, smart devices, etc.). A next, second layer in the domain ontology 200A can be autonomous machine specific 204, and may be based on predicates and functions that relate to autonomous machines. These predicates and functions can be the primitives that describe some fact (e.g., observable) at the particular moment in time or in a particular space on the map. A third layer in the domain ontology 200A can then stitch the referenced primitives together and, as such, may be a property specific layer 206 where behaviors can be specified.

These layers—and/or additional or alternative layers—may be used such that when a user specifies a declarative description of a desired scenario in the top-most layer, the system can take the declarative description and reverse it. For instance, the system can break the user specified declarative description (e.g., the declarative description 202) into its constituents (e.g., primitives) using the next layer down (e.g., the autonomous vehicle specific layer 204). From this, the system can begin to evaluate those primitives (e.g., using the property specific layer 206). For example, the system can scan through time series data for time variables and then evaluate for defined information from the user specified declarative description.

Figure 2B:
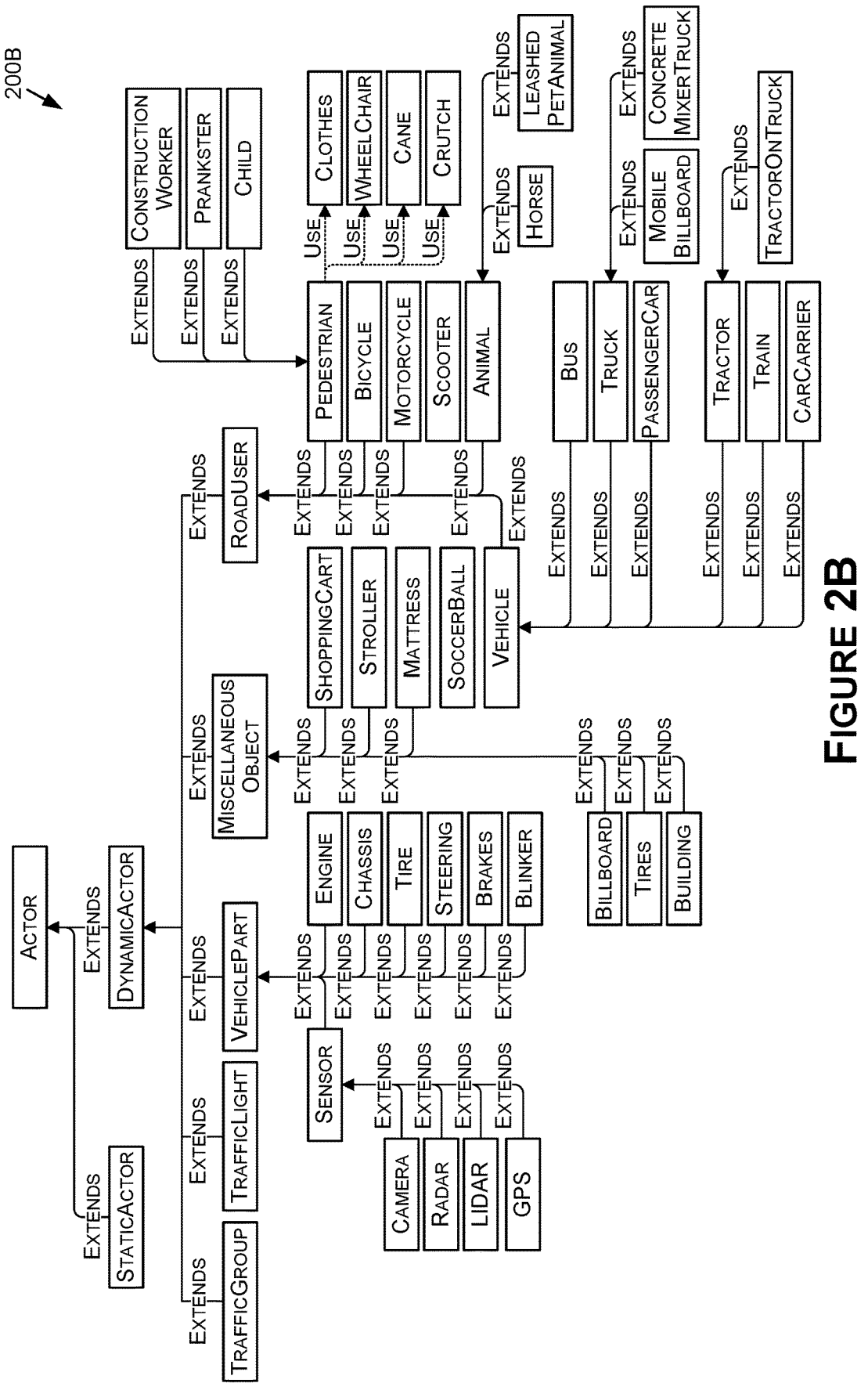

Referring to FIGS. 2B-2E, FIG. 2B-2E depict specific example domain ontologies. FIG. 2B depicts an example actor ontology 200B. The actor ontology 200B can include static and/or dynamic actors. Static actors can include objects on a map (e.g., of a simulated environment) that do not change or move, such as the infrastructure, barriers, buildings, dividers, lanes, intersections, traffic signals, road signs, etc. Dynamic actors can include objects on the map that change and/or move. This change and/or movement can be spontaneous or based on the influence of an external force or scenario command. Examples of dynamic actors can include portions of the ego car (e.g., sensors, mechanical parts, compute parts), other objects in the environment (e.g., people, animals, different types of vehicles), and so on.

Figure 2C:
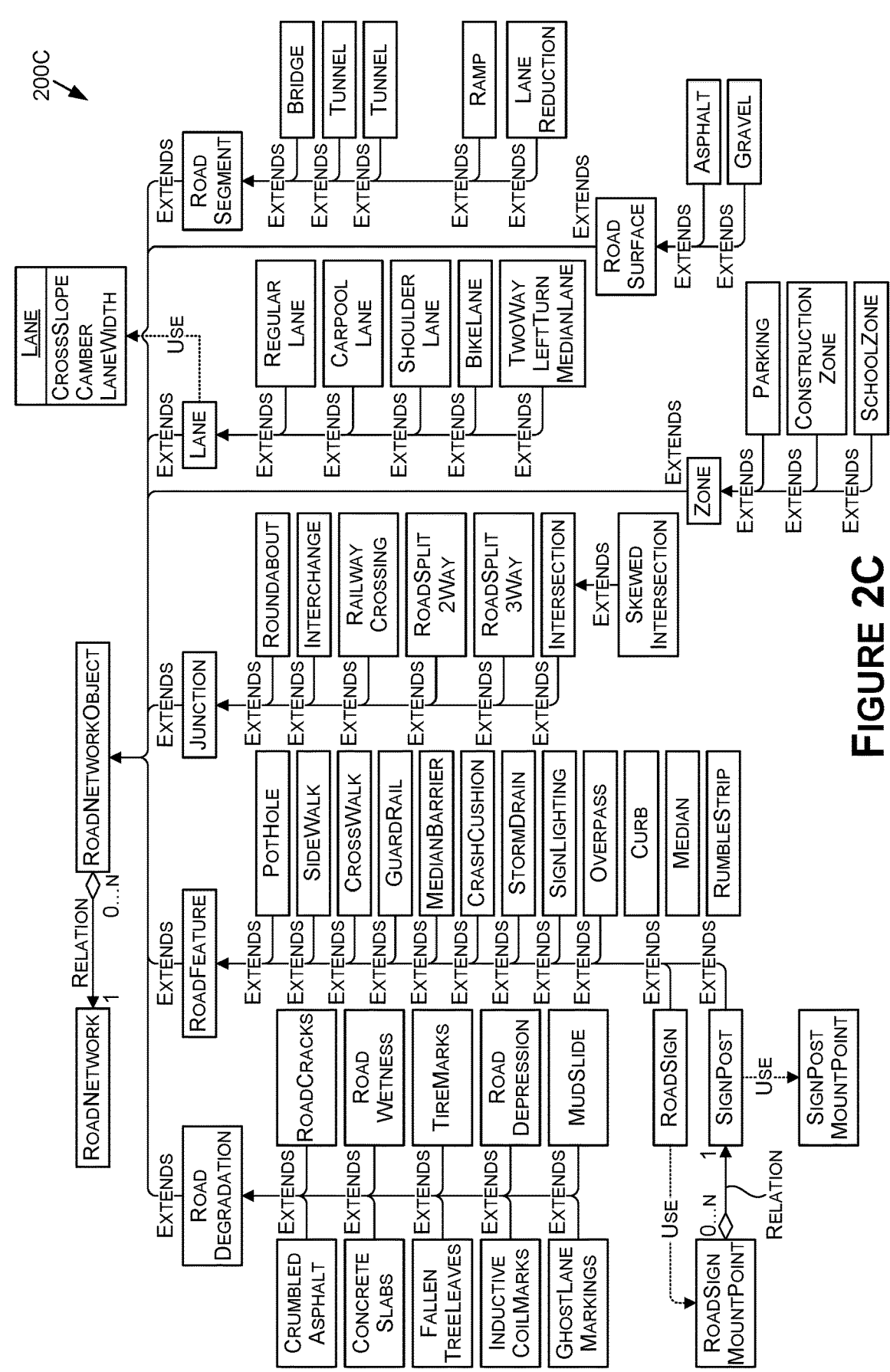

FIG. 2C depicts an example road network ontology 200C. The road network ontology 200C can comprise path structure information. Examples of such path structure information includes at least one of a number of lanes, a curvature, locations of wait conditions, or types of wait conditions.

Figure 2D:
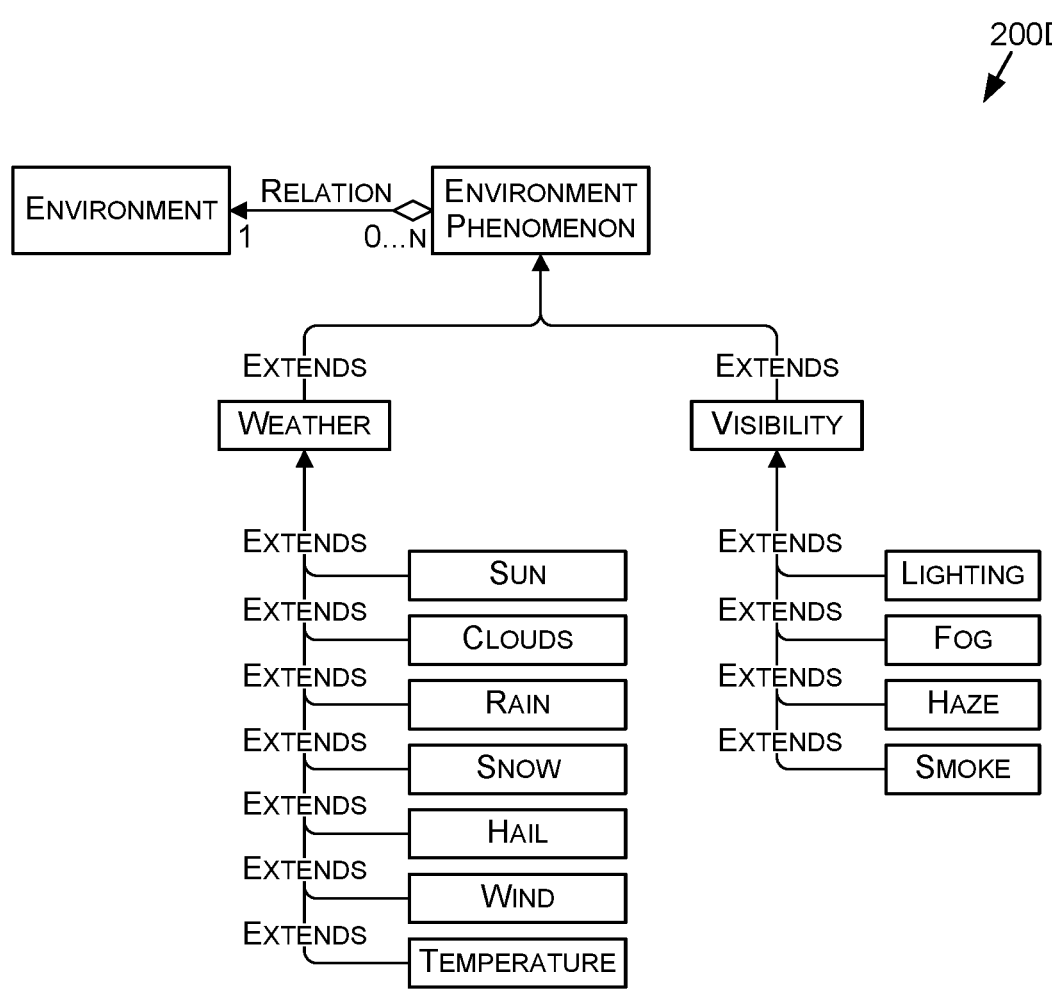

FIG. 2D depicts an example environment ontology 200D. The environment ontology 200D can comprise information related to the environment. Examples of such environment information include weather conditions (e.g., sun, clouds, snow, temperature, etc.) and visibility conditions (e.g., lighting, fog, etc.).

Figure 2E:
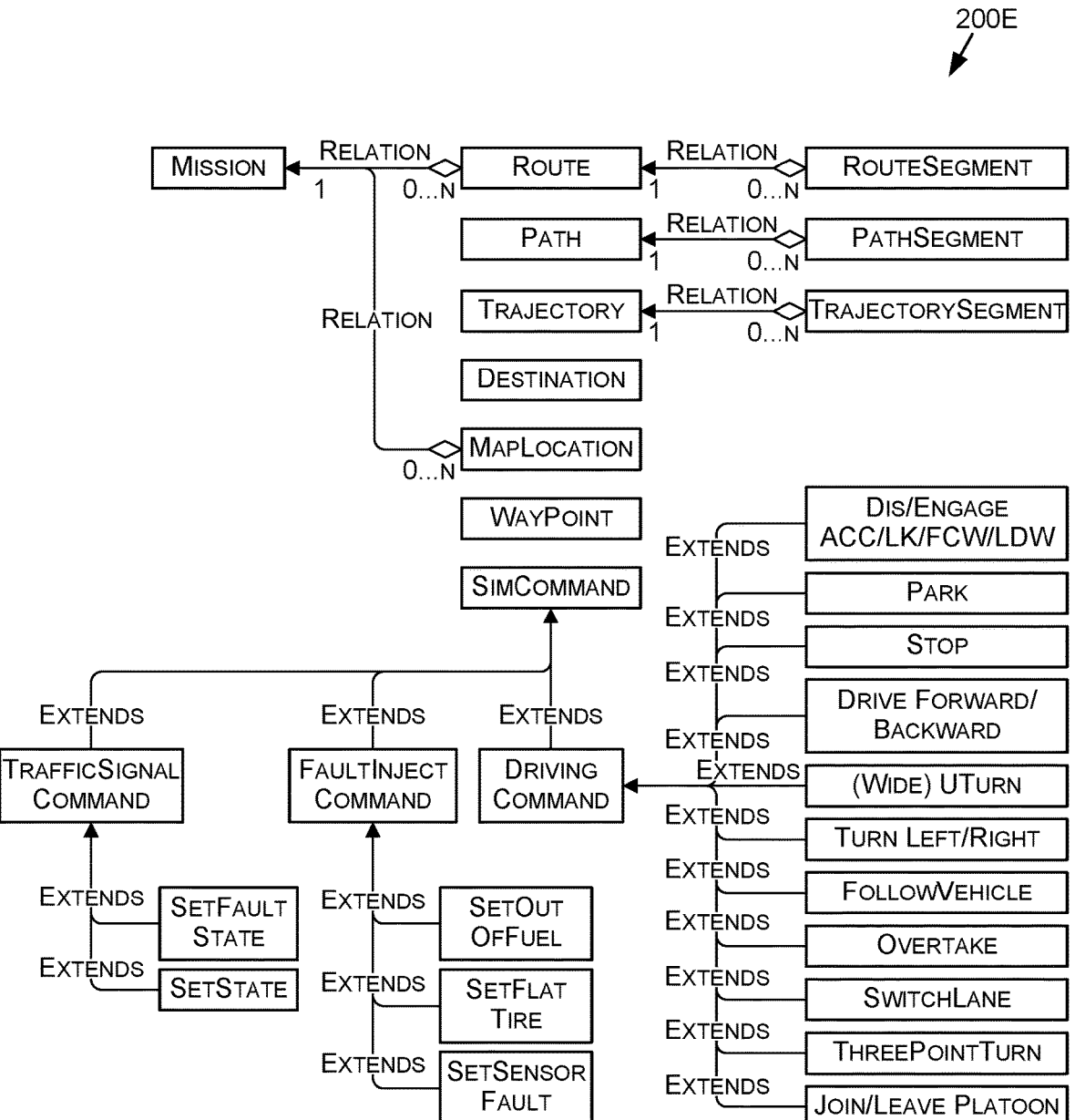

FIG. 2E depicts an example control ontology 200E. The control ontology 200E can comprise control information. This control information can relate to a particular route, mission, path, or trajectory of an autonomous vehicle within a scenario. Examples of such control information includes at least one driving commands, traffic signals, destination, map location, etc.

Figure 3:
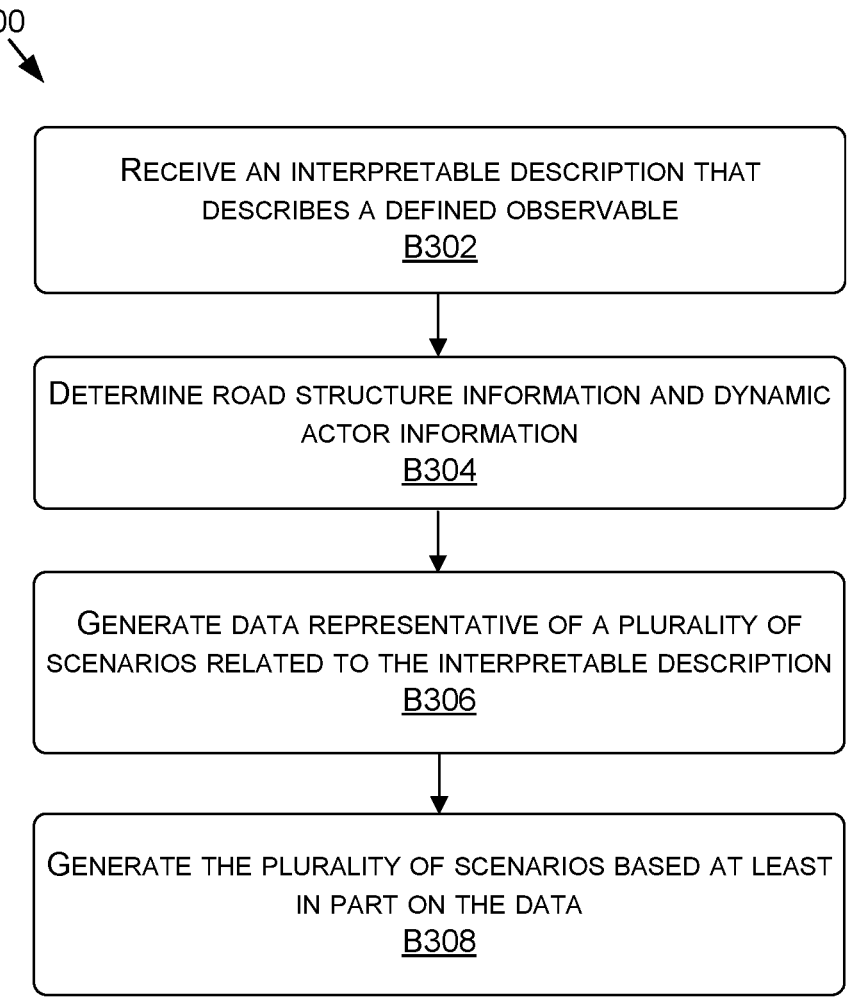
FIG. 3 is a flow diagram showing a method for generating a plurality of scenarios related to an interpretable description that describes a defined observable, in accordance with some embodiments of the present disclosure.

Now referring to FIGS. 3, 4, and 5, each block of methods 300, 400, and 500, described herein, comprises a computing process that may be performed using any—or a combination—of hardware, firmware, and/or software. For instance, various functions may be carried out by a processor executing instructions stored in memory. The methods may also be embodied as computer-usable instructions stored on computer storage media. The methods may be provided by a standalone application, a service or hosted service (standalone or in combination with another hosted service), or a plug-in to another product, to name a few. In addition, methods 300, 400, and 500 are described, by way of example, with respect to the system 100A of FIG. 1A, the simulation system 600 of FIGS. 6A-6C, and the simulation system 700 of FIGS. 7A-7B. However, these methods may additionally or alternatively be executed by any one system, or any combination of systems, including, but not limited to, those described herein.

FIG. 3 is a flow diagram showing a method 300 for generating a plurality of simulation scenarios related to an interpretable description that describes a defined observable, in accordance with some embodiments of the present disclosure. The method 300, at block B302, includes receiving an interpretable description that describes a defined observable. For example, scenario designer 122 may receive an interpretable description that defines a scenario within the autonomous driving validation search space. In some embodiments, the scenario designer 122 may receive a behavior of interest defined in a descriptive and/or declarative manner. In some examples, the interpretable description may be representative of a declarative paradigm, first order logic, or other interpretable description that enables an automated and algorithmically enhanced way of creating a meaningful representative.

The method 300, at block B304, includes determining path structure information and dynamic actor information. For example, a scenario determiner 124 can take the declarative description (e.g., received by the scenario designer 122) and access the domain ontology 130. The domain ontology 130 may be used to determine the path structure information and dynamic actor information. This path structure information and dynamic actor information may be used to determine representatives to fill various metrics that are not explicitly defined in the declarative description (e.g., traffic, speed of the swerve, aggressive driving, number of vehicles, types of vehicles, locations of buildings, trees, wait conditions, etc.). In embodiments, the path structure information may be determined using road network ontology 200C. The road network ontology 200C can comprise path structure information including at least one of a number of lanes, a curvature, locations of wait conditions, or types of wait conditions. In embodiments, the dynamic actor information may be determined using actor ontology 200B. The actor ontology 200B can comprise static actors (objects on a map that do not change or move, such as the infrastructure) and dynamic actors (objects on the map that change and/or move).

The method 300, at block B306, includes generating data representative of a plurality of scenarios related to the interpretable description. For example, based at least in part on the path structure information and dynamic actor information received from the domain ontology 130, the scenario determiner 124 may generate data representative of a plurality of scenarios. For instance, the scenario determiner 124 can take the declarative description (e.g., received by the scenario designer 122) and access the domain ontology 130 to determine representatives to fill various metrics that are not explicitly defined in the scenario (e.g., traffic, speed of the swerve, aggressive driving, number of vehicles, types of vehicles, locations of buildings, trees, wait conditions, etc.). Using selected values (e.g., various metrics), different variations of the defined scenario can be built out.

The method 300, at block B308, generating a plurality of scenarios based at least in part on the data. The scenario generator 126 may be used to generate the variations of the defined scenario. For instance, the scenario generator 126 can generate a plurality of scenarios that relate to the defined scenario using the selected values from the domain ontology 130.

FIG. 4 is a flow diagram showing a method 400 for generating and analyzing a plurality of scenarios related to a declarative description that describes a defined observable, in accordance with some embodiments of the present disclosure. For instance, in some embodiments, method 400 can be used to determine the accuracy of functionality and performance related to a desired observable. In further embodiments, the method 400 can be used to determine a coverage value in view of a desired observable. The method 400, at block B402, includes receiving a declarative description of a desired observable. For example, a scenario designer 122 may receive a declarative description that defines a scenario within the autonomous driving validation search space. In some embodiments, the declarative description may indicate a behavior of interest defined in a descriptive and/or declarative manner.

The method 400, at block B404, includes determining commands for generating a plurality of scenarios related to the observable within a simulation system. For instance, the commands may be determined using a domain ontology related to simulated environments for validating autonomous vehicles. Further, the commands may be determined based at least in part on the declarative description. For example, a scenario determiner 124 can take the declarative description (e.g., received by the scenario designer 122) and access the domain ontology 130. The domain ontology 130 may be used to determine the commands, where the commands may be related to determining representatives to fill various metrics that are not explicitly defined in the declarative description (e.g., traffic, speed of the swerve, aggressive driving, number of vehicles, types of vehicles, locations of buildings, trees, wait conditions, etc.).

The method 400, at block B406, includes generating the plurality of scenarios. For example, the scenario generator 126 may be used to generate the variations of the defined scenario. For instance, the scenario generator 126 can generate a plurality of scenarios that are related to the defined scenario using information from the domain ontology 130.

The method 400, at block B408, includes running simulations of the plurality of scenarios. For example, simulation implementer 128 may be used to implement generated scenarios. After generating different variations of a defined scenario (e.g., using the scenario generator 126), the simulation implementer 128 may run the variations of the defined scenario. The simulation implementer 128 may be used to test a virtual instance of an autonomous vehicle against the defined scenarios generated using the scenario generator 126.

The method 400, at block B410, includes determining accuracy of functionality and performance of a system under test based on an analysis of the plurality of scenarios in view of the desired observable. For example, the analyzer 132 may be used to determine the accuracy or precision of functionality and performance based on the plurality of scenarios in view of the desired observable. In particular, the analyzer 132 may use context-specific evaluators to compare functionality and performance to expected behavior, expected parameters, and/or any kind of ground truth. In addition, the analyzer 132 may use one or more scenario-quality metric to determine how good a variation of the defined scenario is (e.g., whether the variation achieves the observable, whether the variation is reusable across multiple tests on various platforms, etc.).

The method 400, at block B412, includes determining a coverage value for select elements based on the plurality of scenarios in view of the desired observable. For example, the analyzer 132 may use a coverage checker to evaluate the variations of the defined scenario to determine the completeness of the testing related to the defined scenario. The analyzer 132 can use coverage checkers to analyze the variations of the defined scenario to confirm that the simulations based on the variations actually run as planned (e.g., include the desired observable described in the declarative description and/or in interpretable description understandable by the engine).

FIG. 5 is a flow diagram showing a method 500 for generating and evaluating multiple scenarios that include an observable represented by declarative language, in accordance with some embodiments of the present disclosure. The method 500, at block B502, includes accessing a domain ontology related to a simulated environment for testing autonomous vehicles. For example, the domain ontology 130 can comprise terminology and taxonomy of basic concepts underlying operational design domain of a simulated environment.

The method 500, at block B504, includes selecting values from the domain ontology based on a declarative language description of a scene. For example, a scenario determiner 124 can take the declarative description of the scene and access the domain ontology 130. The domain ontology 130 may be used to determine concrete values and/or parameters corresponding to defined and/or undefined criteria related to the declarative description of the scene.

The method 500, at block B506, includes generating multiple scenarios within a simulation environment that include an observable represented by the declarative language. For example, the scenario generator 126 may be used to generate the multiple scenarios. For instance, the scenario generator 126 can generate multiple scenarios that include an observable represented by the declarative language using information from the domain ontology 130.

The method 500, at block B508, includes executing simulations of at least one feature of a virtual autonomous vehicle through the multiple scenarios within the simulation environment. For example, simulation implementer 128 may be used to implement generated scenarios. After generating different variations of a defined scenario (e.g., using the scenario generator 126), the simulation implementer 128 may run the variations of the defined scenario. The simulation implementer 128 may be used to test a virtual instance of an autonomous vehicle and/or actual hardware or software of the autonomous vehicle (e.g., HIL or SIL) against the defined scenarios generated using the scenario generator 126.

The method 500, at block B510, includes evaluating performance of the at least one feature during the simulations. For example, the analyzer 132 may be used to evaluate performance of at least one feature, functionality, and/or component (e.g., hardware or software) of the autonomous vehicle 102 (or a virtual representation thereof) during the simulations.

Simulation System

The simulation system 600—e.g., represented by simulation systems 600A, 600B, 600C, and 600D, described in more detail herein—may generate a global simulation that simulates a virtual world or environment (e.g., a simulated environment) that may include artificial intelligence (AI) vehicles or other objects (e.g., pedestrians, animals, etc.), hardware-in-the-loop (HIL) vehicles or other objects, software-in-the-loop (SIL) vehicles or other objects, and/or person-in-the-loop (PIL) vehicles or other objects. The global simulation may be maintained within an engine (e.g., a game engine), or other software-development environment, that may include a rendering engine (e.g., for 2D and/or 3D graphics), a physics engine (e.g., for collision detection, collision response, etc.), sound, scripting, animation, AI, networking, streaming, memory management, threading, localization support, scene graphs, cinematics, and/or other features. In some examples, as described herein, one or more vehicles or objects within the simulation system 600 (e.g., HIL objects, SIL objects, PIL objects, AI objects, etc.) may be maintained within their own instance of the engine. In such examples, each virtual sensor of each virtual object may include their own instance of the engine (e.g., an instance for a virtual camera, a second instance for a virtual LIDAR sensor, a third instance for another virtual LIDAR sensor, etc.). As such, an instance of the engine may be used for processing sensor data for each sensor with respect to the sensor's perception of the global simulation. As such, for a virtual camera, the instance may be used for processing image data with respect to the camera's field of view in the simulated environment. As another example, for an IMU sensor, the instance may be used for processing IMU data (e.g., representative of orientation) for the object in the simulated environment.

AI (e.g., bots) vehicles or other objects may include pedestrians, animals, third-party vehicles, vehicles, and/or other object types. The AI objects in the simulated environment may be controlled using artificial intelligence (e.g., machine learning such as neural networks, rules-based control, a combination thereof, etc.) in a way that simulates, or emulates, how corresponding real-world objects would behave. In some examples, the rules, or actions, for AI objects may be learned from one or more HIL objects, SIL objects, and/or PIL objects. In an example where an AI object (e.g., bot) in the simulated environment corresponds to a pedestrian, the bot may be trained to act like a pedestrian in any of a number of different situations or environments (e.g., running, walking, jogging, not paying attention, on the phone, raining, snowing, in a city, in a suburban area, in a rural community, etc.). As such, when the simulated environment is used for testing vehicle performance (e.g., for HIL or SIL embodiments), the bot (e.g., the pedestrian) may behave as a real-world pedestrian would (e.g., by jaywalking in rainy or dark conditions, failing to heed stop signs or traffic lights, etc.), in order to more accurately simulate a real-world environment. This method may be used for any AI bot in the simulated environment, such as vehicles, bicyclists, or motorcycles, whose AI bots may also be trained to behave as real-world objects would (e.g., weaving in and out of traffic, swerving, changing lanes with no signal or suddenly, braking unexpectedly, etc.).

The AI objects that may be distant from the vehicle of interest (e.g., the ego-vehicle in the simulated environment) may be represented in a simplified form—such as a radial distance function, or list of points at known positions in a plane, with associated instantaneous motion vectors. As such, the AI objects may be modeled similarly to how AI agents may be modeled in videogame engines.

HIL vehicles or objects may use hardware that is used in the physical vehicles or objects to at least assist in some of the control of the HIL vehicles or objects in the simulated environment. For example, a vehicle controlled in a HIL environment may use one or more SoCs 804 (FIG. 8C), CPU(S) 818, GPU(s) 820, etc. in a data flow loop for controlling the vehicle in the simulated environment. In some examples, the hardware from the vehicles may be an NVIDIA DRIVE AGX Pegasus™ compute platform and/or an NVIDIA DRIVE PX Xavier™ compute platform. For example, the vehicle hardware (e.g., vehicle hardware 104) may include some or all of the components and/or functionality described in U.S. Non-Provisional application Ser. No. 16/186,473, filed on Nov. 9, 2018, which is hereby incorporated by reference in its entirety. In such examples, at least some of the control decisions may be generated using the hardware that is configured for installation within a real-world autonomous vehicle (e.g., the vehicle 102) to execute at least a portion of a software stack(s) 642 (e.g., an autonomous driving software stack).

SIL vehicles or objects may use software to simulate or emulate the hardware from the HIL vehicles or objects. For example, instead of using the actual hardware that may be configured for use in physical vehicles (e.g., the vehicle 102), software, hardware, or a combination thereof may be used to simulate or emulate the actual hardware (e.g., simulate the SoC(s) 804).

PIL vehicles or objects may use one or more hardware components that allow a remote operator (e.g., a human, a robot, etc.) to control the PIL vehicle or object within the simulated environment. For example, a person or robot may control the PIL vehicle using a remote control system (e.g., including one or more pedals, a steering wheel, a VR system, etc.), such as the remote control system described in U.S. Non-Provisional application Ser. No. 16/366,506, filed on Mar. 27, 2019, and hereby incorporated by reference in its entirety. In some examples, the remote operator may control autonomous driving level 0, 1, or 2 (e.g., according to the Society of Automotive Engineers document J3016) virtual vehicles using a VR headset and a CPU(s) (e.g., an X86 processor), a GPU(s), or a combination thereof. In other examples, the remote operator may control advanced AI-assisted level 2, 3, or 4 vehicles modeled using one or more advanced SoC platforms. In some examples, the PIL vehicles or objects may be recorded and/or tracked, and the recordings and/or tracking data may be used to train or otherwise at least partially contribute to the control of AI objects, such as those described herein.

Figure 6A:
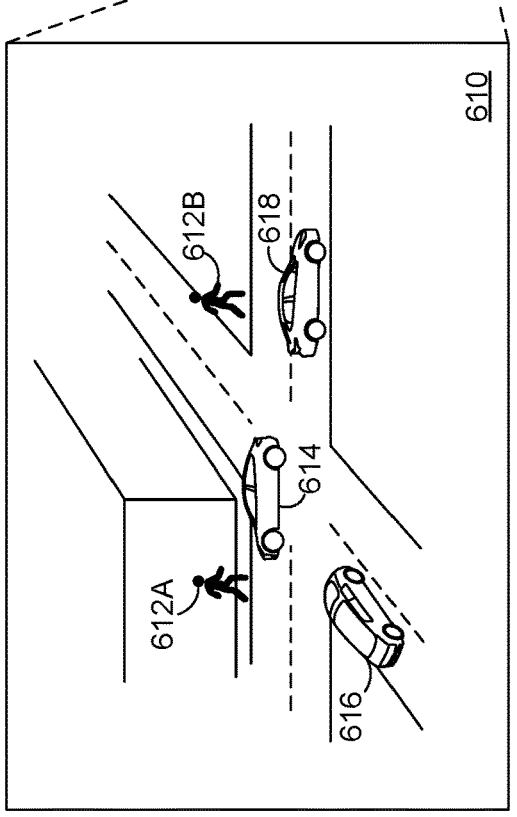
FIGS. 6A-6F include example illustrations of components, features, and functionality of an example simulation system suitable for use in implementing at least some embodiments of the present disclosure.

Now referring to FIG. 6A, FIG. 6A is an example illustration of a simulation system 600A, in accordance with some embodiments of the present disclosure. The simulation system 600A may generate a simulated environment 610 that may include AI objects 612 (e.g., AI objects 612A and 612B), HIL objects 614, SIL objects 616, PIL objects 618, and/or other object types. The simulated environment 610 may include features of a driving environment, such as roads, bridges, tunnels, street signs, stop lights, crosswalks, buildings, trees and foliage, the sun, the moon, reflections, shadows, etc., in an effort to simulate a real-world environment accurately within the simulated environment 610. In some examples, the features of the driving environment within the simulated environment 610 may be more true-to-life by including chips, paint, graffiti, wear and tear, damage, etc. Although described with respect to a driving environment, this is not intended to be limiting, and the simulated environment may include an indoor environment (e.g., for a robot, a drone, etc.), an aerial environment (e.g., for a UAV, a drone, an airplane, etc.), an aquatic environment (e.g., for a boat, a ship, a submarine, etc.), and/or another environment type.

The simulated environment 610 may be generated using virtual data, real-world data, or a combination thereof. For example, the simulated environment may include real-world data augmented or changed using virtual data to generate combined data that may be used to simulate certain scenarios or situations with different and/or added elements (e.g., additional AI objects, environmental features, weather conditions, etc.). For example, pre-recorded video may be augmented or changed to include additional pedestrians, obstacles, and/or the like, such that the virtual objects (e.g., executing the software stack(s) 642 as HIL objects and/or SIL objects) may be tested against variations in the real-world data.

The simulated environment may be generated using rasterization, ray-tracing, using DNNs such as generative adversarial networks (GANs), another rendering technique, and/or a combination thereof. For example, in order to create more true-to-life, realistic lighting conditions (e.g., shadows, reflections, glare, global illumination, ambient occlusion, etc.), the simulation system 600A may use real-time ray-tracing. In one or more embodiments, one or more hardware accelerators may be used by the simulation system 600A to perform real-time ray-tracing. The ray-tracing may be used to simulate LIDAR sensor for accurate generation of LIDAR data. For example, ray casting may be used in an effort to simulate LIDAR reflectivity. In any example, ray-tracing techniques used by the simulation system 600A may include one or more techniques described in U.S. Provisional Patent Application No. 62/644,385, filed Mar. 17, 2018, U.S. Provisional Patent Application No. 62/644,386, filed Mar. 17, 2018, U.S. Provisional Patent Application No. 62/644, 601, filed Mar. 19, 2018, and U.S. Provisional Application No. 62/644,806, filed Mar. 19, 2018, U.S. Non-Provisional patent application Ser. No. 16/354,983, filed on Mar. 15, 2019, and/or U.S. Non-Provisional patent application Ser. No. 16/355,214, filed on Mar. 15, 2019, each of which is hereby incorporated by reference in its entirety.

In some examples, the simulated environment may be rendered, at least in part, using one or more DNNs, such as generative adversarial neural networks (GANs). For example, real-world data may be collected, such as real-world data captured by autonomous vehicles (e.g., camera (s), LIDAR sensor(s), RADAR sensor(s), etc.), robots, and/or other objects, as well as real-world data that may be captured by any sensors (e.g., images or video pulled from data stores, online resources such as search engines, etc.). The real-world data may then be segmented, classified, and/or categorized, such as by labeling differing portions of the real-world data based on class (e.g., for an image of a landscape, portions of the image—such as pixels or groups of pixels—may be labeled as car, sky, tree, road, building, water, waterfall, vehicle, bus, truck, sedan, etc.). A GAN (or other DNN) may then be trained using the segmented, classified, and/or categorized data to generate new versions of the different types of objects, landscapes, and/or other features as graphics within the simulated environment.

The simulator component(s) 602 of the simulation system 600 may communicate with vehicle simulator component(s) 606 over a wired and/or wireless connection. In some examples, the connection may be a wired connection using one or more sensor switches 608, where the sensor switches may provide low-voltage differential signaling (LVDS) output. For example, the sensor data (e.g., image data) may be transmitted over an HDMI to LVDS connection between the simulator component(s) 602 and the vehicle simulator component(s) 606. The simulator component(s) 602 may include any number of compute nodes (e.g., computers, servers, etc.) interconnected in order to ensure synchronization of the world state. In some examples, as described herein, the communication between each of the compute nodes (e.g., the vehicle simulator component(s) compute nodes and the simulator component(s) compute nodes) may be managed by a distributed shared memory (DSM) system (e.g., DSM 624 of FIG. 6C) using a distributed shared memory protocol (e.g., a coherence protocol). The DSM may include a combination of hardware (cache coherence circuits, network interfaces, etc.) and software. This shared memory architecture may separate memory into shared parts distributed among nodes and main memory, or distributing all memory between all nodes. In some examples, InfiniBand (IB) interfaces and associated communications standards may be used. For example, the communication between and among different nodes of the simulation system 600 (and/or 600) may use IB.

The simulator component(s) 602 may include one or more GPUs 604. The virtual vehicle being simulated may include any number of sensors (e.g., virtual or simulated sensors) that may correspond to one or more of the sensors described herein at least with respect to FIGS. 8A-8C. In some examples, each sensor of the vehicle may correspond to, or be hosted by, one of the GPUs 604. For example, processing for a LIDAR sensor may be executed on a first GPU 604, processing for a wide-view camera may be executed on a second GPU 604, processing for a RADAR sensor may be executed on a third GPU, and so on. As such, the processing of each sensor with respect to the simulated environment may be capable of executing in parallel with each other sensor using a plurality of GPUs 604 to enable real-time simulation. In other examples, two or more sensors may correspond to, or be hosted by, one of the GPUs 604. In such examples, the two or more sensors may be processed by separate threads on the GPU 604 and may be processed in parallel. In other examples, the processing for a single sensor may be distributed across more than one GPU. In addition to, or alternatively from, the GPU(s) 604, one or more TPUs, CPUs, and/or other processor types may be used for processing the sensor data.

Figure 6B:
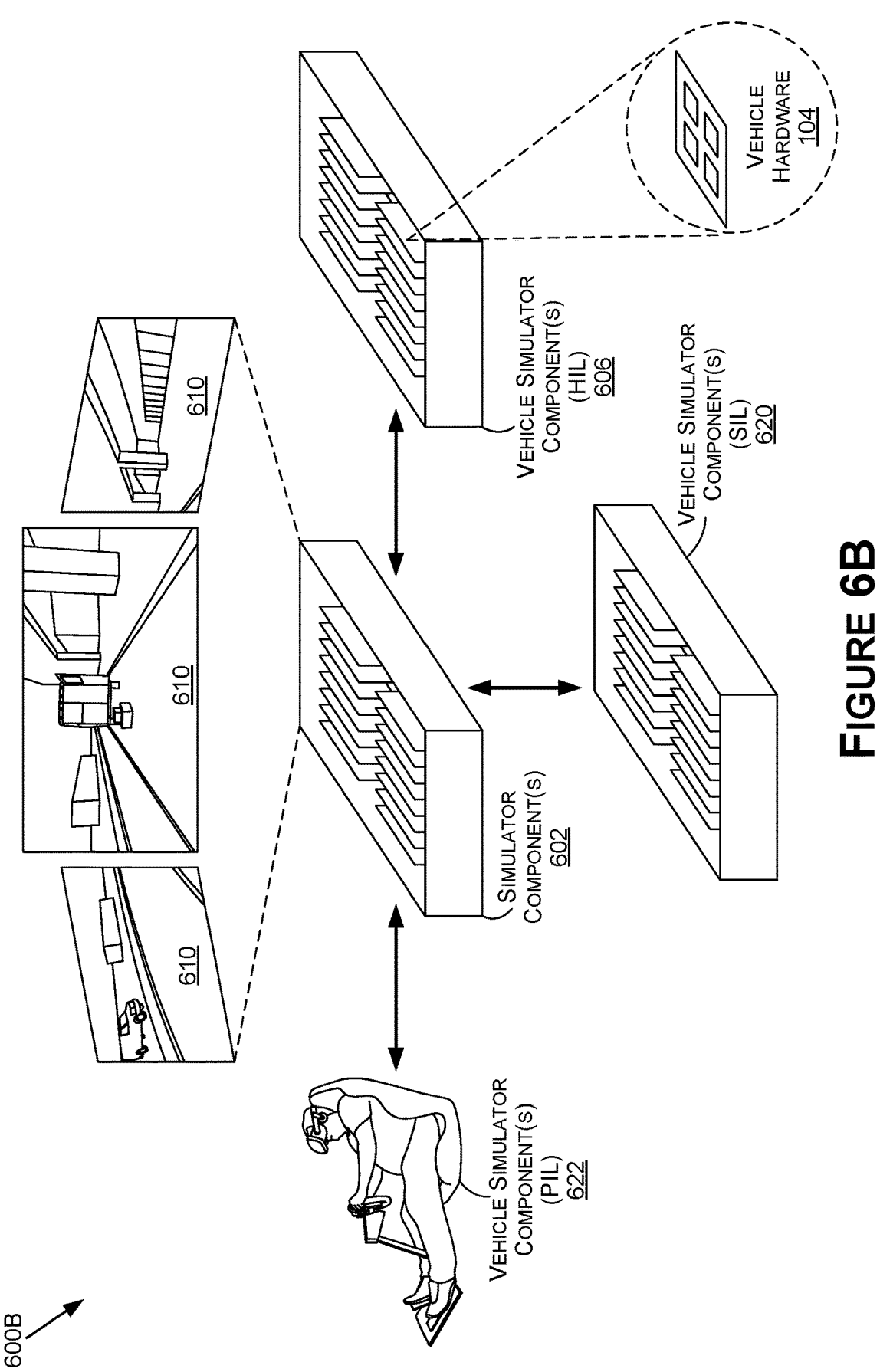
Figure 6C:
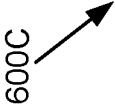

Vehicle simulator component(s) 606 may include a compute node of the simulation system 600A that corresponds to a single vehicle represented in the simulated environment 610. Each other vehicle (e.g., 614, 618, 616, etc.) may include a respective node of the simulation system. As a result, the simulation system 600A may be scalable to any number of vehicles or objects as each vehicle or object may be hosted by, or managed by, its own node in the system 600A. In the illustration of FIG. 6A, the vehicle simulator component(s) 606 may correspond to a HIL vehicle (e.g., because the vehicle hardware 104 is used). However, this is not intended to be limiting and, as illustrated in FIGS. 6B and 6C, the simulation system 600 may include SIL vehicles, HIL vehicles, PIL vehicles, and/or AI vehicles. The simulator component(s) 602 (e.g., simulator host device) may include one or more compute nodes of the simulation system 600A, and may host the simulation of the environment with respect to each actor (e.g., with respect to each HIL, SIL, PIL, and AI actors), as well as hosting the rendering and management of the environment or world state (e.g., the road, signs, trees, foliage, sky, sun, lighting, etc.). In some examples, the simulator component(s) 602 may include a server(s) and associated components (e.g., CPU(s), GPU(s), computers, etc.) that may host a simulator (e.g., NVIDIA's DRIVE™ Constellation AV Simulator).

The vehicle hardware 104, as described herein, may correspond to the vehicle hardware 104 of FIG. 1 that may be used in the physical vehicle 102. However, in the simulation system 600A, the vehicle hardware 104 may be incorporated into the vehicle simulator component(s) 606. As such, because the vehicle hardware 104 may be configured for installation within the vehicle 102, the simulation system 600A may be specifically configured to use the vehicle hardware 104 within a node (e.g., of a server platform) of the simulation system 600A. For example, similar interfaces used in the physical vehicle 102 may need to be used by the vehicle simulator component(s) 606 to communicate with the vehicle hardware 104. In some examples, the interfaces may include: (1) CAN interfaces, including a PCAN adapter, (2) Ethernet interfaces, including RAW UDP sockets with IP address, origin, VLA, and/or source IP all preserved, (3) Serial interfaces, with a USB to serial adapter, (4) camera interfaces, (5) InfiniBand (IB) interfaces, and/or other interface types.

In any examples, once the sensor data representative of a field(s) of view of the sensor(s) of the vehicle in the simulated environment has been generated and/or processed (e.g., using one or more codecs, as described herein), the sensor data (and/or encoded sensor data) may be used by the software stack(s) 642 (e.g., the autonomous driving software stack) executed on the vehicle hardware 104 to perform one or more operations (e.g., generate one or more controls, route planning, detecting objects, identifying drivable free-space, monitoring the environment for obstacle avoidance, etc.). As a result, the identical, or substantially identical, hardware components used by the vehicle 102 (e.g., a physical vehicle) to execute the autonomous driving software stack in real-world environments may be used to execute the autonomous driving software stack in the simulated environment 610. The use of the vehicle hardware 104 in the simulation system 600A thus provides for a more accurate simulation of how the vehicle 102 will perform in real-world situations, scenarios, and environments without having to actually find and test the vehicle 102 in the real-world. This may reduce the amount of driving time required for testing the hardware/software combination used in the physical vehicle 102 and may reduce safety risks by not requiring actual real-world testing (especially for dangerous situations, such as other vehicles driving erratically or at unsafe speeds, children playing in the street, ice on a bridge, etc.).

In addition to the vehicle hardware 104, the vehicle simulator component(s) 606 may manage the simulation of the vehicle (or other object) using additional hardware, such as a computer—e.g., an X86 box. In some examples, additional processing for virtual sensors of the virtual object may be executed using the vehicle simulation component(s) 606. In such examples, at least some of the processing may be performed by the simulator component(s) 602, and other of the processing may be executed by the vehicle simulator component(s) 606 (or 620, or 622, as described herein). In other examples, the processing of the virtual sensors may be executed entirely on the vehicle simulator component(s) 606.

Now referring to FIG. 6B, FIG. 6B is another example illustration of a simulation system 600B, in accordance with some embodiments of the present disclosure. The simulation system 600B may include the simulator component(s) 602 (as one or more compute nodes), the vehicle simulator component(s) 606 (as one or more compute nodes) for a HIL object(s), the vehicle simulator component(s) 620 (as one or more compute nodes) for a SIL object(s), the vehicle simulator component(s) 606 (as one or more compute nodes) for a PIL object(s), and/or additional component(s) (or compute nodes) for AI objects and/or other object types. Each of the PIL, HIL, SIL, AI, and/or other object type compute nodes may communicate with the simulator component(s) 602 to capture from the global simulation at least data that corresponds to the respective object within the simulate environment 610.

For example, the vehicle simulator component(s) 622 may receive (e.g., retrieve, obtain, etc.), from the global simulation (e.g., represented by the simulated environment 610) hosted by the simulator component(s) 602, data that corresponds to, is associated with, and/or is required by the vehicle simulator component(s) 622 to perform one or more operations by the vehicle simulator component(s) 622 for the PIL object. In such an example, data (e.g., virtual sensor data corresponding to a field(s) of view of virtual camera(s) of the virtual vehicle, virtual LIDAR data, virtual RADAR data, virtual location data, virtual IMU data, etc.) corresponding to each sensor of the PIL object may be received from the simulator component(s) 602. This data may be used to generate an instance of the simulated environment corresponding to the field of view of a remote operator of the virtual vehicle controlled by the remote operator, and the portion of the simulated environment may be projected on a display (e.g., a display of a VR headset, a computer or television display, etc.) for assisting the remote operator in controlling the virtual vehicle through the simulated environment 610. The controls generated or input by the remote operator using the vehicle simulator component(s) 622 may be transmitted to the simulator component(s) 602 for updating a state of the virtual vehicle within the simulated environment 610.

As another example, the vehicle simulator component(s) 620 may receive (e.g., retrieve, obtain, etc.), from the global simulation hosted by the simulator component(s) 602, data that corresponds to, is associated with, and/or is required by the vehicle simulator component(s) 620 to perform one or more operations by the vehicle simulator component(s) 620 for the SIL object. In such an example, data (e.g., virtual sensor data corresponding to a field(s) of view of virtual camera(s) of the virtual vehicle, virtual LIDAR data, virtual RADAR data, virtual location data, virtual IMU data, etc.) corresponding to each sensor of the SIL object may be received from the simulator component(s) 602. This data may be used to generate an instance of the simulated environment for each sensor (e.g., a first instance from a field of view of a first virtual camera of the virtual vehicle, a second instance from a field of view of a second virtual camera, a third instance from a field of view of a virtual LIDAR sensor, etc.). The instances of the simulated environment may thus be used to generate sensor data for each sensor by the vehicle simulator component(s) 620. In some examples, the sensor data may be encoded using one or more codecs (e.g., each sensor may use its own codec, or each sensor type may use its own codec) in order to generate encoded sensor data that may be understood or familiar to an autonomous driving software stack simulated or emulated by the vehicle simulator component(s) 620. For example, a first vehicle manufacturer may use a first type of LIDAR data, a second vehicle manufacturer may use a second type of LIDAR data, etc., and thus the codecs may customize the sensor data to the types of sensor data used by the manufacturers. As a result, the simulation system 600 may be universal, customizable, and/or useable by any number of different sensor types depending on the types of sensors and the corresponding data types used by different manufacturers. In any example, the sensor data and/or encoded sensor data may be used by an autonomous driving software stack to perform one or more operations (e.g., object detection, path planning, control determinations, actuation types, etc.). For example, the sensor data and/or encoded data may be used as inputs to one or more DNNs of the autonomous driving software stack, and the outputs of the one or more DNNs may be used for updating a state of the virtual vehicle within the simulated environment 610. As such, the reliability and efficacy of the autonomous driving software stack, including one or more DNNs, may be tested, fine-tuned, verified, and/or validated within the simulated environment.

In yet another example, the vehicle simulator component(s) 606 may receive (e.g., retrieve, obtain, etc.), from the global simulation hosted by the simulator component(s) 602, data that corresponds to, is associated with, and/or is required by the vehicle simulator component(s) 606 to perform one or more operations by the vehicle simulator component(s) 606 for the HIL object. In such an example, data (e.g., virtual sensor data corresponding to a field(s) of view of virtual camera(s) of the virtual vehicle, virtual LIDAR data, virtual RADAR data, virtual location data, virtual IMU data, etc.) corresponding to each sensor of the HIL object may be received from the simulator component (s) 602. This data may be used to generate an instance of the simulated environment for each sensor (e.g., a first instance from a field of view of a first virtual camera of the virtual vehicle, a second instance from a field of view of a second virtual camera, a third instance from a field of view of a virtual LIDAR sensor, etc.). The instances of the simulated environment may thus be used to generate sensor data for each sensor by the vehicle simulator component(s) 620. In some examples, the sensor data may be encoded using one or more codecs (e.g., each sensor may use its own codec, or each sensor type may use its own codec) in order to generate encoded sensor data that may be understood or familiar to an autonomous driving software stack executing on the vehicle hardware 104 of the vehicle simulator component(s) 620. Similar to the SIL object described herein, the sensor data and/or encoded sensor data may be used by an autonomous driving software stack to perform one or more operations (e.g., object detection, path planning, control determinations, actuation types, etc.).

Now referring to FIG. 6C, FIG. 6C is another example illustration of a simulation system 600C, in accordance with some embodiments of the present disclosure. The simulation system 600C may include distributed shared memory (DSM) system 624, the simulator component(s) 602 (as one or more compute nodes), the vehicle simulator component (s) 606 (as one or more compute nodes) for a HIL object(s), the vehicle simulator component(s) 620 (as one or more compute nodes) for a SIL object(s), the vehicle simulator component(s) 606 (as one or more compute nodes) for a PIL object(s), and/or additional component(s) (or compute nodes) for AI objects and/or other object types (not shown). The simulation system 600C may include any number of HIL objects (e.g., each including its own vehicle simulator component(s) 606), any number of SIL objects (e.g., each including its own vehicle simulator component(s) 620), any number of PIL objects (e.g., each including its own vehicle simulator component(s) 622), and/or any number of AI objects (not shown, but may be hosted by the simulation component(s) 602 and/or separate compute nodes, depending on the embodiment).

The vehicle simulator component(s) 606 may include one or more SoC(s) 804 (or other components) that may be configured for installation and use within a physical vehicle. As such, as described herein, the simulation system 600C may be configured to use the SoC(s) 804 and/or other vehicle hardware 104 by using specific interfaces for communicating with the SoC(s) 804 and/or other vehicle hardware. The vehicle simulator component(s) 620 may include one or more software instances 630 that may be hosted on one or more GPUs and/or CPUs to simulate or emulate the SoC(s) 804. The vehicle simulator component(s) 622 may include one or more SoC(s) 626, one or more CPU(s) 628 (e.g., X86 boxes), and/or a combination thereof, in addition to the component(s) that may be used by the remote operator (e.g., keyboard, mouse, joystick, monitors, VR systems, steering wheel, pedals, in-vehicle components, such as light switches, blinkers, HMI display(s), etc., and/or other component(s)).

The simulation component(s) 602 may include any number of CPU(s) 632 (e.g., X86 boxes), GPU(s), and/or a combination thereof. The CPU(s) 632 may host the simulation software for maintaining the global simulation, and the GPU(s) 634 may be used for rendering, physics, and/or other functionality for generating the simulated environment 610.

As described herein, the simulation system 600C may include the DSM 624. The DSM 624 may use one or more distributed shared memory protocols to maintain the state of the global simulation using the state of each of the objects (e.g., HIL objects, SIL objects, PIL objects, AI objects, etc.). As such, each of the compute nodes corresponding to the vehicle simulator component(s) 606, 620, and/or 622 may be in communication with the simulation component(s) 602 via the DSM 624. By using the DSM 624 and the associated protocols, real-time simulation may be possible. For example, as opposed to how network protocols (e.g., TCP, UDP, etc.) are used in massive multiplayer online (MMO) games, the simulation system 600 may use a distributed shared memory protocol to maintain the state of the global simulation and each instance of the simulation (e.g., by each vehicle, object, and/or sensor) in real-time.

Figure 6D:
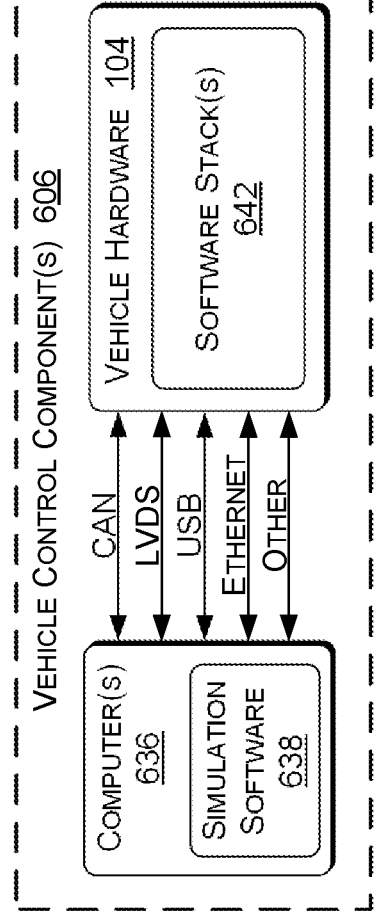

Now referring to FIG. 6D, FIG. 6D is an example illustration of a hardware-in-the-loop configuration, in accordance with some embodiments of the present disclosure. The vehicle simulator component(s) 606 may include the vehicle hardware 104, as described herein, and may include one or more computer(s) 636, one or more GPU(s) (not shown), and/or one or more CPU(s) (not shown). The computer(s) 636, GPU(s), and/or CPU(s) may manage or host the simulation software 638, or instance thereof, executing on the vehicle simulator component(s) 606. The vehicle hardware 104 may execute the software stack(s) 642 (e.g., an autonomous driving software stack, an IX software stack, etc.).

As described herein, by using the vehicle hardware 104, the other vehicle simulator component(s) 606 within the simulation environment 600 may need to be configured for communication with the vehicle hardware 104. For example, because the vehicle hardware 104 may be configured for installation within a physical vehicle (e.g., the vehicle 102), the vehicle hardware 104 may be configured to communicate over one or more connection types and/or communication protocols that are not standard in computing environments (e.g., in server-based platforms, in general-purpose computers, etc.). For example, a CAN interface, LVDS interface, USB interface, Ethernet interface, InfiniBand (IB) interface, and/or other interfaces may be used by the vehicle hardware 104 to communicate signals with other components of the physical vehicle. As such, in the simulation system 600, the vehicle simulator component(s) 606 (and/or other component(s) of the simulation system 600 in addition to, or alternative from, the vehicle simulator component(s) 606) may need to be configured for use with the vehicle hardware 104. In order to accomplish this, one or more CAN interfaces, LVDS interfaces, USB interfaces, Ethernet interfaces, and/or other interface may be used to provide for communication (e.g., over one or more communication protocols, such as LVDS) between vehicle hardware 104 and the other component(s) of the simulation system 600.

In some examples, the virtual vehicle that may correspond to the vehicle simulator component(s) 606 within the simulation system 600 may be modeled as a game object within an instance of a game engine. In addition, each of the virtual sensors of the virtual vehicle may be interfaced using sockets within the virtual vehicle's software stack(s) 642 executed on the vehicle hardware 104. In some examples, each of the virtual sensors of the virtual vehicle may include an instance of the game engine, in addition to the instance of the game engine associated with the simulation software

638 for the virtual vehicle. In examples where the vehicle simulator component(s) 606 include a plurality of GPUs, each of the sensors may be executed on a single GPU. In other examples, multiple sensors may be executed on a single GPU, or at least as many sensors as feasible to ensure real-time generation of the virtual sensor data.

Using HIL objects in the simulator system 600 may provide for a scalable solution that may simulate or emulate various driving conditions for autonomous software and hardware systems (e.g., NVIDIA's DRIVE AGX Pegasus™ compute platform and/or DRIVE PX Xavier™ compute platform). Some benefits of HIL objects may include the ability to test DNNs faster than real-time, the ability to scale verification with computing resources (e.g., rather than vehicles or test tracks), the ability to perform deterministic regression testing (e.g., the real-world environment is never the same twice, but a simulated environment can be), optimal ground truth labeling (e.g., no hand-labeling required), the ability to test scenarios difficult to produce in the real-world, rapid generation of test permutations, and the ability to test a larger space of permutations in simulation as compared to real-world.

Figure 6F:
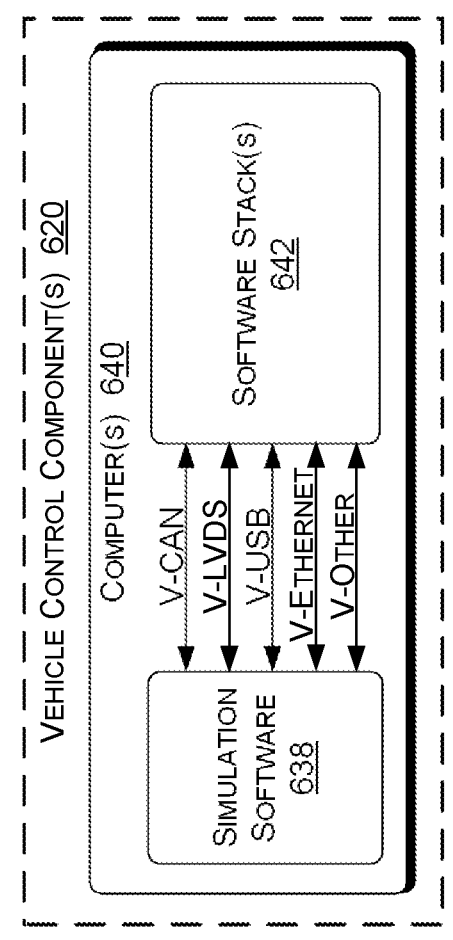
Figure 6E:
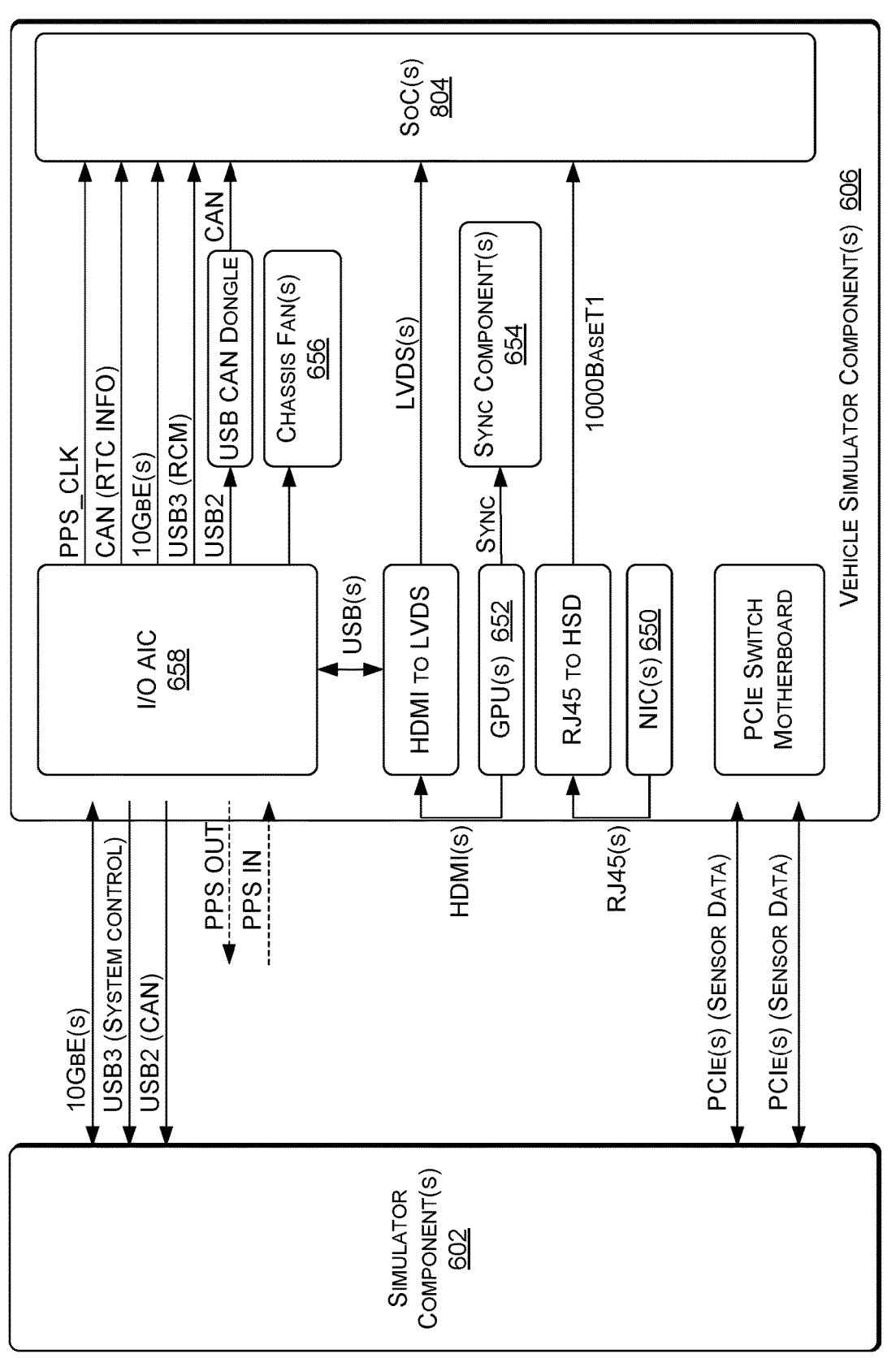

Now referring to FIG. 6E, FIG. 6E is an example illustration of a hardware-in-the-loop configuration, in accordance with some embodiments of the present disclosure. The HIL configuration of FIG. 6E may include vehicle simulator component(s) 606, including the SoC(s) 804, a chassis fan(s) 656 and/or water-cooling system. The HIL configuration may include a two-box solution (e.g., the simulator component(s) 602 in a first box and the vehicle simulator component(s) 606 in a second box). Using this approach may reduce the amount of space the system occupies as well as reduce the number of external cables in data centers (e.g., by including multiple components together with the SoC(s) 804 in the vehicle simulator component(s) 606—e.g., the first box). The vehicle simulator component(s) 606 may include one or more GPUs 652 (e.g., NVIDIA QUADRO GPU(s)) that may provide, in an example, non-limiting embodiment, 8 DP/HDMI video streams that may be synchronized using sync component(s) 654 (e.g., through a QUADRO Sync II Card). These GPU(s) 652 (and/or other GPU types) may provide the sensor input to the SoC(s) 804 (e.g., to the vehicle hardware 104). In some examples, the vehicle simulator component(s) 606 may include a network interface (e.g., one or more network interface cards (NICs) 650) that may simulate or emulate RADAR sensors, LIDAR sensors, and/or IMU sensors (e.g., by providing 8 Gigabit ports with precision time protocol (PTP) support). In addition, the vehicle simulator component(s) 606 may include an input/output (I/O) analog integrated circuit (AIC) 658. Registered Jack (RJ) interfaces (e.g., RJ45), high speed data (HSD) interfaces, USB interfaces, pulse per second (PPS) clocks, Ethernet (e.g., 10 Gb Ethernet (GbE)) interfaces, CAN interfaces, HDMI interfaces, and/or other interface types may be used to effectively transmit and communication data between and among the various component(s) of the system.

Now referring to FIG. 6F, FIG. 6F is an example illustration of a software-in-the-loop configuration, in accordance with some embodiments of the present disclosure. The vehicle simulator component(s) 620 may include computer(s) 640, GPU(s) (not shown), CPU(s) (not shown), and/or other components. The computer(s) 640, GPU(s), and/or CPU(s) may manage or host the simulation software 638, or instance thereof, executing on the vehicle simulator component(s) 620, and may host the software stack(s) 642. For example, the vehicle simulator component(s) 620 may simulate or emulate, using software, the vehicle hardware 104 in an effort to execute the software stack(s) 642 as accurately as possible.

In order to increase accuracy in SIL embodiments, the vehicle simulator component(s) 620 may be configured to communicate over one or more virtual connection types and/or communication protocols that are not standard in computing environments. For example, a virtual CAN interface, virtual LVDS interface, virtual USB interface, virtual Ethernet interface, and/or other virtual interfaces may be used by the computer(s) 640, CPU(s), and/or GPU(s) of the vehicle simulator component(s) 620 to provide for communication (e.g., over one or more communication protocols, such as LVDS) between the software stack(s) 642 and the simulation software 638 within the simulation system 600. For example, the virtual interfaces may include middleware that may be used to provide a continuous feedback loop with the software stack(s) 642. As such, the virtual interfaces may simulate or emulate the communications between the vehicle hardware 104 and the physical vehicle using one or more software protocols, hardware (e.g., CPU(s), GPU(s), computer(s) 640, etc.), or a combination thereof.

The computer(s) 640 in some examples, may include X86 CPU hardware, and one or more X86 CPUs may execute both the simulation software 638 and the software stack(s) 642. In other examples, the computer(s) 640 may include GPU hardware (e.g., an NVIDIA DGX system and/or cloud-based NVIDIA Tesla servers).

In some examples, the virtual vehicle that may correspond to the vehicle simulator component(s) 620 within the simulation system 600 may be modeled as a game object within an instance of a game engine. In addition, each of the virtual sensors of the virtual vehicle may be interfaced using sockets within the virtual vehicle's software stack(s) 642 executed on the vehicle simulator component(s) 620. In some examples, each of the virtual sensors of the virtual vehicle may include an instance of the game engine, in addition to the instance of the game engine associated with the simulation software 638 for the virtual vehicle. In examples where the vehicle simulator component(s) 606 include a plurality of GPUs, each of the sensors may be executed on a single GPU. In other examples, multiple sensors may be executed on a single GPU, or at least as many sensors as feasible to ensure real-time generation of the virtual sensor data.

Figure 7A:
FIG. 7A is an example illustration of a simulation system at runtime, in accordance with some embodiments of the present disclosure.

Now referring to FIG. 7A, FIG. 7A is an example illustration of a simulation system 700 at runtime, in accordance with some embodiments of the present disclosure. Some or all of the components of the simulation system 700 may be used in the simulation system 600, and some or all of the components of the simulation system 600 may be used in the simulation system 700. As such, components, features, and/or functionality described with respect to the simulation system 600 may be associated with the simulation system 700, and vice versa. In addition, each of the simulation systems 700A and 700B (FIG. 7B) may include similar and/or shared components, features, and/or functionality.

The simulation system 700A (e.g., representing one example of simulation system 700) may include the simulator component(s) 602, codec(s) 714, content data store(s) 702, scenario data store(s) 704, vehicle simulator component (s) 620 (e.g., for a SIL object), and vehicle simulator component(s) 606 (e.g., for a HIL object). The content data store(s) 702 may include detailed content information for modeling cars, trucks, people, bicyclists, signs, buildings, trees, curbs, and/or other features of the simulated environment. The scenario data store(s) 704 may include scenario information that may include dangerous scenario information (e.g., that is unsafe to test in the real-world environment), such as a pedestrian in an intersection.

The simulator component(s) 602 may include an AI engine 708 (alternatively referred to herein as an "automated intelligence engine 708") that simulates traffic, pedestrians, weather, and/or other features of the simulated environment using artificial intelligence, automated intelligence, and/or other methods and techniques. Although referred to as an AI engine herein, this is not intended to be limiting, and the AI engine 708 may additionally or alternatively perform functions that are not AI related. The simulator component(s) 602 may include a virtual world manager 710 that manages the world state for the global simulation. The simulator component(s) 602 may further include a virtual sensor manger 712 that may mange the virtual sensors. The AI engine 708 may model traffic similarly to how traffic is modeled in an automotive video game, and may be done using a game engine, as described herein. In other examples, custom AI may be used to provide the determinism and computational level of detail necessary for large-scale reproducible automotive simulation. In some examples, traffic may be modeled using SIL objects, HIL objects, PIL objects, AI objects, and/or combination thereof. The system 700 may create a subclass of an AI controller that examines map data, computes a route, and drives the route while avoiding other cars. The AI controller may compute desired steering, acceleration, and/or braking, and may apply those values to the virtual objects. The vehicle properties used may include mass, max RPM, torque curves, and/or other properties. A physics engine may be used to determine states of AI objects. As described herein, for vehicles or other objects that may be far away and may not have an impact on a current sensor(s), the system may choose not to apply physics for those objects and only determine locations and/or instantaneous motion vectors. Ray-casting may be used for each wheel to ensure that the wheels of the vehicles are in contact. In some examples, traffic AI may operate according to a script (e.g., rules-based traffic). Traffic AI maneuvers for virtual objects may include lateral lane changes (e.g., direction, distance, duration, shape, etc.), longitudinal movement (e.g., matching speed, relative target, delta to target, absolute value), route following, and/or path following. The triggers for the traffic AI maneuvers may be time-based (e.g., three seconds), velocity-based (e.g., at sixty mph), proximity-based to map (e.g., within twenty feet of intersection), proximity-based to actor (e.g., within twenty feet of another object), lane clear, and/or others.

The AI engine 708 may model pedestrian AI similar to traffic AI, described herein, but for pedestrians. The pedestrians may be modeled similar to real pedestrians, and the system 700 may infer pedestrian conduct based on learned behaviors.

The simulator component(s) 602 may be used to adjust the time of day such that streetlights turn on and off, headlights turn on and off, shadows, glares, and/or sunsets are considered, etc. In some examples, only lights within a threshold distance to the virtual object may be considered to increase efficiency.

Weather may be accounted for by the simulator component(s) 602 (e.g., by the virtual world manager 710). The weather may be used to update the coefficients of friction for the driving surfaces, and temperature information may be used to update tire interaction with the driving surfaces. Where rain or snow are present, the system 700 may generate meshes to describe where rainwater and snow may accumulate based on the structure of the scene, and the meshes may be employed when rain or snow are present in the simulation.

In some examples, as described herein, at least some of the simulator component(s) 602 may alternatively be included in the vehicle simulator component(s) 620 and/or 606. For example, the vehicle simulator component(s) 620 and/or the vehicle simulator component(s) 606 may include the virtual sensor manager 712 for managing each of the sensors of the associated virtual object. In addition, one or more of the codecs 714 may be included in the vehicle simulator component(s) 620 and/or the vehicle simulator component(s) 606. In such examples, the virtual sensor manager 712 may generate sensor data corresponding to a sensor of the virtual object, and the sensor data may be used by sensor emulator 716 of the codec(s) 714 to encode the sensor data according to the sensor data format or type used by the software stack(s) 642 (e.g., the software stack(s) 642 executing on the vehicle simulator component(s) 620 and/or the vehicle simulator component(s) 606).

The codec(s) 714 may provide an interface to the software stack(s) 642. The codec(s) 714 (and/or other codec(s) described herein) may include an encoder/decoder framework. The codec(s) 714 may include CAN steering, throttle requests, and/or may be used to send sensor data to the software stack(s) 642 in SIL and HIL embodiments. The codec(s) 714 may be beneficial to the simulation systems described herein (e.g., 600 and 700). For example, as data is produced by the re-simulation systems 100 and the simulation systems 600 and 700, the data may be transmitted to the software stack(s) 642 such that the following standards may be met. The data may be transferred to the software stack(s) 642 such that minimal impact is introduced to the software stack(s) 642 and/or the vehicle hardware 104 (in HIL embodiments). This may result in more accurate simulations as the software stack(s) 642 and/or the vehicle hardware 104 may be operating in an environment that closely resembles deployment in a real-world environment. The data may be transmitted to the software stack(s) 642 such that the simulator and/or re-simulator may be agnostic to the actual hardware configuration of the system under test. This may reduce development overhead due to bugs or separate code paths depending on the simulation configuration. The data may be transmitted to the software stack(s) 642 such that the data may match (e.g., bit-to-bit) the data sent from a physical sensor of a physical vehicle (e.g., the vehicle 102). The data may be transmitted to efficiently in both SIL and HIL embodiments.

The sensor emulator 716 may emulate at least cameras, LIDAR sensors, and/or RADAR sensors. With respect to LIDAR sensors, some LIDAR sensors report tracked objects. As such, for each frame represented by the virtual sensor data, the simulator component(s) 602 may create a list of all tracked objects (e.g., trees, vehicles, pedestrians, foliage, etc.) within range of the virtual object having the virtual LIDAR sensors, and may cast virtual rays toward the tracked objects. When a significant number of rays strike a tracked object, that object may be added to the report of the LIDAR data. In some examples, the LIDAR sensors may be modeled using simple ray-casting without reflection, adjustable field of view, adjustable noise, and/or adjustable dropouts. LIDAR with moving parts, limited fields of view, and/or variable resolutions may be simulated. For example, the LIDAR sensors may be modeled as solid state LIDAR and/or as Optix-based LIDAR. In examples, using Optix-based LIDAR, the rays may bounce from water, reflective materials, and/or windows. Texture may be assigned to roads, signs, and/or vehicles to model laser reflection at the wavelengths corresponding to the textures. RADAR may be implemented similarly to LIDAR. As described herein, RADAR and/or LIDAR may be simulated using ray-tracing techniques.

In some examples, the vehicle simulator component(s) 606, 620, and/or 622 may include a feedback loop with the simulator component(s) 602 (and/or the component(s) that generate the virtual sensor data). The feedback loop may be used to provide information for updating the virtual sensor data capture or generation. For example, for virtual cameras, the feedback loop may be based on sensor feedback, such as changes to exposure responsive to lighting conditions (e.g., increase exposure in dim lighting conditions so that the image data may be processed by the DNNs properly). As another example, for virtual LIDAR sensors, the feedback loop may be representative of changes to energy level (e.g., to boost energy to produce more useable or accurate LIDAR data).

GNNS sensors (e.g., GPS sensors) may be simulated within the simulation space to generate real-world coordinates. In order to this, noise functions may be used to approximate inaccuracy. As with any virtual sensors described herein, the virtual sensor data may be transmitted to the software stack(s) 642 using the codec(s) 714 to be converted to a bit-to-bit correct signal (e.g., corresponding accurately to the signals generated by the physical sensors of the physical vehicles).

One or more plugin application programming interfaces (APIs) 706 may be used. The plugin APIs 706 may include first-party and/or third-party plugins. For example, third parties may customize the simulation system 700B using their own plugin APIs 706 for providing custom information, such as performance timings, suspension dynamics, tire dynamics, etc.

The plugin APIs 706 may include an ego-dynamics component(s) (not shown) that may receive information from the simulator component(s) 602 including position, velocity, car state, and/or other information, and may provide information to the simulator component(s) 602 including performance timings, suspension dynamics, tire dynamics, and/or other information. For examples, the simulator component(s) 602 may provide CAN throttle, steering, and the driving surface information to the ego-dynamics component(s). In some examples, the ego-dynamics component(s) may include an off-the-shelf vehicle dynamics package (e.g., IPG CAR-MAKER or VIRTUAL TEST DRIVE), while in other examples the ego-dynamics component(s) may be customized and/or received (e.g., from a first-party and/or a third-party).

The plugin APIs 706 may include a key performance indicator (KPI) API. The KPI API may receive CAN data, ground truth, and/or virtual object state information (e.g., from the software stack(s) 642) from the simulator component(s) 602 and may generate and/or provide a report (in real-time) that includes KPI's and/or commands to save state, restore state, and/or apply changes.

Figure 7B:
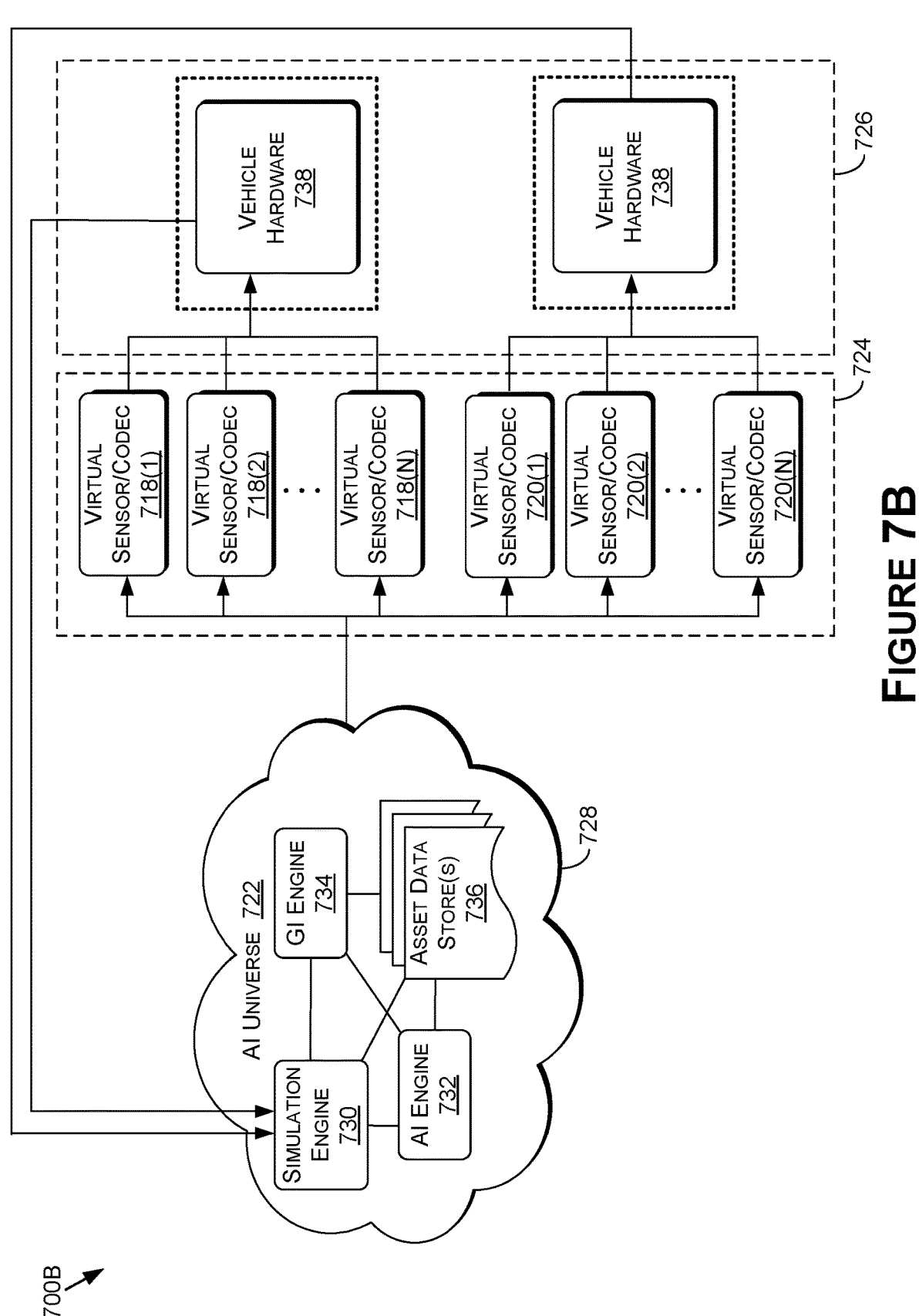
FIG. 7B includes a cloud-based architecture for a simulation system, in accordance with some embodiment of the present disclosure.

Now referring to FIG. 7B, FIG. 7B includes a cloud-based architecture for a simulation system 700B, in accordance with some embodiment of the present disclosure. The simulation system 700B may, at least partly, reside in the cloud and may communicate over one or more networks, such as but not limited to those described herein (e.g., with respect to network 890 of FIG. 8D), with one or more GPU platforms 724 (e.g., that may include GPUs, CPUs, TPUS, and/or other processor types) and/or one or more HIL platforms 726 (e.g., which may include some or all of the components from the vehicle simulator component(s) 606, described herein).

A simulated environment 728 (e.g., which may be similar to the simulated environment 610 described herein) may be modeled by interconnected components including a simulation engine 730, an AI engine 732, a Global Illumination (GI) engine 734, an asset data store(s) 736, and/or other components. In some examples, these component(s) may be used to model a simulated environment (e.g., a virtual world) in a virtualized interactive platform (e.g., similar to a massive multiplayer online (MMO) game environment. The simulated environment may further include physics, traffic simulation, weather simulation, and/or other features and simulations for the simulated environment. GI engine 734 may calculate global illumination in the environment once and share the calculation with each of the nodes 718(1)-718(N) and 720(1)-720(N) (e.g., the calculation of GI may be view independent). The simulated environment 728 may include an AI universe 722 that provides data to GPU platforms 724 (e.g., GPU servers) that may create renderings for each sensor of the vehicle (e.g., at the virtual sensor/codec(s) 718 for a first virtual object and at the virtual sensor codec(s) 720 for a second virtual object). For example, the GPU platform 724 may receive data about the simulated environment 728 and may create sensor inputs for each of 718(1)-718(N), 720(1)-720(N), and/or virtual sensor/codec pairs corresponding to other virtual objects (depending on the embodiment). In examples where the virtual objects are simulated using HIL objects, the sensor inputs may be provided to the vehicle hardware 104 which may use the software stack(s) 642 to perform one or more operations and/or generate one or more commands, such as those described herein. In some examples, as described herein, the virtual sensor data from each of the virtual sensors may be encoded using a codec prior to being used by (or transmitted to) the software stack(s) 642. In addition, in some examples, each of the sensors may be executed on its own GPU within the GPU platform 724, while in other examples, two or more sensors may share the same GPU within the GPU platform 724.

The one or more operations or commands may be transmitted to the simulation engine 730 which may update the behavior of one or more of the virtual objects based on the operations and/or commands. For example, the simulation engine 730 may use the AI engine 732 to update the behavior of the AI agents as well as the virtual objects in the simulated environment 728. The simulation engine 730 may then update the object data and characteristics (e.g., within the asset data store(s) 736), may update the GI (and/or other aspects such as reflections, shadows, etc.), and then may generate and provide updated sensor inputs to the GPU platform 724. This process may repeat until a simulation is completed.

Example Autonomous Vehicle

Figure 8A:
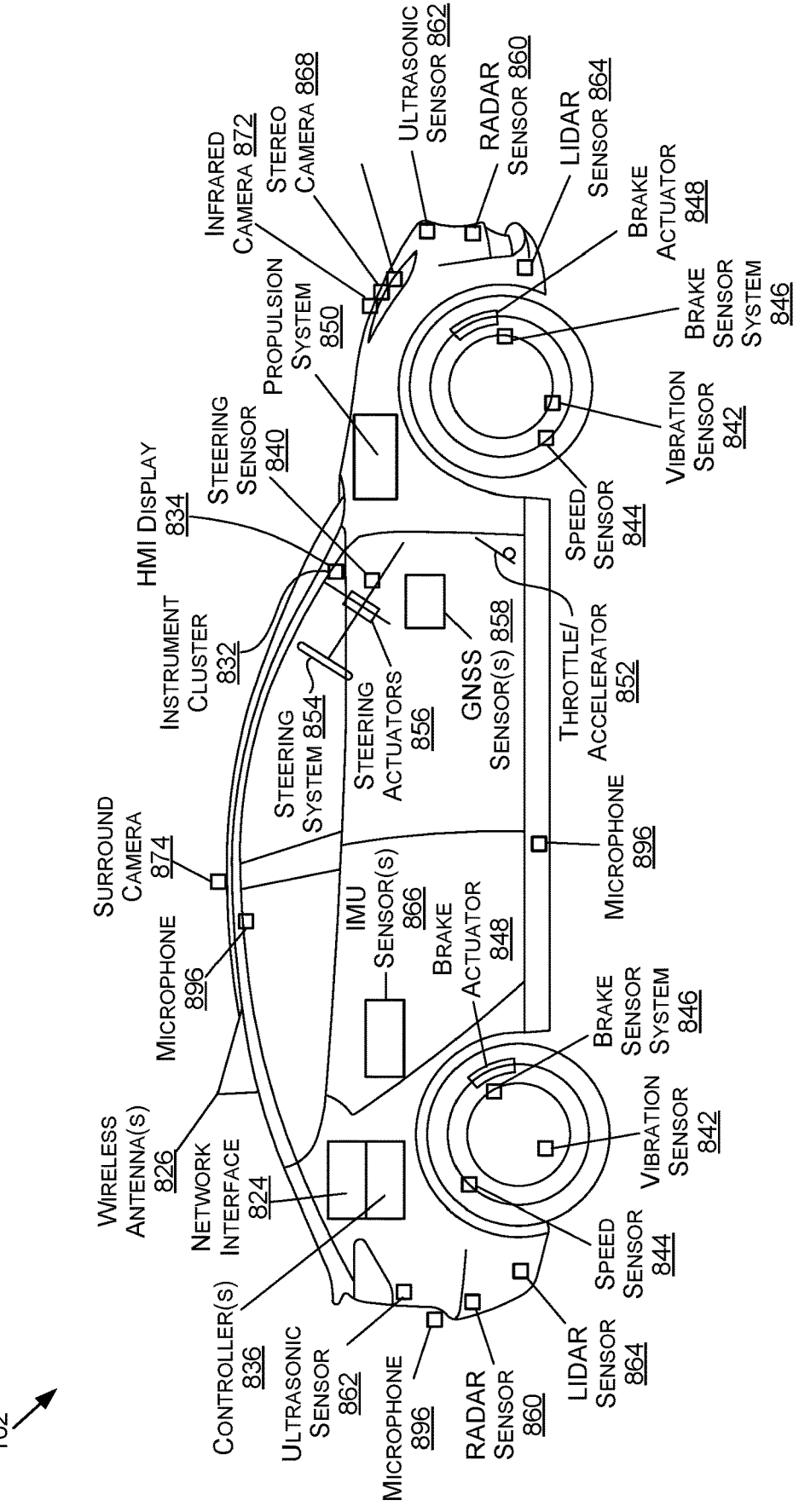
FIG. 8A is an illustration of an example autonomous vehicle, in accordance with some embodiments of the present disclosure.

FIG. 8A is an illustration of an example autonomous vehicle 102, in accordance with some embodiments of the present disclosure. The autonomous vehicle 102 (alternatively referred to herein as the "vehicle 102") may include, without limitation, a passenger vehicle, such as a car, a truck, a bus, a first responder vehicle, a shuttle, an electric or motorized bicycle, a motorcycle, a fire truck, a police vehicle, an ambulance, a boat, a construction vehicle, an underwater craft, a drone, and/or another type of vehicle (e.g., that is unmanned and/or that accommodates one or more passengers). Autonomous vehicles are generally described in terms of automation levels, defined by the National Highway Traffic Safety Administration (NHTSA), a division of the US Department of Transportation, and the Society of Automotive Engineers (SAE) "Taxonomy and Definitions for Terms Related to Driving Automation Systems for On-Road Motor Vehicles" (Standard No. J3016-201806, published on Jun. 15, 2018, Standard No. J3016-201609, published on Sep. 30, 2016, and previous and future versions of this standard). The vehicle 102 may be capable of functionality in accordance with one or more of Level 3-Level 5 of the autonomous driving levels. For example, the vehicle 102 may be capable of conditional automation (Level 3), high automation (Level 4), and/or full automation (Level 5), depending on the embodiment.

The vehicle 102 may include components such as a chassis, a vehicle body, wheels (e.g., 2, 4, 6, 8, 18, etc.), tires, axles, and other components of a vehicle. The vehicle 102 may include a propulsion system 850, such as an internal combustion engine, hybrid electric power plant, an all-electric engine, and/or another propulsion system type. The propulsion system 850 may be connected to a drive train of the vehicle 102, which may include a transmission, to enable the propulsion of the vehicle 102. The propulsion system 850 may be controlled in response to receiving signals from the throttle/accelerator 852.

A steering system 854, which may include a steering wheel, may be used to steer the vehicle 102 (e.g., along a desired path or route) when the propulsion system 850 is operating (e.g., when the vehicle is in motion). The steering system 854 may receive signals from a steering actuator 856. The steering wheel may be optional for full automation (Level 5) functionality.

The brake sensor system 846 may be used to operate the vehicle brakes in response to receiving signals from the brake actuators 848 and/or brake sensors.

Controller(s) 836, which may include one or more system on chips (SoCs) 804 (FIG. 8C) and/or GPU(s), may provide signals (e.g., representative of commands) to one or more components and/or systems of the vehicle 102. For example, the controller(s) may send signals to operate the vehicle brakes via one or more brake actuators 848, to operate the steering system 854 via one or more steering actuators 856, to operate the propulsion system 850 via one or more throttle/accelerators 852. The controller(s) 836 may include one or more onboard (e.g., integrated) computing devices (e.g., supercomputers) that process sensor signals, and output operation commands (e.g., signals representing commands) to enable autonomous driving and/or to assist a human driver in driving the vehicle 102. The controller(s) 836 may include a first controller 836 for autonomous driving functions, a second controller 836 for functional safety functions, a third controller 836 for artificial intelligence functionality (e.g., computer vision), a fourth controller 836 for infotainment functionality, a fifth controller 836 for redundancy in emergency conditions, and/or other controllers. In some examples, a single controller 836 may handle two or more of the above functionalities, two or more controllers 836 may handle a single functionality, and/or any combination thereof.

The controller(s) 836 may provide the signals for controlling one or more components and/or systems of the vehicle 102 in response to sensor data received from one or more sensors (e.g., sensor inputs). The sensor data may be received from, for example and without limitation, global navigation satellite systems sensor(s) 858 (e.g., Global Positioning System sensor(s)), RADAR sensor(s) 860, ultrasonic sensor(s) 862, LIDAR sensor(s) 864, inertial measurement unit (IMU) sensor(s) 866 (e.g., accelerometer(s), gyroscope (s), magnetic compass(es), magnetometer(s), etc.), microphone(s) 896, stereo camera(s) 868, wide-view camera(s) 870 (e.g., fisheye cameras), infrared camera(s) 872, surround camera(s) 874 (e.g., 360 degree cameras), long-range and/or mid-range camera(s) 898, speed sensor(s) 844 (e.g., for measuring the speed of the vehicle 800), vibration sensor(s) 842, steering sensor(s) 840, brake sensor(s) (e.g., as part of the brake sensor system 846), and/or other sensor types.

One or more of the controller(s) 836 may receive inputs (e.g., represented by input data) from an instrument cluster 832 of the vehicle 102 and provide outputs (e.g., represented by output data, display data, etc.) via a human-machine interface (HMI) display 834, an audible annunciator, a loudspeaker, and/or via other components of the vehicle 102. The outputs may include information such as vehicle velocity, speed, time, map data (e.g., the HD map 822 of FIG. 8C), location data (e.g., the vehicle's 102 location, such as on a map), direction, location of other vehicles (e.g., an occupancy grid), information about objects and status of objects as perceived by the controller(s) 836, etc. For example, the HMI display 834 may display information about the presence of one or more objects (e.g., a street sign, caution sign, traffic light changing, etc.), and/or information about driving maneuvers the vehicle has made, is making, or will make (e.g., changing lanes now, taking exit 34B in two miles, etc.).

The vehicle 102 further includes a network interface 824 which may use one or more wireless antenna(s) 826 and/or modem(s) to communicate over one or more networks. For example, the network interface 824 may be capable of communication over LTE, WCDMA, UMTS, GSM, CDMA2000, etc. The wireless antenna(s) 826 may also enable communication between objects in the environment (e.g., vehicles, mobile devices, etc.), using local area network(s), such as Bluetooth, Bluetooth LE, Z-Wave, ZigBee, etc., and/or low power wide-area network(s) (LPWANs), such as LoRaWAN, SigFox, etc.

Figure 8B:
FIG. 8B is an example of camera locations and fields of view for the example autonomous vehicle of FIG. 8A, in accordance with some embodiments of the present disclosure.

FIG. 8B is an example of camera locations and fields of view for the example autonomous vehicle 102 of FIG. 8A, in accordance with some embodiments of the present disclosure. The cameras and respective fields of view are one example embodiment and are not intended to be limiting. For example, additional and/or alternative cameras may be included and/or the cameras may be located at different locations on the vehicle 102.

The camera types for the cameras may include, but are not limited to, digital cameras that may be adapted for use with the components and/or systems of the vehicle 102. The camera(s) may operate at automotive safety integrity level (ASIL) B and/or at another ASIL. The camera types may be capable of any image capture rate, such as 60 frames per second (fps), 820 fps, 240 fps, etc., depending on the embodiment. The cameras may be capable of using rolling shutters, global shutters, another type of shutter, or a combination thereof. In some examples, the color filter array may include a red clear clear clear (RCCC) color filter array, a red clear clear blue (RCCB) color filter array, a red blue green clear (RBGC) color filter array, a Foveon X3 color filter array, a Bayer sensors (RGGB) color filter array, a monochrome sensor color filter array, and/or another type of color filter array. In some embodiments, clear pixel cameras, such as cameras with an RCCC, an RCCB, and/or an RBGC color filter array, may be used in an effort to increase light sensitivity.

In some examples, one or more of the camera(s) may be used to perform advanced driver assistance systems (ADAS) functions (e.g., as part of a redundant or fail-safe design). For example, a Multi-Function Mono Camera may be installed to provide functions including lane departure warning, traffic sign assist and intelligent headlamp control. One or more of the camera(s) (e.g., all of the cameras) may record and provide image data (e.g., video) simultaneously.

One or more of the cameras may be mounted in a mounting assembly, such as a custom designed (3-D printed) assembly, in order to cut out stray light and reflections from within the car (e.g., reflections from the dashboard reflected in the windshield mirrors) which may interfere with the camera's image data capture abilities. With reference to wing-mirror mounting assemblies, the wing-mirror assemblies may be custom 3-D printed so that the camera mounting plate matches the shape of the wing-mirror. In some examples, the camera(s) may be integrated into the wing-mirror. For side-view cameras, the camera(s) may also be integrated within the four pillars at each corner of the cabin.

Cameras with a field of view that include portions of the environment in front of the vehicle 102 (e.g., front-facing cameras) may be used for surround view, to help identify forward facing paths and obstacles, as well aid in, with the help of one or more controllers 836 and/or control SoCs, providing information critical to generating an occupancy grid and/or determining the preferred vehicle paths. Front-facing cameras may be used to perform many of the same ADAS functions as LIDAR, including emergency braking, pedestrian detection, and collision avoidance. Front-facing cameras may also be used for ADAS functions and systems including Lane Departure Warnings ("LDW"), Autonomous Cruise Control ("ACC"), and/or other functions such as traffic sign recognition.

A variety of cameras may be used in a front-facing configuration, including, for example, a monocular camera platform that includes a CMOS (complementary metal oxide semiconductor) color imager. Another example may be a wide-view camera(s) 870 that may be used to perceive objects coming into view from the periphery (e.g., pedestrians, crossing traffic or bicycles). Although only one wide-view camera is illustrated in FIG. 8B, there may any number of wide-view cameras 870 on the vehicle 102. In addition, long-range camera(s) 898 (e.g., a long-view stereo camera pair) may be used for depth-based object detection, especially for objects for which a neural network has not yet been trained. The long-range camera(s) 898 may also be used for object detection and classification, as well as basic object tracking.

One or more stereo cameras 868 may also be included in a front-facing configuration. The stereo camera(s) 868 may include an integrated control unit comprising a scalable processing unit, which may provide a programmable logic (FPGA) and a multi-core micro-processor with an integrated CAN or Ethernet interface on a single chip. Such a unit may be used to generate a 3-D map of the vehicle's environment, including a distance estimate for all the points in the image. An alternative stereo camera(s) 868 may include a compact stereo vision sensor(s) that may include two camera lenses (one each on the left and right) and an image processing chip that may measure the distance from the vehicle to the target object and use the generated information (e.g., metadata) to activate the autonomous emergency braking and lane departure warning functions. Other types of stereo camera(s) 868 may be used in addition to, or alternatively from, those described herein.

Cameras with a field of view that include portions of the environment to the side of the vehicle 102 (e.g., side-view cameras) may be used for surround view, providing information used to create and update the occupancy grid, as well as to generate side impact collision warnings. For example, surround camera(s) 874 (e.g., four surround cameras 874 as illustrated in FIG. 8B) may be positioned to on the vehicle 102. The surround camera(s) 874 may include wide-view camera(s) 870, fisheye camera(s), 360 degree camera(s), and/or the like. Four example, four fisheye cameras may be positioned on the vehicle's front, rear, and sides. In an alternative arrangement, the vehicle may use three surround camera(s) 874 (e.g., left, right, and rear), and may leverage one or more other camera(s) (e.g., a forward-facing camera) as a fourth surround view camera.

Cameras with a field of view that include portions of the environment to the rear of the vehicle 102 (e.g., rear-view cameras) may be used for park assistance, surround view, rear collision warnings, and creating and updating the occupancy grid. A wide variety of cameras may be used including, but not limited to, cameras that are also suitable as a front-facing camera(s) (e.g., long-range and/or mid-range camera(s) 898, stereo camera(s) 868), infrared camera(s) 872, etc.), as described herein.

Figure 8C:
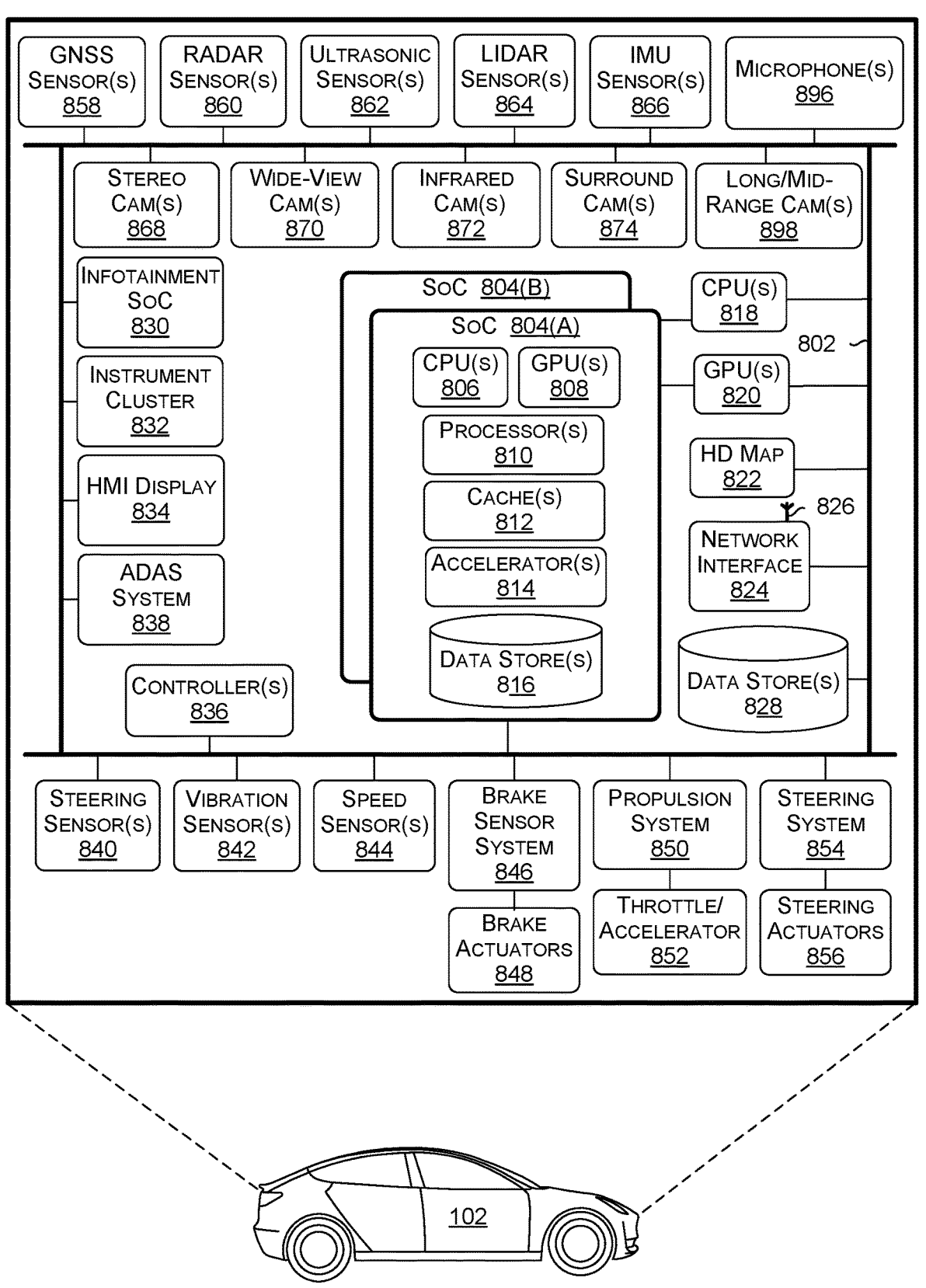
FIG. 8C is a block diagram of an example system architecture for the example autonomous vehicle of FIG. 8A, in accordance with some embodiments of the present disclosure.

FIG. 8C is a block diagram of an example system architecture for the example autonomous vehicle 102 of FIG. 8A, in accordance with some embodiments of the present disclosure. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory.

Each of the components, features, and systems of the vehicle 102 in FIG. 8C are illustrated as being connected via bus 802. The bus 802 may include a Controller Area Network (CAN) data interface (alternatively referred to herein as a "CAN bus"). A CAN may be a network inside the vehicle 102 used to aid in control of various features and functionality of the vehicle 102, such as actuation of brakes, acceleration, braking, steering, windshield wipers, etc. A CAN bus may be configured to have dozens or even hundreds of nodes, each with its own unique identifier (e.g., a CAN ID). The CAN bus may be read to find steering wheel angle, ground speed, engine revolutions per minute (RPMs), button positions, and/or other vehicle status indicators. The CAN bus may be ASIL B compliant.

Although the bus 802 is described herein as being a CAN bus, this is not intended to be limiting. For example, in addition to, or alternatively from, the CAN bus, FlexRay and/or Ethernet may be used. Additionally, although a single line is used to represent the bus 802, this is not intended to be limiting. For example, there may be any number of busses 802, which may include one or more CAN busses, one or more FlexRay busses, one or more Ethernet busses, and/or one or more other types of busses using a different protocol. In some examples, two or more busses 802 may be used to perform different functions, and/or may be used for redundancy. For example, a first bus 802 may be used for collision avoidance functionality and a second bus 802 may be used for actuation control. In any example, each bus 802 may communicate with any of the components of the vehicle 102, and two or more busses 802 may communicate with the same components. In some examples, each SoC 804, each controller 836, and/or each computer within the vehicle may have access to the same input data (e.g., inputs from sensors of the vehicle 102), and may be connected to a common bus, such the CAN bus.

The vehicle 102 may include one or more controller(s) 836, such as those described herein with respect to FIG. 8A. The controller(s) 836 may be used for a variety of functions. The controller(s) 836 may be coupled to any of the various other components and systems of the vehicle 102, and may be used for control of the vehicle 102, artificial intelligence of the vehicle 102, infotainment for the vehicle 102, and/or the like.

The vehicle 102 may include a system(s) on a chip (SoC) 804. The SoC 804 may include CPU(s) 806, GPU(s) 808, processor(s) 810, cache(s) 812, accelerator(s) 814, data store(s) 816, and/or other components and features not illustrated. The SoC(s) 804 may be used to control the vehicle 102 in a variety of platforms and systems. For example, the SoC(s) 804 may be combined in a system (e.g., the system of the vehicle 102) with an HD map 822 which may obtain map refreshes and/or updates via a network interface 824 from one or more servers (e.g., server(s) 878 of FIG. 8D).

The CPU(s) 806 may include a CPU cluster or CPU complex (alternatively referred to herein as a "CCPLEX"). The CPU(s) 806 may include multiple cores and/or L2 caches. For example, in some embodiments, the CPU(s) 806 may include eight cores in a coherent multi-processor configuration. In some embodiments, the CPU(s) 806 may include four dual-core clusters where each cluster has a dedicated L2 cache (e.g., a 2 MB L2 cache). The CPU(s) 806 (e.g., the CCPLEX) may be configured to support simultaneous cluster operation enabling any combination of the clusters of the CPU(s) 806 to be active at any given time.

The CPU(s) 806 may implement power management capabilities that include one or more of the following features: individual hardware blocks may be clock-gated automatically when idle to save dynamic power; each core clock may be gated when the core is not actively executing instructions due to execution of WFI/WFE instructions; each core may be independently power-gated; each core cluster may be independently clock-gated when all cores are clock-gated or power-gated; and/or each core cluster may be independently power-gated when all cores are power-gated. The CPU(s) 806 may further implement an enhanced algorithm for managing power states, where allowed power states and expected wakeup times are specified, and the hardware/microcode determines the best power state to enter for the core, cluster, and CCPLEX. The processing cores may support simplified power state entry sequences in software with the work offloaded to microcode.

The GPU(s) 808 may include an integrated GPU (alternatively referred to herein as an "iGPU"). The GPU(s) 808 may be programmable and may be efficient for parallel workloads. The GPU(s) 808, in some examples, may use an enhanced tensor instruction set. The GPU(s) 808 may include one or more streaming microprocessors, where each streaming microprocessor may include an L1 cache (e.g., an L1 cache with at least 96 KB storage capacity), and two or more of the streaming microprocessors may share an L2 cache (e.g., an L2 cache with a 512 KB storage capacity). In some embodiments, the GPU(s) 808 may include at least eight streaming microprocessors. The GPU(s) 808 may use compute application programming interface(s) (API(s)). In addition, the GPU(s) 808 may use one or more parallel computing platforms and/or programming models (e.g., NVIDIA's CUDA).

The GPU(s) 808 may be power-optimized for best performance in automotive and embedded use cases. For example, the GPU(s) 808 may be fabricated on a Fin field-effect transistor (FinFET). However, this is not intended to be limiting and the GPU(s) 808 may be fabricated using other semiconductor manufacturing processes. Each streaming microprocessor may incorporate a number of mixed-precision processing cores partitioned into multiple blocks. For example, and without limitation, 64 PF32 cores and 32 PF64 cores may be partitioned into four processing blocks. In such an example, each processing block may be allocated 16 FP32 cores, 8 FP64 cores, 16 INT32 cores, two mixed-precision NVIDIA TENSOR COREs for deep learning matrix arithmetic, an L0 instruction cache, a warp scheduler, a dispatch unit, and/or a 64 KB register file. In addition, the streaming microprocessors may include independent parallel integer and floating-point data paths to provide for efficient execution of workloads with a mix of computation and addressing calculations. The streaming microprocessors may include independent thread scheduling capability to enable finer-grain synchronization and cooperation between parallel threads. The streaming microprocessors may include a combined L1 data cache and shared memory unit in order to improve performance while simplifying programming.

The GPU(s) 808 may include a high bandwidth memory (HBM) and/or a 16 GB HBM2 memory subsystem to provide, in some examples, about 900 GB/second peak memory bandwidth. In some examples, in addition to, or alternatively from, the HBM memory, a synchronous graphics random-access memory (SGRAM) may be used, such as a graphics double data rate type five synchronous random-access memory (GDDR5).

The GPU(s) 808 may include unified memory technology including access counters to allow for more accurate migration of memory pages to the processor that accesses them most frequently, thereby improving efficiency for memory ranges shared between processors. In some examples, address translation services (ATS) support may be used to allow the GPU(s) 808 to access the CPU(s) 806 page tables directly. In such examples, when the GPU(s) 808 memory management unit (MMU) experiences a miss, an address translation request may be transmitted to the CPU(s) 806. In response, the CPU(s) 806 may look in its page tables for the virtual-to-physical mapping for the address and transmits the translation back to the GPU(s) 808. As such, unified memory technology may allow a single unified virtual address space for memory of both the CPU(s) 806 and the GPU(s) 808, thereby simplifying the GPU(s) 808 programming and porting of applications to the GPU(s) 808.

In addition, the GPU(s) 808 may include an access counter that may keep track of the frequency of access of the GPU(s) 808 to memory of other processors. The access counter may help ensure that memory pages are moved to the physical memory of the processor that is accessing the pages most frequently.

The SoC(s) 804 may include any number of cache(s) 812, including those described herein. For example, the cache(s) 812 may include an L3 cache that is available to both the CPU(s) 806 and the GPU(s) 808 (e.g., that is connected both the CPU(s) 806 and the GPU(s) 808). The cache(s) 812 may include a write-back cache that may keep track of states of lines, such as by using a cache coherence protocol (e.g., MEI, MESI, MSI, etc.). The L3 cache may include 4 MB or more, depending on the embodiment, although smaller cache sizes may be used.

The SoC(s) 804 may include an arithmetic logic unit(s) (ALU(s)) which may be leveraged in performing processing with respect to any of the variety of tasks or operations of the vehicle 102—such as processing DNNs. In addition, the SoC(s) 804 may include a floating point unit(s) (FPU(s))— or other math coprocessor or numeric coprocessor types— for performing mathematical operations within the system. For example, the SoC(s) 104 may include one or more FPUs integrated as execution units within a CPU(s) 806 and/or GPU(s) 808.

The SoC(s) 804 may include one or more accelerators 814 (e.g., hardware accelerators, software accelerators, or a combination thereof). For example, the SoC(s) 804 may include a hardware acceleration cluster that may include optimized hardware accelerators and/or large on-chip memory. The large on-chip memory (e.g., 4 MB of SRAM), may enable the hardware acceleration cluster to accelerate neural networks and other calculations. The hardware acceleration cluster may be used to complement the GPU(s) 808 and to off-load some of the tasks of the GPU(s) 808 (e.g., to free up more cycles of the GPU(s) 808 for performing other tasks). As an example, the accelerator(s) 814 may be used for targeted workloads (e.g., perception, convolutional neural networks (CNNs), etc.) that are stable enough to be amenable to acceleration. The term "CNN," as used herein, may include all types of CNNs, including region-based or regional convolutional neural networks (RCNNs) and Fast RCNNs (e.g., as used for object detection).

The accelerator(s) 814 (e.g., the hardware acceleration cluster) may include a deep learning accelerator(s) (DLA). The DLA(s) may include one or more Tensor processing units (TPUs) that may be configured to provide an additional ten trillion operations per second for deep learning applications and inferencing. The TPUs may be accelerators configured to, and optimized for, performing image processing functions (e.g., for CNNs, RCNNs, etc.). The DLA(s) may further be optimized for a specific set of neural network types and floating point operations, as well as inferencing. The design of the DLA(s) may provide more performance per millimeter than a general-purpose GPU, and vastly exceeds the performance of a CPU. The TPU(s) may perform several functions, including a single-instance convolution function, supporting, for example, INT8, INT16, and FP16 data types for both features and weights, as well as post-processor functions.

The DLA(s) may quickly and efficiently execute neural networks, especially CNNs, on processed or unprocessed data for any of a variety of functions, including, for example and without limitation: a CNN for object identification and detection using data from camera sensors; a CNN for distance estimation using data from camera sensors; a CNN for emergency vehicle detection and identification and detection using data from microphones; a CNN for facial recognition and vehicle owner identification using data from camera sensors; and/or a CNN for security and/or safety related events.

The DLA(s) may perform any function of the GPU(s) 808, and by using an inference accelerator, for example, a designer may target either the DLA(s) or the GPU(s) 808 for any function. For example, the designer may focus processing of CNNs and floating point operations on the DLA(s) and leave other functions to the GPU(s) 808 and/or other accelerator(s) 814.

The accelerator(s) 814 (e.g., the hardware acceleration cluster) may include a programmable vision accelerator(s) (PVA), which may alternatively be referred to herein as a computer vision accelerator. The PVA(s) may be designed and configured to accelerate computer vision algorithms for the advanced driver assistance systems (ADAS), autonomous driving, and/or augmented reality (AR) and/or virtual reality (VR) applications. The PVA(s) may provide a balance between performance and flexibility. For example, each PVA(s) may include, for example and without limitation, any number of reduced instruction set computer (RISC) cores, direct memory access (DMA), and/or any number of vector processors.

The RISC cores may interact with image sensors (e.g., the image sensors of any of the cameras described herein), image signal processor(s), and/or the like. Each of the RISC cores may include any amount of memory. The RISC cores may use any of a number of protocols, depending on the embodiment. In some examples, the RISC cores may execute a real-time operating system (RTOS). The RISC cores may be implemented using one or more integrated circuit devices, application specific integrated circuits (ASICs), and/or memory devices. For example, the RISC cores may include an instruction cache and/or a tightly coupled RAM.

The DMA may enable components of the PVA(s) to access the system memory independently of the CPU(s) 806. The DMA may support any number of features used to provide optimization to the PVA including, but not limited to, supporting multi-dimensional addressing and/or circular addressing. In some examples, the DMA may support up to six or more dimensions of addressing, which may include block width, block height, block depth, horizontal block stepping, vertical block stepping, and/or depth stepping.

The vector processors may be programmable processors that may be designed to efficiently and flexibly execute programming for computer vision algorithms and provide signal processing capabilities. In some examples, the PVA may include a PVA core and two vector processing subsystem partitions. The PVA core may include a processor subsystem, DMA engine(s) (e.g., two DMA engines), and/or other peripherals. The vector processing subsystem may operate as the primary processing engine of the PVA, and may include a vector processing unit (VPU), an instruction cache, and/or vector memory (e.g., VMEM). A VPU core may include a digital signal processor such as, for example, a single instruction, multiple data (SIMD), very long instruction word (VLIW) digital signal processor. The combination of the SIMD and VLIW may enhance throughput and speed.

Each of the vector processors may include an instruction cache and may be coupled to dedicated memory. As a result, in some examples, each of the vector processors may be configured to execute independently of the other vector processors. In other examples, the vector processors that are included in a particular PVA may be configured to employ data parallelism. For example, in some embodiments, the plurality of vector processors included in a single PVA may execute the same computer vision algorithm, but on different regions of an image. In other examples, the vector processors included in a particular PVA may simultaneously execute different computer vision algorithms, on the same image, or even execute different algorithms on sequential images or portions of an image. Among other things, any number of PVAs may be included in the hardware acceleration cluster and any number of vector processors may be included in each of the PVAs. In addition, the PVA(s) may include additional error correcting code (ECC) memory, to enhance overall system safety.

The accelerator(s) 814 (e.g., the hardware acceleration cluster) may include a computer vision network on-chip and SRAM, for providing a high-bandwidth, low latency SRAM for the accelerator(s) 814. In some examples, the on-chip memory may include at least 4 MB SRAM, consisting of, for example and without limitation, eight field-configurable memory blocks, that may be accessible by both the PVA and the DLA. Each pair of memory blocks may include an advanced peripheral bus (APB) interface, configuration circuitry, a controller, and a multiplexer. Any type of memory may be used. The PVA and DLA may access the memory via a backbone that provides the PVA and DLA with high-speed access to memory. The backbone may include a computer vision network on-chip that interconnects the PVA and the DLA to the memory (e.g., using the APB).

The computer vision network on-chip may include an interface that determines, before transmission of any control signal/address/data, that both the PVA and the DLA provide ready and valid signals. Such an interface may provide for separate phases and separate channels for transmitting control signals/addresses/data, as well as burst-type communications for continuous data transfer. This type of interface may comply with ISO 26262 or IEC 61508 standards, although other standards and protocols may be used.

In some examples, the SoC(s) 804 may include a real-time ray-tracing hardware accelerator, such as described in U.S. patent application Ser. No. 16/101,232, filed on Aug. 10, 2018. The real-time ray-tracing hardware accelerator may be used to quickly and efficiently determine the positions and extents of objects (e.g., within a world model), to generate real-time visualization simulations, for RADAR signal interpretation, for sound propagation synthesis and/or analysis, for simulation of SONAR systems, for general wave propagation simulation, for comparison to LIDAR data for purposes of localization and/or other functions, and/or for other uses. In some embodiments, one or more tree traversal units (TTUs) may be used for executing one or more ray-tracing related operations.

The accelerator(s) 814 (e.g., the hardware accelerator cluster) have a wide array of uses for autonomous driving. The PVA may be a programmable vision accelerator that may be used for key processing stages in ADAS and autonomous vehicles. The PVA's capabilities are a good match for algorithmic domains needing predictable processing, at low power and low latency. In other words, the PVA performs well on semi-dense or dense regular computation, even on small data sets, which need predictable run-times with low latency and low power. Thus, in the context of platforms for autonomous vehicles, the PVAs are designed to run classic computer vision algorithms, as they are efficient at object detection and operating on integer math.

For example, according to one embodiment of the technology, the PVA is used to perform computer stereo vision. A semi-global matching-based algorithm may be used in some examples, although this is not intended to be limiting. Many applications for Level 3-5 autonomous driving require motion estimation/stereo matching on-the-fly (e.g., structure from motion, pedestrian recognition, lane detection, etc.). The PVA may perform computer stereo vision function on inputs from two monocular cameras.

In some examples, the PVA may be used to perform dense optical flow. According to process raw RADAR data (e.g., using a 4D Fast Fourier Transform) to provide Processed RADAR. In other examples, the PVA is used for time of flight depth processing, by processing raw time of flight data to provide processed time of flight data, for example.

The DLA may be used to run any type of network to enhance control and driving safety, including for example, a neural network that outputs a measure of confidence for each object detection. Such a confidence value may be interpreted as a probability, or as providing a relative "weight" of each detection compared to other detections. This confidence value enables the system to make further decisions regarding which detections should be considered as true positive detections rather than false positive detections. For example, the system may set a threshold value for the confidence and consider only the detections exceeding the threshold value as true positive detections. In an automatic emergency braking (AEB) system, false positive detections would cause the vehicle to automatically perform emergency braking, which is obviously undesirable. Therefore, only the most confident detections should be considered as triggers for AEB. The DLA may run a neural network for regressing the confidence value. The neural network may take as its input at least some subset of parameters, such as bounding box dimensions, ground plane estimate obtained (e.g. from another subsystem), inertial measurement unit (IMU) sensor 866 output that correlates with the vehicle 102 orientation, distance, 3D location estimates of the object obtained from the neural network and/or other sensors (e.g., LIDAR sensor(s) 864 or RADAR sensor(s) 860), among others.

The SoC(s) 804 may include data store(s) 816 (e.g., memory). The data store(s) 816 may be on-chip memory of the SoC(s) 804, which may store neural networks to be executed on the GPU and/or the DLA. In some examples, the data store(s) 816 may be large enough in capacity to store multiple instances of neural networks for redundancy and safety. The data store(s) 812 may comprise L2 or L3 cache(s) 812. Reference to the data store(s) 816 may include reference to the memory associated with the PVA, DLA, and/or other accelerator(s) 814, as described herein.

The SoC(s) 804 may include one or more processor(s) 810 (e.g., embedded processors). The processor(s) 810 may include a boot and power management processor that may be a dedicated processor and subsystem to handle boot power and management functions and related security enforcement. The boot and power management processor may be a part of the SoC(s) 804 boot sequence and may provide runtime power management services. The boot power and management processor may provide clock and voltage programming, assistance in system low power state transitions, management of SoC(s) 804 thermals and temperature sensors, and/or management of the SoC(s) 804 power states. Each temperature sensor may be implemented as a ring-oscillator whose output frequency is proportional to temperature, and the SoC(s) 804 may use the ring-oscillators to detect temperatures of the CPU(s) 806, GPU(s) 808, and/or accelerator(s) 814. If temperatures are determined to exceed a threshold, the boot and power management processor may enter a temperature fault routine and put the SoC(s) 804 into a lower power state and/or put the vehicle 102 into a chauffeur to safe stop mode (e.g., bring the vehicle 102 to a safe stop).

The processor(s) 810 may further include a set of embedded processors that may serve as an audio processing engine. The audio processing engine may be an audio subsystem that enables full hardware support for multi-channel audio over multiple interfaces, and a broad and flexible range of audio I/O interfaces. In some examples, the audio processing engine is a dedicated processor core with a digital signal processor with dedicated RAM.

The processor(s) 810 may further include an always on processor engine that may provide necessary hardware features to support low power sensor management and wake use cases. The always on processor engine may include a processor core, a tightly coupled RAM, supporting peripherals (e.g., timers and interrupt controllers), various I/O controller peripherals, and routing logic.

The processor(s) 810 may further include a safety cluster engine that includes a dedicated processor subsystem to handle safety management for automotive applications. The safety cluster engine may include two or more processor cores, a tightly coupled RAM, support peripherals (e.g., timers, an interrupt controller, etc.), and/or routing logic. In a safety mode, the two or more cores may operate in a lockstep mode and function as a single core with comparison logic to detect any differences between their operations.

The processor(s) 810 may further include a real-time camera engine that may include a dedicated processor subsystem for handling real-time camera management.

The processor(s) 810 may further include a high-dynamic range signal processor that may include an image signal processor that is a hardware engine that is part of the camera processing pipeline.

The processor(s) 810 may include a video image compositor that may be a processing block (e.g., implemented on a microprocessor) that implements video post-processing functions needed by a video playback application to produce the final image for the player window. The video image compositor may perform lens distortion correction on wide-view camera(s) 870, surround camera(s) 874, and/or on in-cabin monitoring camera sensors. In-cabin monitoring camera sensor is preferably monitored by a neural network running on another instance of the Advanced SoC, configured to identify in cabin events and respond accordingly. An in-cabin system may perform lip reading to activate cellular service and place a phone call, dictate emails, change the vehicle's destination, activate or change the vehicle's infotainment system and settings, or provide voice-activated web surfing. Certain functions are available to the driver only when the vehicle is operating in an autonomous mode, and are disabled otherwise.

The video image compositor may include enhanced temporal noise reduction for both spatial and temporal noise reduction. For example, where motion occurs in a video, the noise reduction weights spatial information appropriately, decreasing the weight of information provided by adjacent frames. Where an image or portion of an image does not include motion, the temporal noise reduction performed by the video image compositor may use information from the previous image to reduce noise in the current image.

The video image compositor may also be configured to perform stereo rectification on input stereo lens frames. The video image compositor may further be used for user interface composition when the operating system desktop is in use, and the GPU(s) 808 is not required to continuously render new surfaces. Even when the GPU(s) 808 is powered on and active doing 3D rendering, the video image compositor may be used to offload the GPU(s) 808 to improve performance and responsiveness.

The SoC(s) 804 may further include a mobile industry processor interface (MIPI) camera serial interface for receiving video and input from cameras, a high-speed interface, and/or a video input block that may be used for camera and related pixel input functions. The SoC(s) 804 may further include an input/output controller(s) that may be controlled by software and may be used for receiving I/O signals that are uncommitted to a specific role.

The SoC(s) 804 may further include a broad range of peripheral interfaces to enable communication with peripherals, audio codecs, power management, and/or other devices. The SoC(s) 804 may be used to process data from cameras (e.g., connected over Gigabit Multimedia Serial Link and Ethernet), sensors (e.g., LIDAR sensor(s) 864, RADAR sensor(s) 860, etc. that may be connected over Ethernet), data from bus 802 (e.g., speed of vehicle 102, steering wheel position, etc.), data from GNSS sensor(s) 858 (e.g., connected over Ethernet or CAN bus). The SoC(s) 804 may further include dedicated high-performance mass storage controllers that may include their own DMA engines, and that may be used to free the CPU(s) 806 from routine data management tasks.

The SoC(s) 804 may be an end-to-end platform with a flexible architecture that spans automation levels 3-5, thereby providing a comprehensive functional safety architecture that leverages and makes efficient use of computer vision and ADAS techniques for diversity and redundancy, provides a platform for a flexible, reliable driving software stack, along with deep learning tools. The SoC(s) 804 may be faster, more reliable, and even more energy-efficient and space-efficient than conventional systems. For example, the accelerator(s) 814, when combined with the CPU(s) 806, the GPU(s) 808, and the data store(s) 816, may provide for a fast, efficient platform for level 3-5 autonomous vehicles.

The technology thus provides capabilities and functionality that cannot be achieved by conventional systems. For example, computer vision algorithms may be executed on CPUs, which may be configured using high-level programming language, such as the C programming language, to execute a wide variety of processing algorithms across a wide variety of visual data. However, CPUs are oftentimes unable to meet the performance requirements of many computer vision applications, such as those related to execution time and power consumption, for example. In particular, many CPUs are unable to execute complex object detection algorithms in real-time, which is a requirement of in-vehicle ADAS applications, and a requirement for practical Level 3-5 autonomous vehicles.

In contrast to conventional systems, by providing a CPU complex, GPU complex, and a hardware acceleration cluster, the technology described herein allows for multiple neural networks to be performed simultaneously and/or sequentially, and for the results to be combined together to enable Level 3-5 autonomous driving functionality. For example, a CNN executing on the DLA or dGPU (e.g., the GPU(s) 820) may include a text and word recognition, allowing the supercomputer to read and understand traffic signs, including signs for which the neural network has not been specifically trained. The DLA may further include a neural network that is able to identify, interpret, and provides semantic understanding of the sign, and to pass that semantic understanding to the path planning modules running on the CPU Complex.

As another example, multiple neural networks may be run simultaneously, as is required for Level 3, 4, or 5 driving. For example, a warning sign consisting of "Caution: flashing lights indicate icy conditions," along with an electric light, may be independently or collectively interpreted by several neural networks. The sign itself may be identified as a traffic sign by a first deployed neural network (e.g., a neural network that has been trained), the text "Flashing lights indicate icy conditions" may be interpreted by a second deployed neural network, which informs the vehicle's path planning software (preferably executing on the CPU Complex) that when flashing lights are detected, icy conditions exist. The flashing light may be identified by operating a third deployed neural network over multiple frames, informing the vehicle's path-planning software of the presence (or absence) of flashing lights. All three neural networks may run simultaneously, such as within the DLA and/or on the GPU(s) 808.

In some examples, a CNN for facial recognition and vehicle owner identification may use data from camera sensors to identify the presence of an authorized driver and/or owner of the vehicle 102. The always on sensor processing engine may be used to unlock the vehicle when the owner approaches the driver door and turn on the lights, and, in security mode, to disable the vehicle when the owner leaves the vehicle. In this way, the SoC(s) 804 provide for security against theft and/or carjacking.

In another example, a CNN for emergency vehicle detection and identification may use data from microphones 896 to detect and identify emergency vehicle sirens. In contrast to conventional systems, that use general classifiers to detect sirens and manually extract features, the SoC(s) 804 use the CNN for classifying environmental and urban sounds, as well as classifying visual data. In a preferred embodiment, the CNN running on the DLA is trained to identify the relative closing speed of the emergency vehicle (e.g., by using the Doppler Effect). The CNN may also be trained to identify emergency vehicles specific to the local area in which the vehicle is operating, as identified by GNSS sensor(s) 858. Thus, for example, when operating in Europe the CNN will seek to detect European sirens, and when in the United States the CNN will seek to identify only North American sirens. Once an emergency vehicle is detected, a control program may be used to execute an emergency vehicle safety routine, slowing the vehicle, pulling over to the side of the road, parking the vehicle, and/or idling the vehicle, with the assistance of ultrasonic sensors 862, until the emergency vehicle(s) passes.

The vehicle may include a CPU(s) 818 (e.g., discrete CPU(s), or dCPU(s)), that may be coupled to the SoC(s) 804 via a high-speed interconnect (e.g., PCIe). The CPU(s) 818 may include an X86 processor, for example. The CPU(s) 818 may be used to perform any of a variety of functions, including arbitrating potentially inconsistent results between ADAS sensors and the SoC(s) 804, and/or monitoring the status and health of the controller(s) 836 and/or infotainment SoC 830, for example.

The vehicle 102 may include a GPU(s) 820 (e.g., discrete GPU(s), or dGPU(s)), that may be coupled to the SoC(s) 804 via a high-speed interconnect (e.g., NVIDIA's NVLINK). The GPU(s) 820 may provide additional artificial intelligence functionality, such as by executing redundant and/or different neural networks, and may be used to train and/or update neural networks based on input (e.g., sensor data) from sensors of the vehicle 102.

The vehicle 102 may further include the network interface 824 which may include one or more wireless antennas 826 (e.g., one or more wireless antennas for different communication protocols, such as a cellular antenna, a Bluetooth antenna, etc.). The network interface 824 may be used to enable wireless connectivity over the Internet with the cloud (e.g., with the server(s) 878 and/or other network devices), with other vehicles, and/or with computing devices (e.g., client devices of passengers). To communicate with other vehicles, a direct link may be established between the two vehicles and/or an indirect link may be established (e.g., across networks and over the Internet). Direct links may be provided using a vehicle-to-vehicle communication link. The vehicle-to-vehicle communication link may provide the vehicle 102 information about vehicles in proximity to the vehicle 102 (e.g., vehicles in front of, on the side of, and/or behind the vehicle 102). This functionality may be part of a cooperative adaptive cruise control functionality of the vehicle 102.

The network interface 824 may include a SoC that provides modulation and demodulation functionality and enables the controller(s) 836 to communicate over wireless networks. The network interface 824 may include a radio frequency front-end for up-conversion from baseband to radio frequency, and down conversion from radio frequency to baseband. The frequency conversions may be performed through well-known processes, and/or may be performed using super-heterodyne processes. In some examples, the radio frequency front end functionality may be provided by a separate chip. The network interface may include wireless functionality for communicating over LTE, WCDMA, UMTS, GSM, CDMA2000, Bluetooth, Bluetooth LE, Wi-Fi, Z-Wave, ZigBee, LoRaWAN, and/or other wireless protocols.

The vehicle 102 may further include data store(s) 828 which may include off-chip (e.g., off the SoC(s) 804) storage. The data store(s) 828 may include one or more storage elements including RAM, SRAM, DRAM, VRAM, Flash, hard disks, and/or other components and/or devices that may store at least one bit of data.

The vehicle 102 may further include GNSS sensor(s) 858. The GNSS sensor(s) 858 (e.g., GPS and/or assisted GPS sensors), to assist in mapping, perception, occupancy grid generation, and/or path planning functions. Any number of GNSS sensor(s) 858 may be used, including, for example and without limitation, a GPS using a USB connector with an Ethernet to Serial (RS-232) bridge.

The vehicle 102 may further include RADAR sensor(s) 860. The RADAR sensor(s) 860 may be used by the vehicle 102 for long-range vehicle detection, even in darkness and/or severe weather conditions. RADAR functional safety levels may be ASIL B. The RADAR sensor(s) 860 may use the CAN and/or the bus 802 (e.g., to transmit data generated by the RADAR sensor(s) 860) for control and to access object tracking data, with access to Ethernet to access raw data in some examples. A wide variety of RADAR sensor types may be used. For example, and without limitation, the RADAR sensor(s) 860 may be suitable for front, rear, and side RADAR use. In some example, Pulse Doppler RADAR sensor(s) are used.

The RADAR sensor(s) 860 may include different configurations, such as long range with narrow field of view, short range with wide field of view, short range side coverage, etc. In some examples, long-range RADAR may be used for adaptive cruise control functionality. The long-range RADAR systems may provide a broad field of view realized by two or more independent scans, such as within a 250 m range. The RADAR sensor(s) 860 may help in distinguishing between static and moving objects, and may be used by ADAS systems for emergency brake assist and forward collision warning. Long-range RADAR sensors may include monostatic multimodal RADAR with multiple (e.g., six or more) fixed RADAR antennae and a high-speed CAN and FlexRay interface. In an example with six antennae, the central four antennae may create a focused beam pattern, designed to record the vehicle's 102 surroundings at higher speeds with minimal interference from traffic in adjacent lanes. The other two antennae may expand the field of view, making it possible to quickly detect vehicles entering or leaving the vehicle's 102 lane.

Mid-range RADAR systems may include, as an example, a range of up to 860 m (front) or 80 m (rear), and a field of view of up to 42 degrees (front) or 850 degrees (rear). Short-range RADAR systems may include, without limitation, RADAR sensors designed to be installed at both ends of the rear bumper. When installed at both ends of the rear bumper, such a RADAR sensor systems may create two beams that constantly monitor the blind spot in the rear and next to the vehicle.

Short-range RADAR systems may be used in an ADAS system for blind spot detection and/or lane change assist.

The vehicle 102 may further include ultrasonic sensor(s) 862. The ultrasonic sensor(s) 862, which may be positioned at the front, back, and/or the sides of the vehicle 102, may be used for park assist and/or to create and update an occupancy grid. A wide variety of ultrasonic sensor(s) 862 may be used, and different ultrasonic sensor(s) 862 may be used for different ranges of detection (e.g., 2.5 m, 4 m). The ultrasonic sensor(s) 862 may operate at functional safety levels of ASIL B.

The vehicle 102 may include LIDAR sensor(s) 864. The LIDAR sensor(s) 864 may be used for object and pedestrian detection, emergency braking, collision avoidance, and/or other functions. The LIDAR sensor(s) 864 may be functional safety level ASIL B. In some examples, the vehicle 102 may include multiple LIDAR sensors 864 (e.g., two, four, six, etc.) that may use Ethernet (e.g., to provide data to a Gigabit Ethernet switch).

In some examples, the LIDAR sensor(s) 864 may be capable of providing a list of objects and their distances for a 360-degree field of view. Commercially available LIDAR sensor(s) 864 may have an advertised range of approximately 102 m, with an accuracy of 2 cm-3 cm, and with support for a 102 Mbps Ethernet connection, for example. In some examples, one or more non-protruding LIDAR sensors 864 may be used. In such examples, the LIDAR sensor(s) 864 may be implemented as a small device that may be embedded into the front, rear, sides, and/or corners of the vehicle 102. The LIDAR sensor(s) 864, in such examples, may provide up to a 820-degree horizontal and 35-degree vertical field-of-view, with a 200 m range even for low-reflectivity objects. Front-mounted LIDAR sensor(s) 864 may be configured for a horizontal field of view between 45 degrees and 135 degrees.

In some examples, LIDAR technologies, such as 3D flash LIDAR, may also be used. 3D Flash LIDAR uses a flash of a laser as a transmission source, to illuminate vehicle surroundings up to approximately 200 m. A flash LIDAR unit includes a receptor, which records the laser pulse transit time and the reflected light on each pixel, which in turn corresponds to the range from the vehicle to the objects. Flash LIDAR may allow for highly accurate and distortion-free images of the surroundings to be generated with every laser flash. In some examples, four flash LIDAR sensors may be deployed, one at each side of the vehicle 102. Available 3D flash LIDAR systems include a solid-state 3D staring array LIDAR camera with no moving parts other than a fan (e.g., a non-scanning LIDAR device). The flash LIDAR device may use a 5 nanosecond class I (eye-safe) laser pulse per frame and may capture the reflected laser light in the form of 3D range point clouds and co-registered intensity data. By using flash LIDAR, and because flash LIDAR is a solid-state device with no moving parts, the LIDAR sensor(s) 864 may be less susceptible to motion blur, vibration, and/or shock.

The vehicle may further include IMU sensor(s) 866. The IMU sensor(s) 866 may be located at a center of the rear axle of the vehicle 102, in some examples. The IMU sensor(s) 866 may include, for example and without limitation, an accelerometer(s), a magnetometer(s), a gyroscope(s), a magnetic compass(es), and/or other sensor types. In some examples, such as in six-axis applications, the IMU sensor(s) 866 may include accelerometers and gyroscopes, while in nine-axis applications, the IMU sensor(s) 866 may include accelerometers, gyroscopes, and magnetometers.

In some embodiments, the IMU sensor(s) 866 may be implemented as a miniature, high performance GPS-Aided Inertial Navigation System (GPS/INS) that combines micro-electro-mechanical systems (MEMS) inertial sensors, a high-sensitivity GPS receiver, and advanced Kalman filtering algorithms to provide estimates of position, velocity, and attitude. As such, in some examples, the IMU sensor(s) 866 may enable the vehicle 102 to estimate heading without requiring input from a magnetic sensor by directly observing and correlating the changes in velocity from GPS to the IMU sensor(s) 866. In some examples, the IMU sensor(s) 866 and the GNSS sensor(s) 858 may be combined in a single integrated unit.

The vehicle may include microphone(s) 896 placed in and/or around the vehicle 102. The microphone(s) 896 may be used for emergency vehicle detection and identification, among other things.

The vehicle may further include any number of camera types, including stereo camera(s) 868, wide-view camera(s) 870, infrared camera(s) 872, surround camera(s) 874, long-range and/or mid-range camera(s) 898, and/or other camera types. The cameras may be used to capture image data around an entire periphery of the vehicle 102. The types of cameras used depends on the embodiments and requirements for the vehicle 102, and any combination of camera types may be used to provide the necessary coverage around the vehicle 102. In addition, the number of cameras may differ depending on the embodiment. For example, the vehicle may include six cameras, seven cameras, ten cameras, twelve cameras, and/or another number of cameras. The cameras may support, as an example and without limitation, Gigabit Multimedia Serial Link (GMSL) and/or Gigabit Ethernet. Each of the camera(s) is described with more detail herein with respect to FIG. 8A and FIG. 8B.

The vehicle 102 may further include vibration sensor(s) 842. The vibration sensor(s) 842 may measure vibrations of components of the vehicle, such as the axle(s). For example, changes in vibrations may indicate a change in road surfaces. In another example, when two or more vibration sensors 842 are used, the differences between the vibrations may be used to determine friction or slippage of the road surface (e.g., when the difference in vibration is between a power-driven axle and a freely rotating axle).

The vehicle 102 may include an ADAS system 838. The ADAS system 838 may include a SoC, in some examples. The ADAS system 838 may include autonomous/adaptive/automatic cruise control (ACC), cooperative adaptive cruise control (CACC), forward crash warning (FCW), automatic emergency braking (AEB), lane departure warnings (LDW), lane keep assist (LKA), blind spot warning (BSW), rear cross-traffic warning (RCTW), collision warning systems (CWS), lane centering (LC), and/or other features and functionality.

The ACC systems may use RADAR sensor(s) 860, LIDAR sensor(s) 864, and/or a camera(s). The ACC systems may include longitudinal ACC and/or lateral ACC. Longitudinal ACC monitors and controls the distance to the vehicle immediately ahead of the vehicle 102 and automatically adjust the vehicle speed to maintain a safe distance from vehicles ahead. Lateral ACC performs distance keeping, and advises the vehicle 102 to change lanes when necessary. Lateral ACC is related to other ADAS applications such as LCA and CWS.

CACC uses information from other vehicles that may be received via the network interface 824 and/or the wireless antenna(s) 826 from other vehicles via a wireless link, or indirectly, over a network connection (e.g., over the Internet). Direct links may be provided by a vehicle-to-vehicle (V2V) communication link, while indirect links may be infrastructure-to-vehicle (I2V) communication link. In general, the V2V communication concept provides information about the immediately preceding vehicles (e.g., vehicles immediately ahead of and in the same lane as the vehicle 102), while the I2V communication concept provides information about traffic further ahead. CACC systems may include either or both I2V and V2V information sources. Given the information of the vehicles ahead of the vehicle 102, CACC may be more reliable and it has potential to improve traffic flow smoothness and reduce congestion on the road.

FCW systems are designed to alert the driver to a hazard, so that the driver may take corrective action. FCW systems use a front-facing camera and/or RADAR sensor(s) 860, coupled to a dedicated processor, DSP, FPGA, and/or ASIC, that is electrically coupled to driver feedback, such as a display, speaker, and/or vibrating component. FCW systems may provide a warning, such as in the form of a sound, visual warning, vibration and/or a quick brake pulse.

AEB systems detect an impending forward collision with another vehicle or other object, and may automatically apply the brakes if the driver does not take corrective action within a specified time or distance parameter. AEB systems may use front-facing camera(s) and/or RADAR sensor(s) 860, coupled to a dedicated processor, DSP, FPGA, and/or ASIC. When the AEB system detects a hazard, it typically first alerts the driver to take corrective action to avoid the collision and, if the driver does not take corrective action, the AEB system may automatically apply the brakes in an effort to prevent, or at least mitigate, the impact of the predicted collision. AEB systems, may include techniques such as dynamic brake support and/or crash imminent braking.

LDW systems provide visual, audible, and/or tactile warnings, such as steering wheel or seat vibrations, to alert the driver when the vehicle 102 crosses lane markings. A LDW system does not activate when the driver indicates an intentional lane departure, by activating a turn signal. LDW systems may use front-side facing cameras, coupled to a dedicated processor, DSP, FPGA, and/or ASIC, that is electrically coupled to driver feedback, such as a display, speaker, and/or vibrating component.

LKA systems are a variation of LDW systems. LKA systems provide steering input or braking to correct the vehicle 102 if the vehicle 102 starts to exit the lane.

BSW systems detects and warn the driver of vehicles in an automobile's blind spot. BSW systems may provide a visual, audible, and/or tactile alert to indicate that merging or changing lanes is unsafe. The system may provide an additional warning when the driver uses a turn signal. BSW systems may use rear-side facing camera(s) and/or RADAR sensor(s) 860, coupled to a dedicated processor, DSP, FPGA, and/or ASIC, that is electrically coupled to driver feedback, such as a display, speaker, and/or vibrating component.

RCTW systems may provide visual, audible, and/or tactile notification when an object is detected outside the rear-camera range when the vehicle 102 is backing up. Some RCTW systems include AEB to ensure that the vehicle brakes are applied to avoid a crash. RCTW systems may use one or more rear-facing RADAR sensor(s) 860, coupled to a dedicated processor, DSP, FPGA, and/or ASIC, that is electrically coupled to driver feedback, such as a display, speaker, and/or vibrating component.

Conventional ADAS systems may be prone to false positive results which may be annoying and distracting to a driver, but typically are not catastrophic, because the ADAS systems alert the driver and allow the driver to decide whether a safety condition truly exists and act accordingly. However, in an autonomous vehicle 102, the vehicle 102 itself must, in the case of conflicting results, decide whether to heed the result from a primary computer or a secondary computer (e.g., a first controller 836 or a second controller 836). For example, in some embodiments, the ADAS system 838 may be a backup and/or secondary computer for providing perception information to a backup computer rationality module. The backup computer rationality monitor may run a redundant diverse software on hardware components to detect faults in perception and dynamic driving tasks. Outputs from the ADAS system 838 may be provided to a supervisory MCU. If outputs from the primary computer and the secondary computer conflict, the supervisory MCU must determine how to reconcile the conflict to ensure safe operation.

In some examples, the primary computer may be configured to provide the supervisory MCU with a confidence score, indicating the primary computer's confidence in the chosen result. If the confidence score exceeds a threshold, the supervisory MCU may follow the primary computer's direction, regardless of whether the secondary computer provides a conflicting or inconsistent result. Where the confidence score does not meet the threshold, and where primary and secondary computer indicate different results (e.g., the conflict), the supervisory MCU may arbitrate between the computers to determine the appropriate outcome.

The supervisory MCU may be configured to run a neural network(s) that is trained and configured to determine, based on outputs from the primary computer and the secondary computer, conditions under which the secondary computer provides false alarms. Thus, the neural network(s) in the supervisory MCU may learn when the secondary computer's output may be trusted, and when it cannot. For example, when the secondary computer is a RADAR-based FCW system, a neural network(s) in the supervisory MCU may learn when the FCW system is identifying metallic objects that are not, in fact, hazards, such as a drainage grate or manhole cover that triggers an alarm. Similarly, when the secondary computer is a camera-based LDW system, a neural network in the supervisory MCU may learn to override the LDW when bicyclists or pedestrians are present and a lane departure is, in fact, the safest maneuver. In embodiments that include a neural network(s) running on the supervisory MCU, the supervisory MCU may include at least one of a DLA or GPU suitable for running the neural network(s) with associated memory. In preferred embodiments, the supervisory MCU may comprise and/or be included as a component of the SoC(s) 804.

In other examples, ADAS system 838 may include a secondary computer that performs ADAS functionality using traditional rules of computer vision. As such, the secondary computer may use classic computer vision rules (if-then), and the presence of a neural network(s) in the supervisory MCU may improve reliability, safety and performance. For example, the diverse implementation and intentional non-identity makes the overall system more fault-tolerant, especially to faults caused by software (or software-hardware interface) functionality. For example, if there is a software bug or error in the software running on the primary computer, and the non-identical software code running on the secondary computer provides the same overall result, the supervisory MCU may have greater confidence that the overall result is correct, and the bug in software or hardware on primary computer is not causing material error.

In some examples, the output of the ADAS system 838 may be fed into the primary computer's perception block and/or the primary computer's dynamic driving task block. For example, if the ADAS system 838 indicates a forward crash warning due to an object immediately ahead, the perception block may use this information when identifying objects. In other examples, the secondary computer may have its own neural network which is trained and thus reduces the risk of false positives, as described herein.

The vehicle 102 may further include the infotainment SoC 830 (e.g., an in-vehicle infotainment system (IVI)). Although illustrated and described as a SoC, the infotainment system may not be a SoC, and may include two or more discrete components. The infotainment SoC 830 may include a combination of hardware and software that may be used to provide audio (e.g., music, a personal digital assistant, navigational instructions, news, radio, etc.), video (e.g., TV, movies, streaming, etc.), phone (e.g., hands-free calling), network connectivity (e.g., LTE, Wi-Fi, etc.), and/or information services (e.g., navigation systems, rear-parking assistance, a radio data system, vehicle related information such as fuel level, total distance covered, brake fuel level, oil level, door open/close, air filter information, etc.) to the vehicle 102. For example, the infotainment SoC 830 may radios, disk players, navigation systems, video players, USB and Bluetooth connectivity, carputers, in-car entertainment, Wi-Fi, steering wheel audio controls, hands free voice control, a heads-up display (HUD), an HMI display 834, a telematics device, a control panel (e.g., for controlling and/or interacting with various components, features, and/or systems), and/or other components. The infotainment SoC 830 may further be used to provide information (e.g., visual and/or audible) to a user(s) of the vehicle, such as information from the ADAS system 838, autonomous driving information such as planned vehicle maneuvers, trajectories, surrounding environment information (e.g., intersection information, vehicle information, road information, etc.), and/or other information.

The infotainment SoC 830 may include GPU functionality. The infotainment SoC 830 may communicate over the bus 802 (e.g., CAN bus, Ethernet, etc.) with other devices, systems, and/or components of the vehicle 102. In some examples, the infotainment SoC 830 may be coupled to a supervisory MCU such that the GPU of the infotainment system may perform some self-driving functions in the event that the primary controller(s) 836 (e.g., the primary and/or backup computers of the vehicle 102) fail. In such an example, the infotainment SoC 830 may put the vehicle 102 into a chauffeur to safe stop mode, as described herein.

The vehicle 102 may further include an instrument cluster 832 (e.g., a digital dash, an electronic instrument cluster, a digital instrument panel, etc.). The instrument cluster 832 may include a controller and/or supercomputer (e.g., a discrete controller or supercomputer). The instrument cluster 832 may include a set of instrumentation such as a speedometer, fuel level, oil pressure, tachometer, odometer, turn indicators, gearshift position indicator, seat belt warning light(s), parking-brake warning light(s), engine-malfunction light(s), airbag (SRS) system information, lighting controls, safety system controls, navigation information, etc. In some examples, information may be displayed and/or shared among the infotainment SoC 830 and the instrument cluster 832. In other words, the instrument cluster 832 may be included as part of the infotainment SoC 830, or vice versa.

Figure 8D:
FIG. 8D is a system diagram for communication between cloud-based server(s) and the example autonomous vehicle of FIG. 8A, in accordance with some embodiments of the present disclosure.

FIG. 8D is a system diagram for communication between cloud-based server(s) and the example autonomous vehicle 102 of FIG. 8A, in accordance with some embodiments of the present disclosure. The system 876 may include server(s) 878, network(s) 890, and vehicles, including the vehicle 102. The server(s) 878 may include a plurality of GPUs 884(A)-884(H) (collectively referred to herein as GPUs 884), PCIe switches 882(A)-882(H) (collectively referred to herein as PCIe switches 882), and/or CPUs 880(A)-880(B) (collectively referred to herein as CPUs 880). The GPUs 884, the CPUs 880, and the PCIe switches may be interconnected with high-speed interconnects such as, for example and without limitation, NVLink interfaces 888 developed by NVIDIA and/or PCIe connections 886. In some examples, the GPUs 884 are connected via NVLink and/or NVSwitch SoC and the GPUs 884 and the PCIe switches 882 are connected via PCIe interconnects. Although eight GPUs 884, two CPUs 880, and two PCIe switches are illustrated, this is not intended to be limiting. Depending on the embodiment, each of the server(s) 878 may include any number of GPUs 884, CPUs 880, and/or PCIe switches. For example, the server(s) 878 may each include eight, sixteen, thirty-two, and/or more GPUs 884.

The server(s) 878 may receive, over the network(s) 890 and from the vehicles, image data representative of images showing unexpected or changed road conditions, such as recently commenced road-work. The server(s) 878 may transmit, over the network(s) 890 and to the vehicles, neural networks 892, updated neural networks 892, and/or map information 894, including information regarding traffic and road conditions. The updates to the map information 894 may include updates for the HD map 822, such as information regarding construction sites, potholes, detours, flooding, and/or other obstructions. In some examples, the neural networks 892, the updated neural networks 892, and/or the map information 894 may have resulted from new training and/or experiences represented in data received from any number of vehicles in the environment, and/or based on training performed at a datacenter (e.g., using the server(s) 878 and/or other servers).

The server(s) 878 may be used to train machine learning models (e.g., neural networks) based on training data. The training data may be generated by the vehicles, and/or may be generated in a simulation (e.g., using a game engine). In some examples, the training data is tagged (e.g., where the neural network benefits from supervised learning) and/or undergoes other pre-processing, while in other examples the training data is not tagged and/or pre-processed (e.g., where the neural network does not require supervised learning). Once the machine learning models are trained, the machine learning models may be used by the vehicles (e.g., transmitted to the vehicles over the network(s) 890, and/or the machine learning models may be used by the server(s) 878 to remotely monitor the vehicles.

In some examples, the server(s) 878 may receive data from the vehicles and apply the data to up-to-date real-time neural networks for real-time intelligent inferencing. The server(s) 878 may include deep-learning supercomputers and/or dedicated AI computers powered by GPU(s) 884, such as a DGX and DGX Station machines developed by NVIDIA. However, in some examples, the server(s) 878 may include deep learning infrastructure that use only CPU-powered datacenters.

The deep-learning infrastructure of the server(s) 878 may be capable of fast, real-time inferencing, and may use that capability to evaluate and verify the health of the processors, software, and/or associated hardware in the vehicle 102. For example, the deep-learning infrastructure may receive periodic updates from the vehicle 102, such as a sequence of images and/or objects that the vehicle 102 has located in that sequence of images (e.g., via computer vision and/or other machine learning object classification techniques). The deep-learning infrastructure may run its own neural network to identify the objects and compare them with the objects identified by the vehicle 102 and, if the results do not match and the infrastructure concludes that the AI in the vehicle 102 is malfunctioning, the server(s) 878 may transmit a signal to the vehicle 102 instructing a fail-safe computer of the vehicle 102 to assume control, notify the passengers, and complete a safe parking maneuver.

For inferencing, the server(s) 878 may include the GPU(s) 884 and one or more programmable inference accelerators (e.g., NVIDIA's Tensor®). The combination of GPU-powered servers and inference acceleration may make real-time responsiveness possible. In other examples, such as where performance is less critical, servers powered by CPUs, FPGAs, and other processors may be used for inferencing.

Example Computing Device

Figure 9:
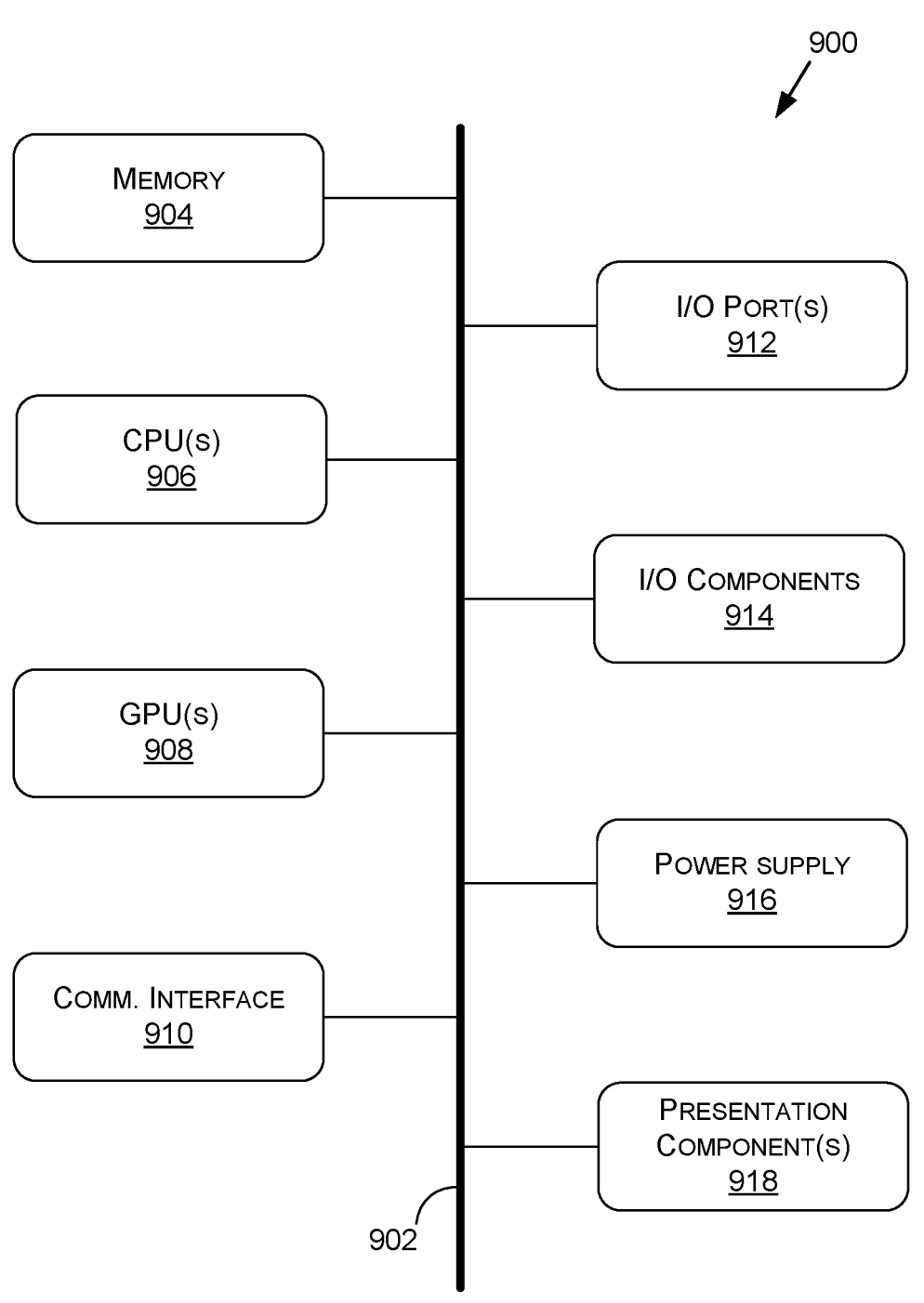
FIG. 9 is a block diagram of an example computing device suitable for use in implementing some embodiments of the present disclosure.

FIG. 9 is a block diagram of an example computing device 900 suitable for use in implementing some embodiments of the present disclosure. Computing device 900 may include a bus 902 that directly or indirectly couples the following devices: memory 904, one or more central processing units (CPUs) 906, one or more graphics processing units (GPUs) 908, a communication interface 910, input/output (I/O) ports 912, input/output components 914, a power supply 916, and one or more presentation components 918 (e.g., display(s)).

Although the various blocks of FIG. 9 are shown as connected via the bus 902 with lines, this is not intended to be limiting and is for clarity only. For example, in some embodiments, a presentation component 918, such as a display device, may be considered an I/O component 914 (e.g., if the display is a touch screen). As another example, the CPUs 906 and/or GPUs 908 may include memory (e.g., the memory 904 may be representative of a storage device in addition to the memory of the GPUs 908, the CPUs 906, and/or other components). In other words, the computing device of FIG. 9 is merely illustrative. Distinction is not made between such categories as "workstation," "server," "laptop," "desktop," "tablet," "client device," "mobile device," "handheld device," "game console," "electronic control unit (ECU)," "virtual reality system," and/or other device or system types, as all are contemplated within the scope of the computing device of FIG. 9.

The bus 902 may represent one or more busses, such as an address bus, a data bus, a control bus, or a combination thereof. The bus 902 may include one or more bus types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, and/or another type of bus.

The memory 904 may include any of a variety of computer-readable media. The computer-readable media may be any available media that may be accessed by the computing device 900. The computer-readable media may include both volatile and nonvolatile media, and removable and non-removable media. By way of example, and not limitation, the computer-readable media may comprise computer-storage media and communication media.

The computer-storage media may include both volatile and nonvolatile media and/or removable and non-removable media implemented in any method or technology for storage of information such as computer-readable instructions, data structures, program modules, and/or other data types. For example, the memory 904 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by computing device 900. As used herein, computer storage media does not comprise signals per se.

The communication media may embody computer-readable instructions, data structures, program modules, and/or other data types in a modulated data signal such as a carrier wave or other transport mechanism and includes any information delivery media. The term "modulated data signal" may refer to a signal that has one or more of its characteristics set or changed in such a manner as to encode information in the signal. By way of example, and not limitation, the communication media may include wired media such as a wired network or direct-wired connection, and wireless media such as acoustic, RF, infrared and other wireless media. Combinations of any of the above should also be included within the scope of computer-readable media.

The CPU(s) 906 may be configured to execute the computer-readable instructions to control one or more components of the computing device 900 to perform one or more of the methods and/or processes described herein. The CPU(s) 906 may each include one or more cores (e.g., one, two, four, eight, twenty-eight, seventy-two, etc.) that are capable of handling a multitude of software threads simultaneously. The CPU(s) 906 may include any type of processor, and may include different types of processors depending on the type of computing device 900 implemented (e.g., processors with fewer cores for mobile devices and processors with more cores for servers). For example, depending on the type of computing device 900, the processor may be an ARM processor implemented using Reduced Instruction Set Computing (RISC) or an x86 processor implemented using Complex Instruction Set Computing (CISC). The computing device 900 may include one or more CPUs 906 in addition to one or more microprocessors or supplementary co-processors, such as math co-processors.

The GPU(s) 908 may be used by the computing device 900 to render graphics (e.g., 3D graphics). The GPU(s) 908 may include hundreds or thousands of cores that are capable of handling hundreds or thousands of software threads simultaneously. The GPU(s) 908 may generate pixel data for output images in response to rendering commands (e.g., rendering commands from the CPU(s) 906 received via a host interface). The GPU(s) 908 may include graphics memory, such as display memory, for storing pixel data. The display memory may be included as part of the memory 904. The GPU(s) 708 may include two or more GPUs operating in parallel (e.g., via a link). When combined together, each GPU 908 may generate pixel data for different portions of an output image or for different output images (e.g., a first GPU for a first image and a second GPU for a second image). Each GPU may include its own memory, or may share memory with other GPUs.

In examples where the computing device 900 does not include the GPU(s) 908, the CPU(s) 906 may be used to render graphics.

The communication interface 910 may include one or more receivers, transmitters, and/or transceivers that enable the computing device 900 to communicate with other computing devices via an electronic communication network, included wired and/or wireless communications. The communication interface 910 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet), low-power wide-area networks (e.g., LoRaWAN, SigFox, etc.), and/or the Internet.

The I/O ports 912 may enable the computing device 900 to be logically coupled to other devices including the I/O components 914, the presentation component(s) 918, and/or other components, some of which may be built in to (e.g., integrated in) the computing device 900. Illustrative I/O components 914 include a microphone, mouse, keyboard, joystick, game pad, game controller, satellite dish, scanner, printer, wireless device, etc. The I/O components 914 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the computing device 900. The computing device 900 may be include depth cameras, such as stereoscopic camera systems, infrared camera systems, RGB camera systems, touchscreen technology, and combinations of these, for gesture detection and recognition. Additionally, the computing device 900 may include accelerometers or gyroscopes (e.g., as part of an inertia measurement unit (IMU)) that enable detection of motion. In some examples, the output of the accelerometers or gyroscopes may be used by the computing device 900 to render immersive augmented reality or virtual reality.

The power supply 916 may include a hard-wired power supply, a battery power supply, or a combination thereof. The power supply 916 may provide power to the computing device 900 to enable the components of the computing device 900 to operate.

The presentation component(s) 918 may include a display (e.g., a monitor, a touch screen, a television screen, a heads-up-display (HUD), other display types, or a combination thereof), speakers, and/or other presentation components. The presentation component(s) 918 may receive data from other components (e.g., the GPU(s) 908, the CPU(s) 906, etc.), and output the data (e.g., as an image, video, sound, etc.).

The disclosure may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The disclosure may be practiced in a variety of system configurations, including handheld devices, consumer electronics, general-purpose computers, more specialty computing devices, etc. The disclosure may also be practiced in distributed computing environments where tasks are performed by remote-processing devices that are linked through a communications network.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

What is claimed is:

1. A method comprising:
receiving a declarative description of a desired behavior to be tested;
determining, using one or more ontologies related to one or more simulated environments and based at least on the declarative description, one or more commands for generating one or more scenarios related to the desired behavior within a simulation system;
generating, using the simulation system and based at least on the one or more commands, the one or more scenarios representing one or more simulated variations of the desired behavior as being performed using one or more machines;
performing the one or more simulated variations represented by the one or more scenarios within the simulation system;
determining, based at least on the one or more simulated variations, one or more accuracies indicating whether the one or more scenarios actually represent the desired behavior; and
determining, based at least on the one or more accuracies, a coverage value indicating a number of the one or more scenarios that actually represent the desired behavior.

2. The method of claim 1, further comprising:
determining that the coverage value is below a threshold;

based at least on the coverage value being below the threshold, generating one or more second commands for generating one or more second scenarios related to the observable behavior; and
determining, based at least on the one or more second scenarios, an updated coverage value associated with the desired observable.

3. The method of claim 2, wherein:
the one or more commands are associated with at least one of path information or dynamic actor information associated with the one or more scenarios; and
the generating the one or more second commands is further based at least on the at least one of the path information or the dynamic actor information.

4. The method of claim 1, further comprising:
determining that the coverage value is equal to or greater than a threshold; and
determining, based at least on the coverage value being equal to or greater than the threshold, to refrain from generating one or more second scenarios related to the desired observable behavior.

5. The method of claim 1, further comprising:
for at least one scenario of the one or more scenarios that does not satisfy the desired behavior, analyzing the at least one scenario to determine criticality of the at least one scenario for testing the one or more machines; and
based at least on the analyzing, determining to generate one or more second commands for generating one or more second scenarios related to the desired behavior.

6. The method of claim 1, further comprising:
testing at least one feature of the one or more machines against the one or more scenarios; and
updating the at least one feature of the one or more machines based at least in part on the testing.

7. The method of claim 6, wherein the at least one feature includes at least one of a hardware component, a software component, or a sensor model.

8. The method of claim 1, wherein the determining the coverage value comprises:
determining, based at least on the one or more accuracies, the number of the one or more scenarios that actually represent the desired behavior; and
determining, based at least on the number of the one or more scenarios, a percentage of the one or more scenarios that actually represent the desired behavior, the coverage value including the percentage.

9. A system comprising:
one or more processors to:
receive a declarative description associated with a desired observable;
determine, based at least on the declarative description, one or more commands for generating one or more scenarios related to the desired observable;
generate, based at least in part on the one or more commands, the one or more scenarios that represent one or more simulation variations of the desired observable being performed using one or more machines;
perform one or more simulations associated with the one or more scenarios; and
determine, based at least on the one or more simulations, a coverage value indicating a percentage of the one or more scenarios that actually represent the desired observable.

10. The system of claim 9, wherein the one or more processors are further to:

determine one or more accuracies associated with the one or more scenarios actually representing the desired observable, wherein the determination of the coverage value is based at least on the one or more accuracies.

11. The system of claim 9, wherein the one or more processors are further to:

determine that the coverage value is below a threshold;

based at least on the coverage value being below the threshold, generate one or more second commands for generating one or more second scenarios related to the desired observable;

perform one or more second simulations associated with the one or more second scenarios; and determine, based at least on the one or more second simulations, an updated coverage value associated with the desired observable.

12. The system of claim 11, wherein:

the one or more commands are associated with at least one of path information or dynamic actor information associated with the one or more scenarios; and the generation of the one or more second commands is further based at least on the at least one of the path information or the dynamic actor information.

13. The system of claim 9, wherein the one or more processors are further to:

determine that the coverage value is equal to or greater than a threshold; and determine, based at least on the coverage value being equal to or greater than the threshold, to refrain from generating one or more second scenarios related to the desired observable.

14. The system of claim 9, wherein the one or more processors are further to:

for at least one scenario of the one or more scenarios that does not satisfy the desired observable, analyze the scenario to determine criticality of the scenario for testing the one or more machines; and based at least on the analysis, determine to generate one or more second commands for generating one or more second scenarios related to the desired observable.

15. The system of claim 9, wherein the one or more processors are further to:

test at least one feature of the one or more machines against the one or more scenarios; and update the at least one feature of the one or more machines.

16. The system of claim 9, wherein the generation of the one or more scenarios comprises:

determining, based at least on the one or more commands, one or more metrics for generating the one or more simulation variations; and generating, based at least on the one or more metrics, the one or more scenarios that represent the one or more simulation variations of the desired observable being performed using the one or more machines.

17. The system of claim 9, wherein the one or more scenarios are further generated based at least on one or more ontologies, the one or more ontologies including at least one of a domain ontology, an actor ontology, a map ontology, an environment ontology, or a control ontology.

18. The system of claim 9, wherein the system is comprised in at least one of:

a control system for an autonomous or semi-autonomous machine;

a perception system for an autonomous or semi-autonomous machine;

a system for performing simulation operations;

a system for performing deep learning operations;

a system implemented using a robot;

a system for generating synthetic data;

a system incorporating one or more virtual machines (VMs);

a system implemented at least partially in a data center; or a system implemented at least partially using cloud computing resources.

19. One or more processors comprising processing circuitry to:

determine a coverage value indicating at least one of a number of one or more scenarios or a percentage of the one or more scenarios that represent a desirable observable, wherein the coverage value is determined based at least on performing one or more simulation variations associated with the one or more scenarios that are generated using a declarative description associated with the desired observable.

20. The one or more processors of claim 19, wherein the one or more processors are comprised in at least one of:

a control system for an autonomous or semi-autonomous machine;

a perception system for an autonomous or semi-autonomous machine;

a system for performing simulation operations;

a system for performing deep learning operations;

a system implemented using a robot;

a system for generating synthetic data;

a system incorporating one or more virtual machines (VMs);

a system implemented at least partially in a data center; or a system implemented at least partially using cloud computing resources.

* * * * *